(12) United States Patent
Vig et al.

(10) Patent No.: US 8,754,640 B2
(45) Date of Patent: Jun. 17, 2014

(54) MAGNETIC FIELD SENSORS AND RELATED TECHNIQUES THAT CAN PROVIDE SELF-TEST INFORMATION IN A FORMATTED OUTPUT SIGNAL

(75) Inventors: Ravi Vig, Bow, NH (US); P. Karl Scheller, Bow, NH (US); Devon Fernandez, Londonderry, NH (US); Christine Graham, Bow, NH (US); Paul David, Bow, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 178 days.

(21) Appl. No.: 13/526,106

(22) Filed: Jun. 18, 2012

(65) Prior Publication Data
US 2013/0335069 A1    Dec. 19, 2013

(51) Int. Cl.
*G01B 7/30* (2006.01)
*G01R 33/00* (2006.01)
*G01R 33/07* (2006.01)

(52) U.S. Cl.
CPC .......... *G01R 33/0035* (2013.01); *G01R 33/072* (2013.01)
USPC .................. 324/207.25; 324/202; 324/207.26

(58) Field of Classification Search
CPC .... G01R 33/0035; G01R 33/072; G01B 7/14; G01D 5/142; G01D 18/00–18/004
USPC .............. 324/207.2, 207.21, 207.25, 207.26, 324/202; 714/733, 740
See application file for complete search history.

(56) References Cited

U.S. PATENT DOCUMENTS

| | | |
|---|---|---|
| 3,304,434 A | 2/1967 | Koster |
| 4,225,939 A | 9/1980 | Yashiro |
| 4,283,679 A | 8/1981 | Ito et al. |
| 4,513,403 A | 4/1985 | Troy |
| 4,642,555 A | 2/1987 | Swartz et al. |
| 4,649,796 A | 3/1987 | Schmidt |
| 4,893,027 A | 1/1990 | Kammerer et al. |
| 5,244,834 A | 9/1993 | Suzuki et al. |
| 5,332,956 A | 7/1994 | Oh |
| 5,486,759 A | 1/1996 | Seiler et al. |
| 5,696,790 A | 12/1997 | Graham et al. |
| 5,781,005 A | 7/1998 | Vig et al. |
| 6,242,604 B1 | 6/2001 | Hudlicky et al. |
| 6,242,904 B1 | 6/2001 | Shirai et al. |
| 6,242,905 B1 | 6/2001 | Draxelmayr |

(Continued)

FOREIGN PATENT DOCUMENTS

| | | |
|---|---|---|
| DE | 25 18 054 | 11/1976 |
| DE | 40 31 560 | 4/1992 |

(Continued)

OTHER PUBLICATIONS

Chinese Notice of Allowance; dated Mar. 6, 2013; for Chinese Pat. App. No. 200980189766.7; 4 pages.

(Continued)

*Primary Examiner* — Jay Patidar
(74) *Attorney, Agent, or Firm* — Daly, Crowley, Mofford & Durkee, LLP

(57) ABSTRACT

A magnetic field sensor can provide an output signal indicative of a passing condition or a failing condition of the magnetic field sensor. The output signal has one of a variety of output signal formats.

58 Claims, 26 Drawing Sheets

(56) References Cited

U.S. PATENT DOCUMENTS

| | | | |
|---|---|---|---|
| 6,242,908 B1* | 6/2001 | Scheller et al. | 324/207.2 |
| 6,278,269 B1 | 8/2001 | Vig et al. | |
| 6,297,627 B1 | 10/2001 | Towne et al. | |
| 6,339,322 B1 | 1/2002 | Loreck et al. | |
| 6,492,804 B2 | 12/2002 | Tsuge et al. | |
| 6,525,531 B2 | 2/2003 | Forrest et al. | |
| 6,542,847 B1 | 4/2003 | Lohberg et al. | |
| 6,653,968 B1 | 11/2003 | Schneider | |
| 6,687,644 B1 | 2/2004 | Zinke et al. | |
| 6,815,944 B2 | 11/2004 | Vig et al. | |
| 7,026,808 B2 | 4/2006 | Vig et al. | |
| 7,199,579 B2 | 4/2007 | Scheller et al. | |
| 7,295,000 B2 | 11/2007 | Werth | |
| 7,345,468 B2 | 3/2008 | Okada et al. | |
| 7,362,094 B2 | 4/2008 | Voisine et al. | |
| 7,365,530 B2 | 4/2008 | Bailey et al. | |
| 7,592,801 B2 | 9/2009 | Bailey et al. | |
| 7,800,389 B2 | 9/2010 | Friedrich et al. | |
| 7,923,996 B2 | 4/2011 | Doogue et al. | |
| 8,030,918 B2 | 10/2011 | Doogue et al. | |
| 2001/0002791 A1 | 6/2001 | Tsuge et al. | |
| 2001/0009367 A1 | 7/2001 | Seitzer et al. | |
| 2002/0027488 A1 | 3/2002 | Hayat-Dawoodi et al. | |
| 2003/0001563 A1 | 1/2003 | Turner | |
| 2004/0062362 A1 | 4/2004 | Matsuya | |
| 2004/0135220 A1 | 7/2004 | Goto | |
| 2005/0120782 A1 | 6/2005 | Kishibata et al. | |
| 2005/0179429 A1 | 8/2005 | Lohberg | |
| 2005/0225318 A1 | 10/2005 | Bailey et al. | |
| 2009/0058404 A1 | 3/2009 | Kurumado | |
| 2009/0251134 A1* | 10/2009 | Uenoyama | 324/207.21 |
| 2010/0026279 A1 | 2/2010 | Vig et al. | |
| 2010/0211347 A1 | 8/2010 | Friedrich et al. | |
| 2011/0018533 A1 | 1/2011 | Cesaretti et al. | |

FOREIGN PATENT DOCUMENTS

| | | |
|---|---|---|
| DE | 196 34 715 A1 | 3/1998 |
| DE | 196 50 935 A1 | 6/1998 |
| DE | 198 38 433 | 3/1999 |
| DE | 199 61 504 A1 | 6/2001 |
| EP | 0 944 888 B1 | 10/2001 |
| EP | 1 580 550 A1 | 9/2005 |
| EP | 1 662 353 A1 | 5/2006 |
| JP | 63-300911 | 12/1988 |
| JP | H2-116753 | 5/1990 |
| JP | 02-149013 | 6/1990 |
| JP | H03-29817 | 2/1991 |
| JP | H06-273437 | 9/1994 |
| JP | 07-012582 | 1/1995 |
| JP | 10-332725 | 12/1998 |
| JP | 11-064363 | 3/1999 |
| JP | 2001-043475 | 2/2001 |
| JP | 2001-1695951 | 6/2001 |
| JP | 2002-117500 | 4/2002 |
| JP | 2002-357920 | 12/2002 |
| JP | 4093381 | 3/2008 |
| JP | 4880874 | 12/2011 |
| WO | WO 88/09026 | 11/1988 |
| WO | WO 99/49322 | 9/1999 |
| WO | WO 01/74139 A2 | 10/2001 |
| WO | WO 01/74139 A3 | 10/2001 |
| WO | WO 03/069358 A2 | 8/2003 |
| WO | WO 03/069358 A3 | 8/2003 |
| WO | WO 2005/013363 A2 | 2/2005 |
| WO | WO 2005/013363 A3 | 2/2005 |
| WO | WO 2008/145662 A1 | 12/2008 |
| WO | WO 2010/014309 A1 | 2/2010 |

OTHER PUBLICATIONS

Final Office Action dated Jul. 23, 2013; for U.S. Appl. No. 12/183,367.

Lequesne et al.; "High-Accuracy Magnetic Position Encoder Concept;" IEEE Transactions on Industry Applications; vol. 35, No. 3; May/Jun. 1999; pp. 568-576.

Robert Bosch GMBH Stuttgart; "Active Sensor for ABS/ASR/VDC-Systems with 2-Wire-Current Interface;" Specification TLE4941/TLE4942; Version 5; Jun. 25, 2000; pp. 1-44s.

Infineon Technologies; "Differential Two-Wire Hall Effect Sensor IC;" TLE4942 Preliminary Data Sheet; Jun. 2000; pp. 1-13.

PCT Search Report dated Nov. 19, 2003 for PCT Pat. App. No. PCT/US03/02489; 5 pages.

PCT Invitation to Pay Additional Fees with Partial Search Report; dated Oct. 10, 2003 for PCT Pat. App. No. PCT/US03/02489; 3 pages.

EP Office Action dated Mar. 2, 2005 for EP 03 710 766.1; 8 pages.

EP Responce to Office Action submitted May 2009 for EP 03 710 766.1; 19 pages.

EP Summons to Oral Proceedings dated Apr. 30, 2009 for EP 03 710 766.1; 4 pages.

EP Communication from the Board of Appeal for EP 03 710 766.1; dated May 26, 2009; 52 pages.

JP Official Action dated Apr. 7, 2008 for JP 2003-568426; 5 pages.

JP Response to Official Action dated Sep. 22, 2008 for JP 2003-568426; 14 pages.

JP Official Action dated Dec. 12, 2008 for JP 2003-568426; 4 pages.

JP Response to Official Action dated Mar. 25, 2009 for JP 2003-568426; 8 pages.

JP Notice of Rejection dated Nov. 16, 3020; for JP 2003-568426; 5 pages.

JP Response to Notice of Rejection dated May 13, 2011; for JP 2003-568426; 27 pages.

JP Office Action dated Aug. 29, 2011; for JP 2003-568426; 9 pages.

JP Response to Notice of Rejection; filed Oct. 11, 2011; for JP 2003-568426; 6 pages.

JP Notice of Allowance dated Nov. 8, 2011; for JP 2003-568426; 3 pages.

EP Response to Written Opinion; dated Mar. 9, 2011; for EP Pat. App. No. 09789890.2; 11 pages.

CN Office Action dated May 3, 2012; for CN Pat. App. No. 200980189766.7; 26 pages.

CN Response to Office Action filed on Oct. 18, 2012; for CN Pat. App. No. 200980189766.7; 10 pages.

PCT Search Report and Written Opinion of the ISA for PCT/US2009/048237 dated Aug. 25, 2009; 10 pages.

International Preliminary Report on Patentability for PCT/US2009/048237 dated Feb. 10, 2011 9 pages.

Office Action dated May 12, 2011; for U.S. Appl. No. 12/183,367; 17 pages.

Response to Official Action filed Aug. 10, 2011; for U.S. Appl. No. 12/183,367; 13 pages.

Office Action dated Oct. 20, 2011; for U.S. Appl. No. 12/183,367; 9 pages.

Response to Office Action filed Jan. 17, 2012; for U.S. Appl. No. 12/183,367; 5 pages.

Office Action/Restricition Requirement dated Apr. 12, 2012; for U.S. Appl. No. 12/183,367; 6 pages.

Response to Restriction Requirement field May 9, 2012; for U.S. Appl. No. 12/183,367; 2 pages.

U.S. Appl. No. 12/183,367.

Response to Chinese Office Action dated May 3, 2012; for Chinese Pat. App. No. 200980129766.7; 10 pages.

Letter to NTD Patent and Trademark Agency; dated Aug. 29, 2012; Chinese Pat. App. No. 200980129766.7; including U.S. Amendment filed May 19, 2012; 20 pages.

Letter from NTD Patent & Trademark Agency Limited; dated Feb. 6, 2013; for CN Pat. App. No. 200980129766.7; 2 pages.

Chinese Office Action dated Jan. 18, 2013; for CN Pat. App. No. 200980129766.7; 8 pages.

Letter to NTD Patent & Trademark Agency Limited; dated Feb. 6, 2013; for CN Pat. App. No. 200980129766.7; 2 pages.

Response to Final Office Action dated May 2, 2013 for U.S. Appl. No. 12/183,367, 8 pages.

Final Office Action dated Jul. 1, 2013 for U.S. Appl. No. 12/183,367, 7 pages.

(56) References Cited

OTHER PUBLICATIONS

Jeffrey et al.; "Sensor Testing Through Bias Superposition;" Science Direct, Sensors and Actuators, A 136; Feb. 6, 2007, pp. 441-455.
PCT Search Report and Written Opinion of the ISA; dated Aug. 12, 2013; for PCT Pat. App. No. PCT/US2013/044025; 12 pages.
Final Office Action; dated May 2, 2013; for U.S. Appl. No. 12/183,367; 15 pages.
Allegro Microsystems, Inc. Data Sheet A1341; "High Precision, Highly Programmable Linear Hall Effect Sensor IC with EEPROM, Output Protocols SENT and PWM, and Advanced Output Linearization Capabilities;" May 17, 2010; 46 pages.
Allegro Microsystems, Inc. Data Sheet ATS601LSG; "Non-TPOS, Tooth Detecting Speed Sensor;" Nov. 1, 2011; 9 pages.
Cesaretti et al.; "Circuits and Methods for Self-Calibrating or Self-Testing a Magnetic Field Sensor;" U.S. Appl. No. 13/095,371, filed Apr. 27, 2011; 62 pages.
Cesaretti et al.; "Circuits and Methods Using Adjustable Feedback for Self-Calibrating or Self-Testing a Magnetic Field Sensor with an Adjustable Time Constraint;" U.S. Appl. No. 13/398,127, filed Feb. 16, 2012; 85 pages.
Donovan et al.; "Systems And Methods For Synchronizing Sensor Data;" U.S. Appl. No. 12/968,353, filed Dec. 15, 2010; 37 pages.

* cited by examiner

MAGNETIC FIELD SENSORS AND RELATED TECHNIQUES THAT CAN PROVIDE SELF-TEST INFORMATION IN A FORMATTED OUTPUT SIGNAL

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to a magnetic field sensor that has self-test capability and that con communicate self-test information in one of a variety of output signal formats.

BACKGROUND OF THE INVENTION

Various types of magnetic field sensing elements are known, including Hall Effect elements and magnetoresistance elements. Magnetic field sensors generally include a magnetic field sensing element and other electronic components. Some magnetic field sensors also include a fixed permanent magnet.

Magnetic field sensors generate an electrical signal representative of a sensed magnetic field. In some embodiments, the magnetic field sensor provides information about a sensed ferromagnetic object by sensing fluctuations of the magnetic field associated with the magnet part of the magnetic field sensor as an object moves within a magnetic field generated by the magnet. In the presence of a moving ferromagnetic object, the magnetic field signal sensed by the magnetic field sensor varies in accordance with a shape or profile of the moving ferromagnetic object.

In other embodiments, the magnetic field sensor has no magnet, and the magnetic field sensor provides information about a sensed object to which a magnet is coupled.

Magnetic field sensors are often used to detect movement of features of a ferromagnetic gear, such as gear teeth and/or gear slots. A magnetic field sensor in this application is commonly referred to as a "gear tooth" sensor.

In some arrangements, the gear is placed upon a target object, for example, a camshaft in an engine, thus, it is the rotation of the target object (e.g., camshaft) that is sensed by detection of the moving features of the gear. Gear tooth sensors are used, for example, in automotive applications to provide information to an engine control processor for ignition timing control, fuel management, and other operations.

In other embodiments, a ring magnet with a plurality of alternating poles, which can be ferromagnetic or otherwise magnetic, is coupled to the target object. In these embodiments, the magnetic field sensor senses rotation of the ring magnet and the target object to which it is coupled.

Information provided by the gear tooth sensor to the engine control processor can include, but is not limited to, an absolute angle of rotation of a target object (e.g., a camshaft) as it rotates, a speed of rotation, and, in some embodiments, a direction of rotation. With this information, the engine control processor can adjust the timing of firing of the ignition system and the timing of fuel injection by the fuel injection system.

Gear tooth sensors can include internal "detectors" that fall into two categories, namely, true power on state (TPOS) detectors, and precision rotation detectors. The two categories are generally distinguished by three characteristics: and ability to distinguish gear teeth from valleys when the gear is not moving, a speed with which they can identify edges of a gear after they are powered up, and the ultimate accuracy of their ability to detect the edges of the gear and place edges of an output signal at the proper times. TPOS sensors are often able to distinguish gear teeth from valleys while precision rotation detectors are not. TPOS detectors are relatively fast but have relatively low accuracy, while precision rotation detectors tend to be slow but have high accuracy.

Precision rotation detectors tend not to provide an accurate output signal (e.g., indication of absolute angle of rotation of an object or speed of rotation) immediately upon movement of the target object from zero rotating speed and/or upon movement slowing to zero rotating speed, but instead provide an accurate output signal only once the target object has moved through a substantial rotation or is moving with substantial speed. For example, in one type of magnetic field sensor described in U.S. Pat. No. 6,525,531, issued Feb. 25, 2003, a positive digital-to-analog converter (PDAC) and a negative digital-to-analog converter (NDAC) track positive and negative peaks of magnetic field signal, respectively, for use in generating a threshold signal. A varying magnetic field signal is compared to the threshold signal. However, the outputs of the PDAC and the NDAC may not be accurate indications of the positive and negative peaks of the magnetic field signal until several cycles of the signal (i.e., signal peaks) occur (i.e., until several gear teeth have passed).

In contrast, a true power on state (TPOS) detector can provide a moderately accurate output signal (e.g., indication of absolute angle of rotation or speed of rotation) shortly after movement of a target object (e.g., camshaft) from zero rotating speed or also shortly before movement slowing to zero rotating speed. Furthermore, even when the target object is not moving, the TPOS detector can provide an indication of whether the TPOS detector is in front of a gear tooth or a valley. The TPOS detector can be used in conjunction with a precision rotation detector, both providing information to the engine control processor.

As described above, the conventional TPOS detector provides an accurate output signal with only a small initial rotation of the target object, and before the precision rotation detector can provide an accurate output signal. The TPOS detector can provide information to the engine control processor that can be more accurate than information provided by the precision rotation detector for time periods at the beginning and at the end of rotation of the target object (e.g., start and stop of the engine and camshaft), but which may be less accurate when the object is rotating at speed. When the object is rotating at speed, the engine control processor can primarily use rotation information provided by the precision rotation detector. In most conventional applications, once the magnetic field sensor switches to use the precision rotation detector, it does not return to use the TPOS detector until the target object stops rotating or nearly stops rotating.

A conventional TPOS detector is described in U.S. Pat. No. 7,362,094, issued Apr. 22, 2008. The conventional TPOS detector includes a comparator for comparing the magnetic field signal to a fixed, often trimmed, threshold signal. The conventional TPOS detector can be used in conjunction with and can detect rotational information about a TPOS cam (like a gear), which is disposed upon a target object, e.g., an engine camshaft, configured to rotate.

An output signal from a conventional TPOS detector has at least two states, and typically a high and a low state. The state of the conventional TPOS output signal is high at some times and low at other times as the target object rotates, in accordance with features on the TPOS cam attached to the target object. Similarly, the output signal from a conventional precision rotation detector has at least two states, and typically a high and a low state.

Gear tooth sensors depend upon a variety of mechanical characteristics in order to provide accuracy. For example, the gear tooth sensor must be placed close to (i.e., at a small air gap relative to) the ferromagnetic gear, teeth and valleys of which it senses as they pass. A larger air gap results in a smaller signal processed by the gear tooth sensors, which can result in noise or jitter in positions of edges of the two-state output signal generated by the gear tooth sensor.

As is known, some integrated circuits have internal built-in self-test (BIST) capabilities. A built-in self-test is a function that can verify all or a portion of the internal functionality of an integrated circuit. Some types of integrated circuits have built-in self-test circuits built directly onto the integrated circuit die. Typically, the built-in self-test is activated by external means, for example, a signal communicated from outside the integrated circuit to dedicated pins or ports on the integrated circuit. For example, an integrated circuit that has a memory portion can include a built-in self-test circuit, which can be activated by a self-test signal communicated from outside the integrated circuit. The built-in self-test circuit can test the memory portion of the integrated circuit in response to the self-test signal and report self-test results when requested.

Some conventional magnetic field sensors, for example, magnetic field sensors used in automotive applications, are limited in the number of electrical connections made to the magnetic field sensors. It is often desirable that magnetic field sensors have as few as two or three electrical connections, wherein two of the electrical connections are for power and ground.

It would be desirable to provide a magnetic field sensor that has as few as two or three electrical connections, that can perform self-tests, and that can report the results of the self-tests while not interrupting a signal representative of a sensed magnetic field (i.e., as the magnetic field sensor operates in normal operation) and while using only the two or three electrical connections.

SUMMARY OF THE INVENTION

The present invention provides a magnetic field sensor that can have as few as two or three electrical connections, that can perform self-tests, and that can report the results of the self-tests while not interrupting a signal representative of a sensed magnetic field and while using only the two or three electrical connections.

In accordance with one aspect of the present invention, a magnetic field sensor, includes a substrate and one or more magnetic field sensing elements disposed on the substrate and configured to generate a proximity signal responsive to a proximity of a ferromagnetic object. The magnetic field sensor also includes a processing module disposed on the substrate, coupled to receive the proximity signal, and configured to convert the proximity signal to a two-state sensed-proximity signal representative of the proximity of the ferromagnetic object. The magnetic field sensor also includes a self-test module disposed on the substrate and coupled to at least one of the processing module or the magnetic field sensing element. The self-test module is configured to determine a passing condition or a failing condition of the magnetic field sensor. The self-test module is configured to automatically make the determination without external command from outside the magnetic field sensor. The self-test module is configured to generate a self-test result signal representative of the passing condition and of the failing condition. The magnetic field sensor also includes a format module disposed on the substrate and configured to generate a formatted signal in response to the self-test result signal. The formatted signal has first signal characteristics when representative of the passing condition and has second different signal characteristics when representative of the failing condition. The first and second signal characteristics comprise at least one of different respective time durations, different respective current values, or different respective voltage values.

In accordance with another aspect of the present invention, a method of identifying a fault in a magnetic field sensor includes generating a proximity signal responsive to a proximity of a ferromagnetic object with a magnetic field sensing element. The method also includes converting the proximity signal to a two-state sensed-proximity signal representative of the magnetic field. The method also includes automatically determining a passing condition or a failing condition of the magnetic field sensor, wherein the determination is made without external command from outside the magnetic field sensor. The method also includes generating a self-test result signal representative of the passing condition and of the failing condition. The method also includes generating a formatted signal in response to the self-test result signal, wherein the formatted signal has first signal characteristics when representative of the passing condition and has second different signal characteristics when representative of the failing condition.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
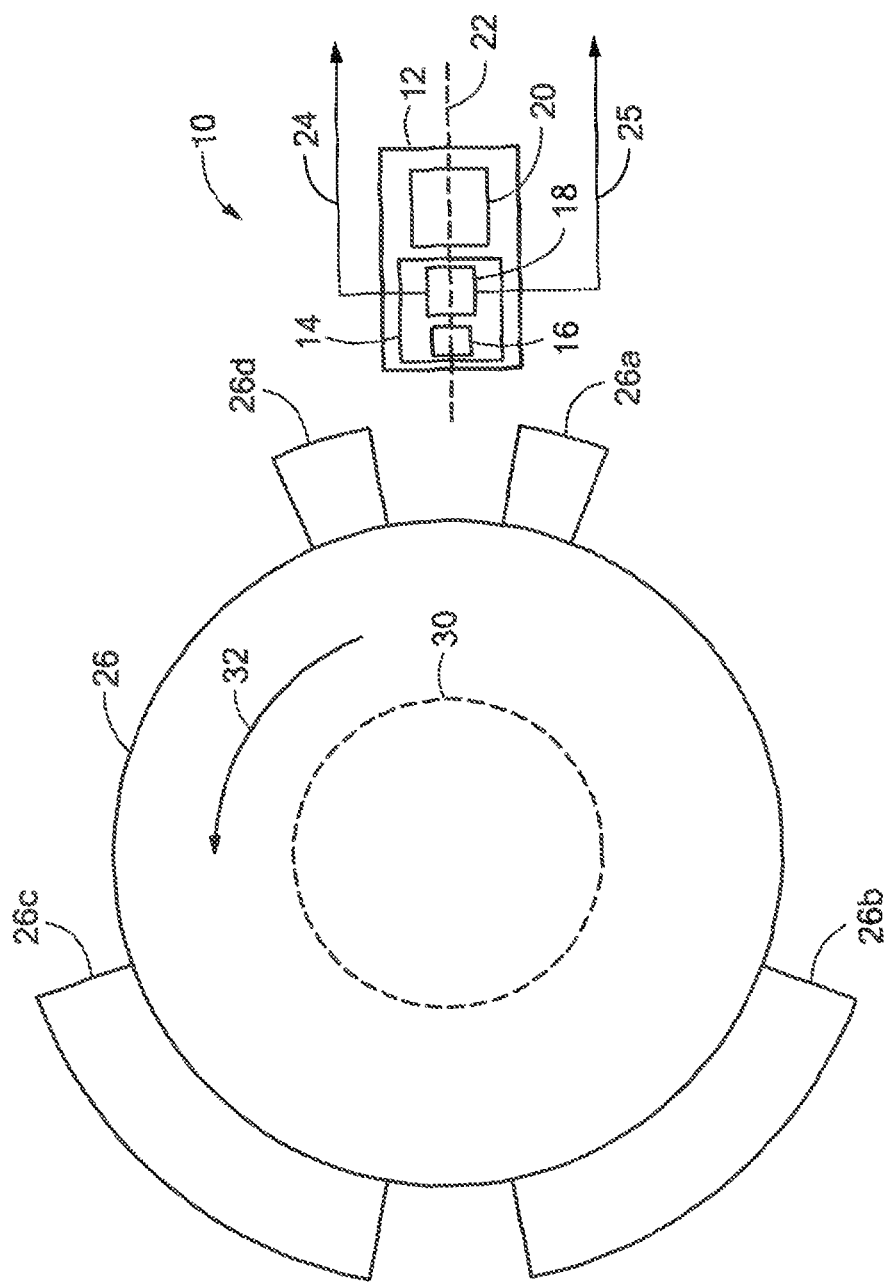
FIG. 1 is a pictorial showing a conventional "true power on state" (TPOS) detector proximate to a TPOS cam having cam features, the TPOS cam disposed upon a shaft configured to rotate, i.e., upon a target object.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more elements arranged in various configurations, e.g., a half bridge or full (Wheatstone) bridge. Depending on the device type and other application requirements, the sensing element XX may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

A so-called "circular vertical Hall" (CVH) sensing element, which includes a plurality of vertical magnetic field sensing elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element includes a circular arrangement of vertical Hall elements arranged over a common circular implant region in a substrate. The CVH sensing element can be used to sense a direction (and optionally a strength) of a magnetic field in a plane of the substrate.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements and semiconductor magnetoresistance elements tend to have axes of sensitivity perpendicular to a substrate, while AMR, GMR, and TMR types of magnetoresistance elements and vertical Hall elements (including circular vertical Hall (CVH) sensing elements) tend to have axes of sensitivity parallel to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch that senses the proximity of a ferromagnetic object, a rotation detector (true power on state (TPOS) detector and precision rotation detector) that senses passing ferromagnetic articles, for example, magnetic domains of a ring magnet, and a magnetic field sensor that senses a magnetic field density of a magnetic field.

As used herein, the term "accuracy," when referring to a magnetic field sensor, is used to refer to a variety of aspects of the magnetic field sensor. These aspects include, but are not limited to, an ability of the magnetic field sensor to differentiate: a gear tooth from a gear valley (or, more generally, the presence of a ferromagnetic object from the absence of a ferromagnetic object) when the gear is not rotating and/or when the gear is rotating (or, more generally, when a ferromagnetic object is moving or not moving), an ability to identify an edge of a tooth of the gear from the tooth or the valley of the gear (or, more generally, the edge of a ferromagnetic object), and a rotational accuracy with which the edge of the gear tooth is identified (or, more generally, the positional accuracy with which an edge of a ferromagnetic object can be identified), i.e., output signal edge placement accuracy and consistency with respect to gear tooth edges passing by the magnetic field sensor.

It is desirable for magnetic field sensors to achieve accuracy even in the presence of variations in an air gap between the magnetic field sensor and the gear that may change from installation to installation or from time to time. It is also desirable for magnetic field sensors to achieve accuracy even in the presence of variations in relative positions of the magnet and the magnetic field sensing element within the magnetic field sensor. It is also desirable for magnetic field sensors to achieve accuracy even in the presence of unit-to-unit variations in the magnetic field generated by a magnet within the magnetic field sensors. It is also desirable for magnetic field sensors to achieve accuracy even in the presence of variations of an axial rotation of the magnetic field sensors relative to the gear. It is also desirable for magnetic field sensors to achieve accuracy even in the presence of temperature variations of the magnetic field sensors. It is also desirable for magnetic field sensors to achieve accuracy even in the presence of wobble and/or radial asymmetry of a gear sensed by the magnetic field sensors.

Examples below describe a particular gear, or mechanical feature, as may be used upon an engine camshaft target object. However, similar circuits and techniques can be used with other cams or gears disposed upon the engine camshaft, or upon other rotating parts of an engine (e.g., crank shaft, transmission gear, anti-lock braking system (ABS)), or upon rotating parts of a device that is not an engine. The gear is not a part of the magnetic field sensor described below. The gear can have ferromagnetic gear teeth.

Examples shown below show a so-called "back-biased" arrangement, in which a permanent magnet, disposed within an integrated circuit package (or alternatively, outside of the magnetic field sensor package), provides a magnet field, which is modulated by passing ferromagnetic gear teeth.

In other embodiments, there is can be no back biasing magnet, and instead, the magnetic field sensor can sense a changing magnetic field generated by a moving permanent magnet, for example, a ring magnet having alternating north and south poles, i.e., magnetic features.

Also, while examples are shown below of magnetic field sensors that can sense ferromagnetic gear teeth upon a gear configured to rotate, the magnetic field sensors can be used in other applications. The other applications include, but are not limited to, sensing ferromagnetic objects, for example, soft ferromagnetic objects (with a back-biased arrangement) or hard ferromagnetic objects (i.e., permanent magnets) upon a linear structure configured to move linearly.

As used herein, the term "self-test" is used to describe functions of the magnetic field sensor that can sense, i.e., test, proper or improper operation of the magnetic field sensor.

As used herein, it should be understood that the term "ferromagnetic object" includes objects comprised of at least one of a soft magnetic material or a hard magnetic material. The term "soft magnetic material" is used herein to refer to a material (e.g., non-magnetized iron or ferrite) that is influenced by a magnetic field but that tends not to generate a magnetic field. In contrast, the term "hard magnetic material" is used herein to refer to a material that generates a magnetic field (i.e., a magnet). With regard to materials that generate a magnetic field, it will be understood that some non-ferrous materials (e.g., rare earth materials) can generate a magnetic field. It is intended that the term "ferromagnetic" encompass those materials as well.

While signals having particular states (e.g., high, low, mid) are shown in examples below, it should be understood that the states can be different states. For examples, a high state can be interchanged with a low state, and a mid-state can be interchanged with a high or a low state.

Referring to FIG. 1, an exemplary TPOS magnetic field sensor arrangement 10 includes a TPOS magnetic field sensor 12. The TPOS magnetic field sensor 12 includes a magnetic field sensing circuit 14 having a magnetic field sensing element 16 coupled to an electronic circuit 18. The TPOS magnetic field sensor 12 can also include a magnet 20. The magnet 20 is configured to generate a magnetic field directed along an axis 22. The electronic circuit 18 is configured to generate a TPOS output signal 24.

The TPOS magnetic field sensor arrangement 10 can also include a TPOS cam 26 having features 26a, 26b, 26c, 26d. The TPOS cam 26 can be disposed, for example, upon a shaft 30 (i.e., a target object) configured to rotate in a direction 32.

In operation, as the TPOS cam 26 rotates, the cam features 26a, 26b, 26c, 26d modulate the magnetic field generated by the magnet 20. Modulations of the magnetic field generated by the magnet 20 are sensed by the magnetic field sensing element 16 and result in state transitions in the TPOS output signal 24.

Particular arrangement and spacing of the cam features 26a, 26b, 26c, 26d results in the TPOS magnetic field sensor 12 being able to provide the TPOS output signal 24 having transitions after only a small number of degrees of rotation of the TPOS cam 26, which can be interpreted by the engine control computer to generate an absolute angle of rotation of the TPOS cam 26 and of the shaft 30 upon which the TPOS cam 26 is disposed.

Figure 2:
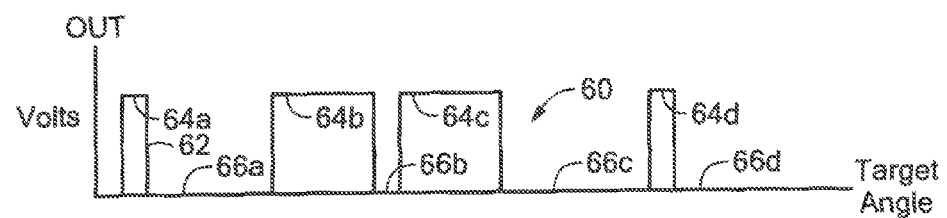
FIG. 2 is a block diagram showing a signal generated by a TPOS detector when in the presence of a rotating TPOS cam upon a target object configured to rotate.

Referring now to FIG. 2, a graph 60 has a horizontal axis with a scale in units of target object rotation angle, for example, from 0 to 360 degrees. The graph 60 also includes a vertical axis having a scale with units of volts in arbitrary units. A signal 62 can be the same as or similar to the TPOS output signal 24 of FIG. 1 generated by the conventional TPOS magnetic field sensor 12. The signal 62 can include periods 64a, 64b, 64c, 64d in which the signal 62 is in a high state and periods 66a, 66b, 66c, 66d in which the signal 62 is in a low state. It should be appreciated that the high state periods 64a, 64b, 64c, 64d of the signal 62 correspond to the features 26a, 26b, 26c, 26d of the TPOS cam 26 of FIG. 1 as they pass by the magnetic field sensing element 16 of FIG. 1 as the TPOS cam 26 rotates.

In operation, it should be appreciated that an absolute angle of rotation of the cam 26 of FIG. 1, corresponding to and beginning at any point (angle) along the horizontal axis of FIG. 2, can be identified with only a small rotation of the cam 26 of FIG. 1, i.e., as edges of the features 26a-26d pass by the magnetic field sensing element 16. When the cam 26 is stationary, the conventional TPOS magnetic field sensor (e.g., 12 of FIG. 1) is able to identify if it is over a cam tooth or valley.

Figure 3:
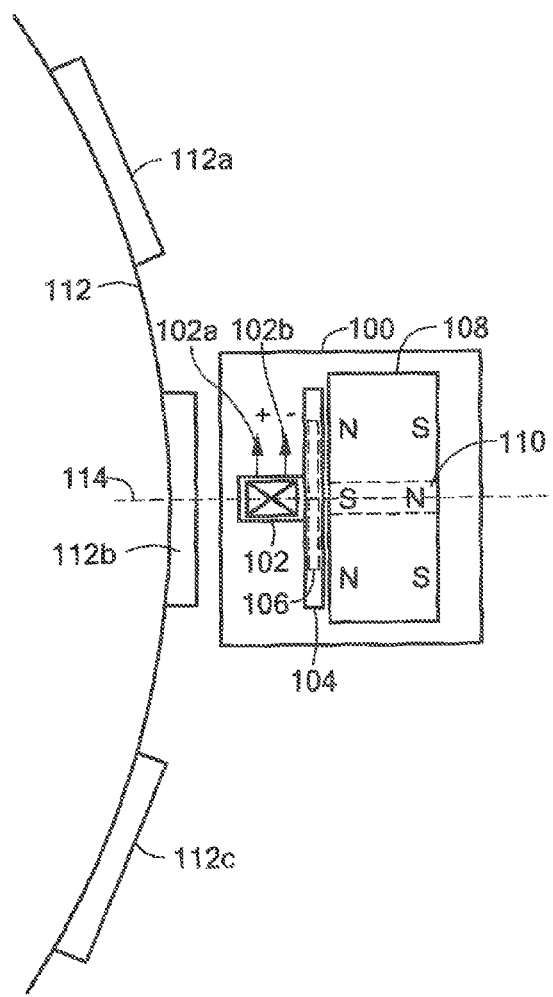
FIGS. 3-3E are block diagrams showing a variety of magnetic field sensor configurations and variety of electronic circuits used within the magnetic field sensors, each electronic circuit having a self-test module, a true power on state (TPOS) detector, and a precision rotation detector.

Referring now to FIG. 3, an exemplary magnetic field sensor 100 is responsive to a gear 112 having ferromagnetic gear teeth, e.g., gear teeth 112a, 112b, 112c. The magnetic field sensor 100 includes a magnetic field sensing element 102 coupled to an electronic circuit 106. The magnetic field sensing element 102 and the electronic circuit 106 can be disposed upon (i.e., integrated within or upon) a substrate 104. Here, the magnetic field sensing element 102 is shown to be a Hall element with an exaggerated size for clarity. As is known, a Hall element can be integrated within the substrate 104.

The magnetic field sensor 100 can also include a magnet 108. The magnet 108 is configured to generate a magnetic field, which is generally directed along an axis 114 at the position of the magnetic field sensing element 102, and which is subject to direction and amplitude changes depending upon positions of the gear teeth 112a, 112b, 112c relative to the magnetic field sensor 100.

The electronic circuit 106 is configured to generate an output signal (not shown), which can be the same as or similar to the signal 62 of FIG. 2. The output signal, when the gear is not moving, has a state indicative of whether the magnetic field sensor 100 is over a gear tooth or a gear valley. The output signal, when the gear is rotating, has an edge rate or a frequency indicative of a speed of rotation of the gear. Edges or transitions of states of the output signal can be used to identify positions of edges of the gear teeth as they pass by the magnetic field sensor.

The magnet 108 can include a central core 110 disposed within the magnet 108. An exemplary magnet with a core is described in U.S. Pat. No. 6,278,269, entitled "Magnet Structure," issued Aug. 21, 2001, which patent is assigned to the assignee of the present invention and incorporated herein by reference in its entirety. As described in U.S. Pat. No. 6,278, 269, the pole configuration provided by the magnet 108 within the core 110 lowers the base field (or baseline) of a flux density map of the magnetic field by bringing both poles of the magnetic field to a surface of the magnet proximate to the substrate 104. A predetermined baseline (e.g., within a range of about +/−six hundred Gauss) at the magnetic field sensing element 102, and a resulting differential magnetic field signal 102a, 102b (i.e., an analog differential proximity signal) near zero, can be achieved with proper design.

In contrast, when a gear tooth is proximate to the magnetic field sensing element 102, the magnetic field sensing element 102 experiences a higher magnetic field and generates the differential proximity signal 102a, 102b with a high value.

As is apparent, the baseline remains constant even as the air gap between the gear teeth and the magnetic field sensor 100 varies. This advantageous result of low baseline substantially independent of air gap is achieved by presenting opposite poles at the face of the magnet 108 and core 110 proximate to the magnetic field sensing element. This effect is also described in U.S. Pat. No. 5,781,005, issued Jul. 14, 1998, entitled "Hall-Effect Ferromagnetic-Article-Proximity Sensor," which patent is assigned to the assignee of the present invention and incorporated herein by reference in its entirety.

The above-described low baseline results in an enhanced ability of the electronic circuit 106 to differentiate the presence of the gear tooth from a gear valley. Thus, the magnetic field sensor 100 can be referred to as a "tooth detector," as opposed to "edge detectors" described below.

The magnetic field described above and provided by the magnet 108 with the core 110 results in an improved accuracy of the magnetic field sensor 100. For example, the improved magnetic field allows the magnetic field sensing element 102 to be somewhat statically misaligned from a center of the magnet 108, as will occur due to unit-to-unit variations of mechanical alignments, without sacrificing accuracy of the magnetic field sensor 100. Accuracy is discussed above.

Figure 3A:
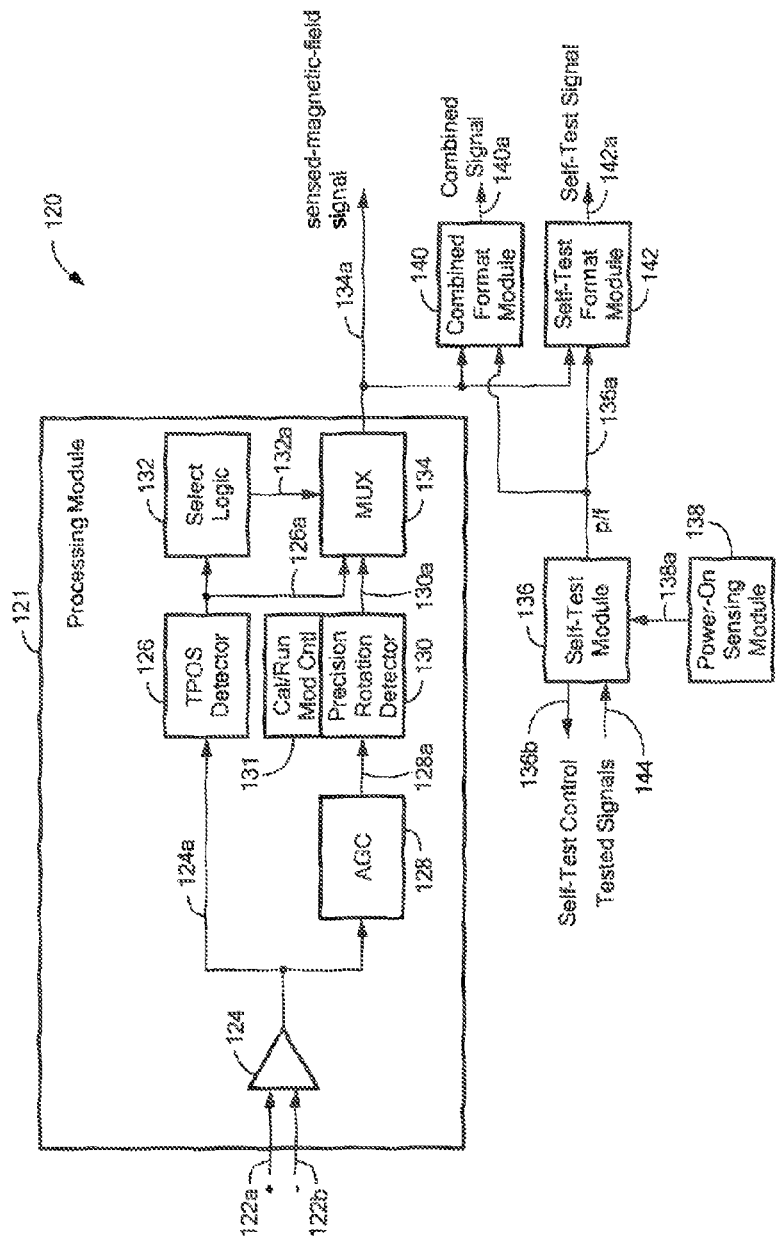

Referring now to FIG. 3A, an exemplary electronic circuit 120 can be the same as or similar to electronic circuit 106 of FIG. 3. The electronic circuit 120 can include a processing module 121 having an amplifier 124 coupled to receive a differential proximity signal 122a, 122b, which can be the same as or similar to the differential proximity signal 102a, 102b generated by the magnetic field sensing element 102 of FIG. 3. The amplifier 124 is configured to generate an amplified signal 124a (also referred to herein as a proximity signal), which, in some embodiments, can split into two channels.

In a true power on state (TPOS) channel, a TPOS detector 126 can be coupled to receive the amplified signal 124a and configured to generate a TPOS output signal 126a. To this end, in some embodiments, the TPOS detector 126 can include a comparator (not shown) configured to compare the amplified signal 126a with a fixed predetermined (and trimmed) threshold. In these embodiments, the TPOS output signal 126a can be a two-state binary signal for which a high state is indicative of a gear tooth being proximate to the magnetic field sensor 100 of FIG. 3 and a low state is indicative of a gear valley being proximate to the magnetic field sensor 100, or vice versa.

In a precision rotation detector channel, an automatic gain control (AGC) 128 can be coupled to receive the amplified proximity signal 124a and configured to generate a gain controlled signal 128a. A precision rotation detector 130 can be coupled to receive the gain controlled signal 128a and configured to generate a precision rotation detector output signal 130a. Like the TPOS output signal 126a, the precision rotation detector output signal 130a can be a two-state binary signal for which a high state is indicative of a gear tooth being proximate to the magnetic field sensor 100 of FIG. 3 and a low state is indicative of a gear valley being proximate to the magnetic field sensor 100, or vice versa. Thus, both the TPOS detector 126 and the precision rotation detector 130 can be "tooth detectors."

In some alternate embodiments, the precision rotation detector 130 can be an "edge detector," which is unable to identify whether the magnetic field sensor 102 is proximate to a gear tooth or a gear valley, particularly when the gear is not moving. However, a low to high state transition of the precision rotation detector output signal 130a can be indicative of a transition from a gear valley being proximate to the magnetic field sensing element 102 to a gear tooth being proximate to the magnetic field sensing element 102, and a high to low state transition can be indicative of a transition from the gear tooth being proximate to the magnetic field sensing element 102 to a gear valley thing proximate to the magnetic field sensing element 102, or vice versa.

The precision rotation detector 130 can be coupled to, or can otherwise include, a calibration/running mode control module 131. The calibration/running mode control module 131 can be operable to cause the precision rotation detector 130 to use first thresholds for comparison with the gain controlled signal 128a during a "calibration mode," usually for a short time period following a beginning of rotation of the gear that is being sensed. Thereafter, the calibration/running mode control module 131 can be operable to cause the precision rotation detector 130 to use second different thresholds accurately determined by the precision rotation detector 130 during a "running mode."

Precision rotation detectors, e.g., the precision rotation detector 130, can have a variety of configurations. Some configurations are described in the above mentioned U.S. Pat. No. 6,525,531. However, other forms of precision rotation detectors are also known. Exemplary precision rotation detectors and exemplary TPOS detectors are described in greater detail below in conjunction with FIGS. 4B and 4C.

In general, from discussion above, it will be appreciated that the TPOS output signal 126a is able to identify whether the magnetic field sensing element 102 is proximate to a gear tooth or to a gear valley, even when the gear, e.g., the gear 152 of FIG. 3 is stationary. However, since the TPOS detector 126 uses a fixed threshold, variations in the edge placement in the TPOS output signal 126a will occur due to a variety of factors, including, but not limited to, temperature variations, and variations in the air gap between the magnetic field sensing element 102 and the gear 152.

Unlike the TPOS detector 126, which uses fixed thresholds, the precision rotation detector 130 continually makes adjustments of thresholds to provide the precision rotation detector output signal 130a with better accuracy of edge placements of the precision rotation detector output signal 130a relative to physical positions of gear teeth, and edges of gear teeth in particular.

A multiplexer 134 can be coupled to receive the TPOS output signal 126a and coupled to receive the precision rotation detector output signal 130a. Select logic 132 can provide a selection signal 132a, received by the multiplexer/output module 134. Depending upon the state of the selection signal 132a, the multiplexer 134 is configured to generate a signal 134a representative of a selected one of the TPOS output signal 126a or the precision rotation detector output signal 130a.

The signal 134a is representative of rotation of the gear 112 of FIG. 3, and thus, is also referred to herein as a "rotation signal." In some embodiments, the rotation signal has a first state associated with a gear tooth and a second different state associated with a valley in the gear 112.

The select logic 132 can be coupled to receive the TPOS output signal 126a. In some exemplary embodiments, the select logic 132 selects the signal 134a to be representative of the TPOS output signal 126a for a predetermined amount of time after the gear 152 starts rotating as indicated by the TPOS output signal 126a. Thereafter, the select logic 132 selects the signal 134a to be representative of the precision rotation detector output signal 130a.

Other magnetic field sensors can include only the TPOS channel having the TPOS detector 126 or only the precision rotation detector channel having the precision rotation detector 130.

The electronic circuit 120 can also include a self-test module 136. The self-test module 136 can be coupled to receive one or more tested signals 144 described more fully below in conjunction with FIGS. 4, 4B, 4C, and 4D.

The self-test module 136 is configured to generate a self-test signal 136a. In some other embodiments, the self-test signal 136a is a two-state signal representative of a passing condition or a failing condition of the electronic circuit 120 and/or of a magnetic field sensing element to which the electronic circuit 120 is coupled. In still other embodiments, the self-test signal 136a is a signal having more than two states representative of more than two self-test conditions of the electronic circuit 120, for example, specific failures of the electronic circuit 120 and/or of a magnetic field sensing element to which the electronic circuit 120 is coupled.

The electronic circuit 120 can also include a power-on sensing module 138 configured to generate a power-on signal 138a. In some embodiments, the power-on signal 138a can be a two state signal with a first state representative of a time from a power on of the electronic circuit 120 to a predetermined time after the power on, and with a second state representative of a time after the predetermined time.

A self-test format module 142 can be coupled to receive the self-test signal 136a. In some embodiments, the self-test format module 142 is configured to provide an output signal 142a having a format indicative of the passing condition, the failing condition, or a specific failing condition of the electronic circuit 120 and/or of a magnetic field sensing element to which the electronic circuit 120 is coupled.

A combined format module 140 can be coupled to receive the self-test signal 136a and coupled to receive the sensed-magnetic-field signal 134a. In some embodiments, the combined format module 140 is configured to provide an output signal 140a having a format indicative of the passing condition, the failing condition, or a specific failing condition of the electronic circuit 120 and/or of a magnetic field sensing element to which the electronic circuit 120 is coupled, and also indicative of a magnetic field detected by a magnetic field sensing element to which the electronic circuit 120 is coupled.

One or more of the signals 134a, 140a, 142a can be coupled to a respective one or more pins on a lead frame in an integrated circuit. Couplings are described more fully below in conjunction with FIGS. 4 and 4A.

Figure 3B:
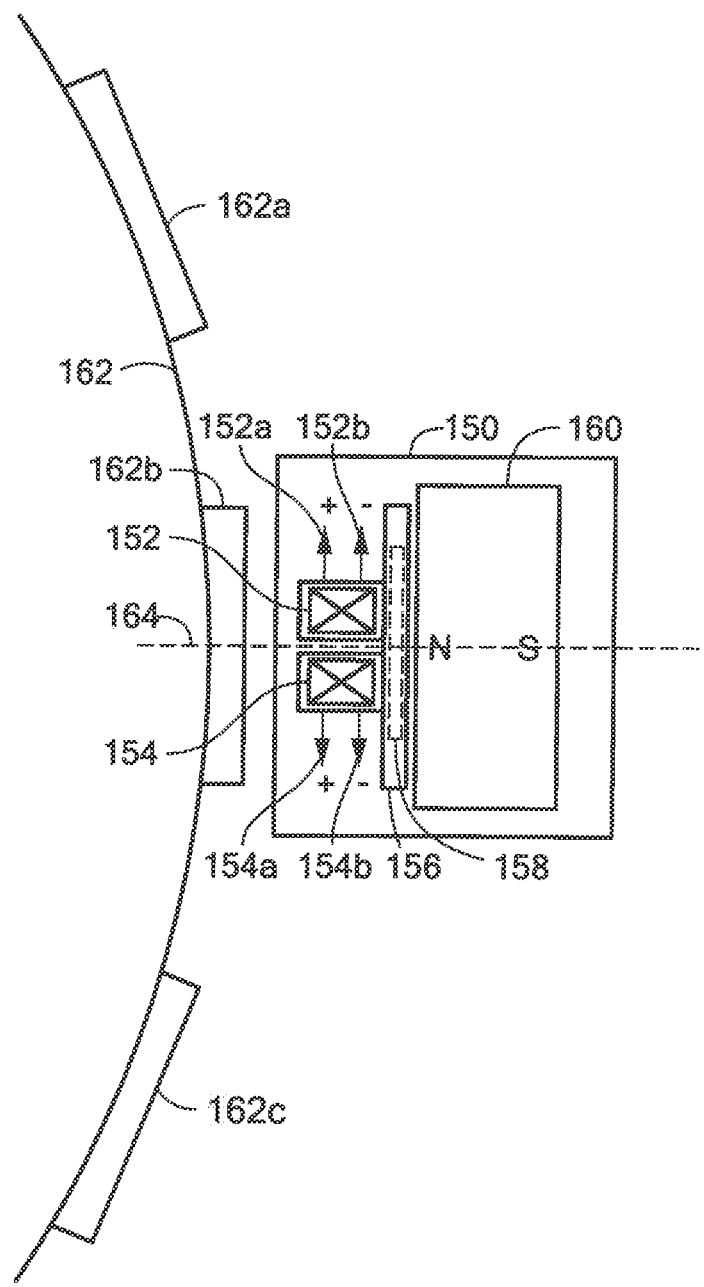

Referring now to FIG. 3B, another exemplary magnetic field sensor 150 is responsive to a gear 162 having gear teeth, e.g., gear teeth 162a, 162b, 162c. The magnetic field sensor 150 includes two magnetic field sensing elements 152, 154 coupled to an electronic circuit 158. In some embodiments, the two magnetic field sensing elements 152, 154 are separated in a direction perpendicular to an axis 214 and parallel to a gear by a distance between about 1.5 millimeters and about 3.0 millimeters. In other embodiments, the magnetic field sensing elements 152, 154 can be separated by a distance between about 0.5 millimeters and 1.5 millimeters. In other embodiments, the magnetic field sensing elements can be separated by more than 3.0 millimeters.

The two magnetic field sensing elements 152, 154 and the electronic circuit 158 can be disposed upon (i.e., integrated within or upon) a substrate 156. Here, the magnetic field sensing elements 152, 154 are shown to be Hall elements with an exaggerated size for clarity. The magnetic field sensor 150 can also include a magnet 160. The magnet 160 is configured to generate a magnetic field, which is generally directed along the axis 164 at the position of the magnetic field sensing elements 152, 154. The electronic circuit 150 is configured to generate an output signal (not shown). Let it suffice here to say that the electronic circuit 150 generates a difference of two differential proximity signals 152a, 152b, and 154a, 154b. For reasons described more fully below, the magnetic field sensor 150, using the differencing arrangement, forms an edge detector, able to detect passing edges of gear teeth, but unable to differentiate a gear tooth from a gear valley.

The output signal, when the gear 162 is rotating, is indicative speed of rotation of the gear 162 and also indicative of positions of edges of the gear teeth. However, because of the differencing arrangement, for reasons described more fully below, the magnetic field sensor 150 is unable to provide a TPOS function (which must differentiate a gear tooth from a gear valley) When the gear 162 is stationary, the magnetic field sensor 150 is unable to identify whether the magnetic field sensing elements 152, 154 are proximate to a gear tooth or a valley in the gear 162.

The magnet 160 can be comprised of one uniform material, and can have no central core, which is shown and described in conjunction with FIG. 3. However, in other embodiments, the magnet 160 can have a central core the same as or similar to that shown and described in FIG. 3.

As described above in conjunction with FIG. 3, the central core 110 results in a low baseline when the magnetic field sensing element 102 of FIG. 3 is proximate to a valley in the gear 152. However, the magnetic field sensor 150 uses two magnetic field sensing elements, generating a respective two differential output signals 152a, 152b and 154a, 154b. As described below in conjunction with FIG. 3C, signals representative of the two differential output signals 152a, 152b and 154a, 154b are subtracted in the electronic circuit 158. Thus, when the two magnetic field sensing elements 152, 154 are proximate to a valley in the gear 162, the low baseline is achieved due to the differencing arrangement, since the two magnetic field sensing elements 152, 154 experience the same, or a similar, magnetic field. Also, when the two magnetic field sensing elements 152, 154 are proximate to a gear tooth, e.g., 162a, 162b, 162c, the low baseline is also achieved, since the two magnetic field sensing elements 152, 154 again experience the same, or a similar, magnetic field. Only when the two magnetic field sensing elements 152, 154 experience different magnetic fields does a difference between the two differential signals 152a, 152b and 154a, 154b result in a higher value. The higher value may occur when one of the magnetic field sensing elements is proximate to a valley in the gear 162 and the other magnetic field sensing element is proximate to a gear tooth, i.e., an edge of one of the gear teeth is between the two magnetic field sensing elements 152, 154. For this reason, the magnetic field sensor 150, having two magnetic field sensing elements used in a differential arrangement, is sometimes referred to as an "edge detector." The edge detecting behavior makes the magnetic field sensor 150 particularly useful when it is necessary to accurately know the rotational position of the gear, which can be determined by knowledge of positions of the edges of the gear teeth represented by state transitions in the output signal from the magnetic field sensor 150.

The differencing of the two differential signals 152a, 152b and 154a, 154b results in an improved accuracy of the magnetic field sensor 150. For example, the magnetic field sensor 150 is not influenced by external magnetic fields, i.e., noise magnetic fields, that both of the two magnetic field sensing elements 152, 154 experience.

Figure 3C:
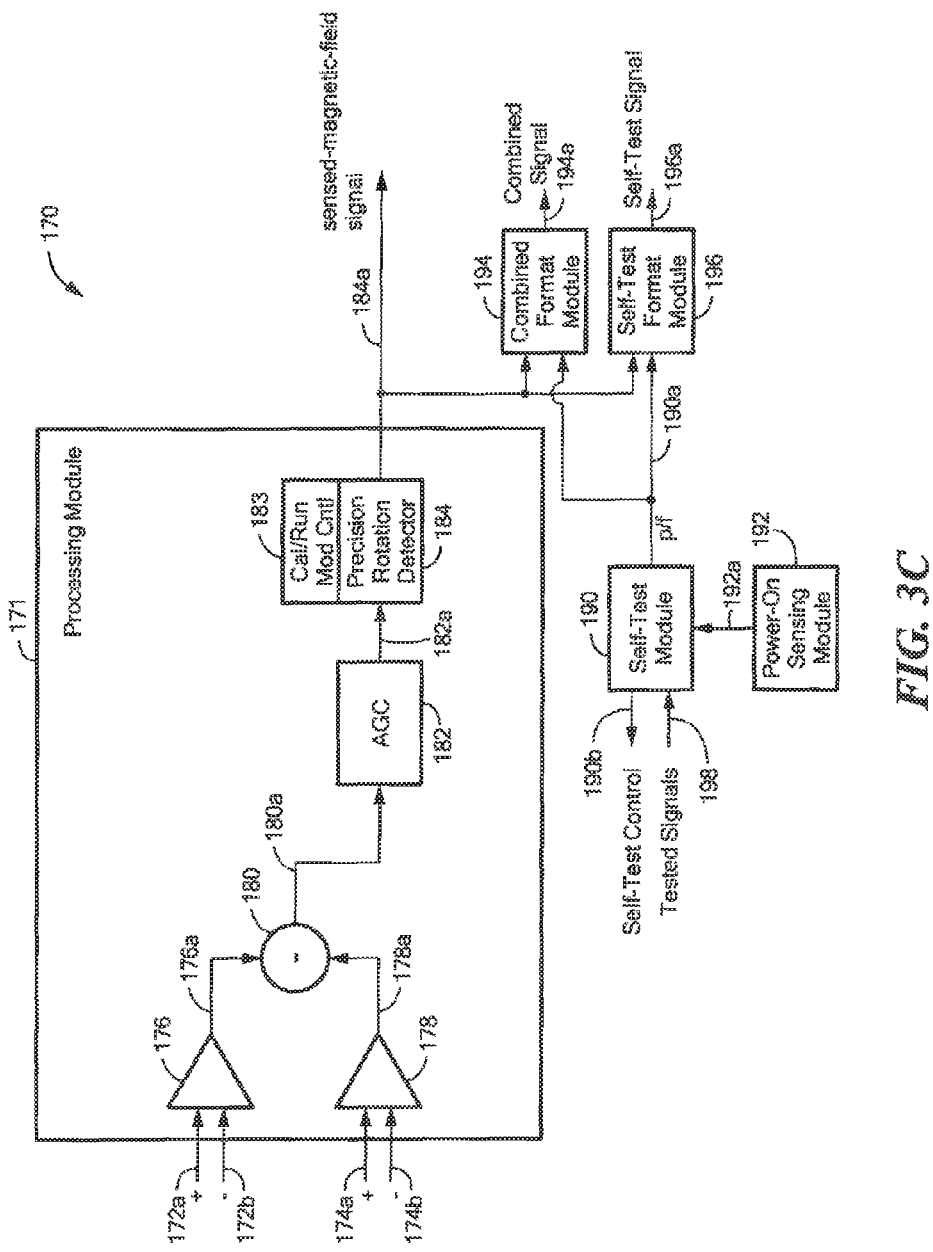

Referring now to FIG. 3C, an exemplary electronic circuit 170 can include a processing module 171 having amplifiers 176, 178 coupled to receive differential signals 172a, 172b and 174a, 174b, respectively. The differential signal 172a, 172b can be the same as or similar to the differential signal 152a, 152b and the differential signal 174a, 174b can be the same as or similar to the differential signal 154a, 154b generated, respectively, by the magnetic field sensing elements 152, 154 of FIG. 3B. The amplifiers 176, 178 are configured to generate amplified signals 176a, 178a, respectively.

The amplified signals 176a, 178a are received by a differencing module 180, which is configured to generate a difference signal 180a (a proximity signal). Characteristics and behaviors of the difference signal 180a will be understood from the discussion above.

The electronic circuit 170 includes only the precision rotation detector channel described above in conjunction with FIG. 3A. An AGC 182 can be the same as or similar to the AGC 128 of FIG. 3A, a precision rotation detector 184 can be the same as or similar to the precision rotation detector 130 of FIG. 3A, and a calibration/running mode control module 183 can be the same as or similar to the calibration/running mode control module 131 of FIG. 3A. The precision rotation detector 184 can generate a precision rotation detector output signal 184a.

The electronic circuit 170 can also include a self-test module 190, a power-on sensing module 192, a self-test format module 196, and a combined format module 194, which can be the same as or similar to the self-test module 136, the power-on sensing module 138, the self-test format module 142, and the combined format module 140 of FIG. 3A.

Figure 3D:
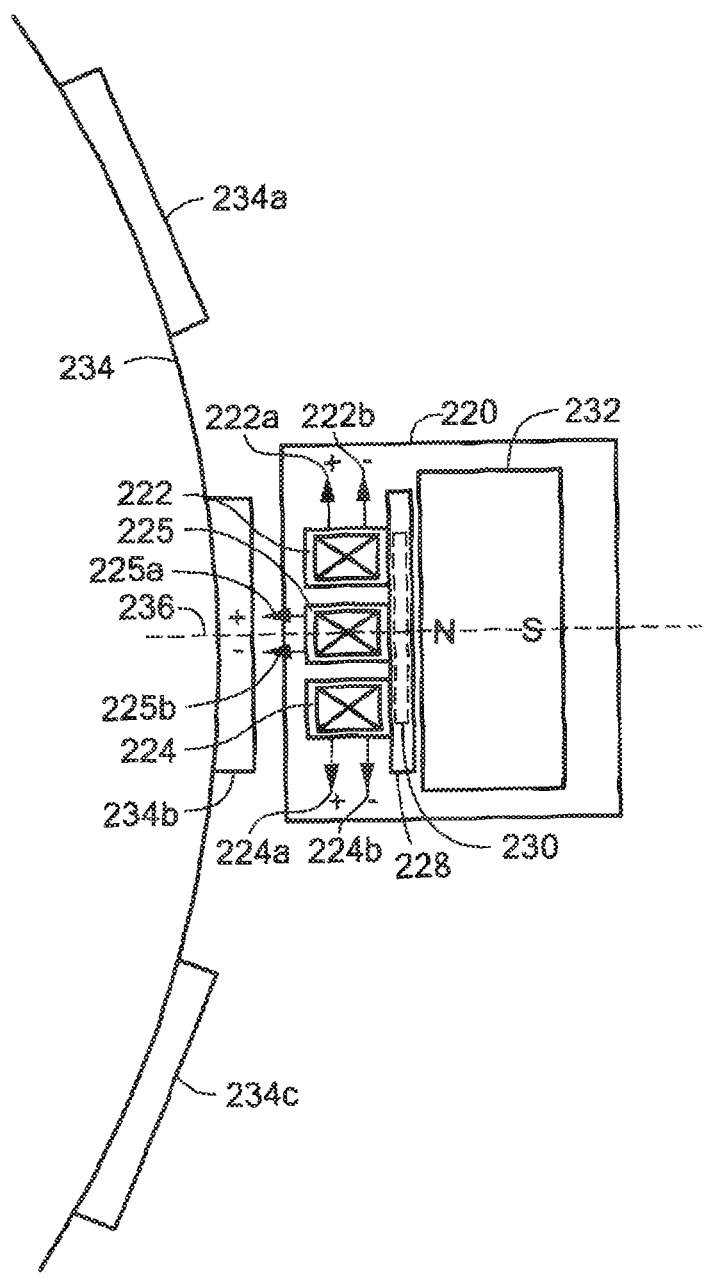

Referring now to FIG. 3D, another exemplary conventional magnetic field sensor 220 is responsive to a gear 234 having gear teeth, e.g., gear teeth 234a, 234b, 234c. The magnetic field sensor 220 includes three magnetic field sensing elements 222, 224, 226 coupled to an electronic circuit 230. In some embodiments, the magnetic field sensing elements 222, 224 are separated in a direction perpendicular to an axis 236 by a distance between about 1.5 millimeters and about 3.0 millimeters, and the magnetic field sensing element 226 is located midway between the magnetic field sensing elements 222, 224.

The three magnetic field sensing elements 222, 224, 226 and the electronic circuit 230 can be disposed upon (i.e., integrated within or upon) a substrate 228. Here, the magnetic field sensing elements 222, 224, 226 are shown to be Hall elements with an exaggerated size for clarity. The magnetic field sensor 220 can also include a magnet 232. The magnet 232 is configured to generate a magnetic field, which is generally directed along an axis 236 at the position of the magnetic field sensing elements 222, 224, 226.

The electronic circuit 230 is configured to generate an output signal (not shown). An exemplary electronic circuit 230 is described below in conjunction with FIG. 3E. Let it suffice here to say that the electronic circuit 230, like the electronic circuit 230 of FIG. 3C above, generates a difference of signals. Thus, for reasons described above, the magnetic field sensor 220 is an edge detector and not a tooth detector.

The output signal, when the gear 234 is rotating, is indicative speed of rotation of the gear 234, indicative of positions of edges of the gear teeth, and can also be indicative of a direction or rotation of the gear 234. However, for reasons described more fully above, the magnetic field sensor 220 is unable to provide a TPOS function, and, when the gear 234 is stationary, is unable to identify whether the magnetic field sensing elements 222, 224, 226 are proximate to a gear tooth or a valley in the gear 234.

The magnet 232 can be comprised of one uniform material, and can have no central core, which is shown and described in conjunction with FIG. 3. However, in other embodiments, the magnet 232 can have a central core the same as or similar to that shown and described in conjunction with FIG. 3.

The differencing of pairs of three differential signals 222a, 222b, and 224a, 224b, and 226a, 226b results in an improved accuracy of the magnetic field sensor 220. For example, like the magnetic field sensor 200 of FIG. 3B, the magnetic field sensor 220 is not influenced by external magnetic fields, i.e., noise magnetic fields, that the three magnetic field sensing elements 222, 224, 226 experience.

Figure 3E:
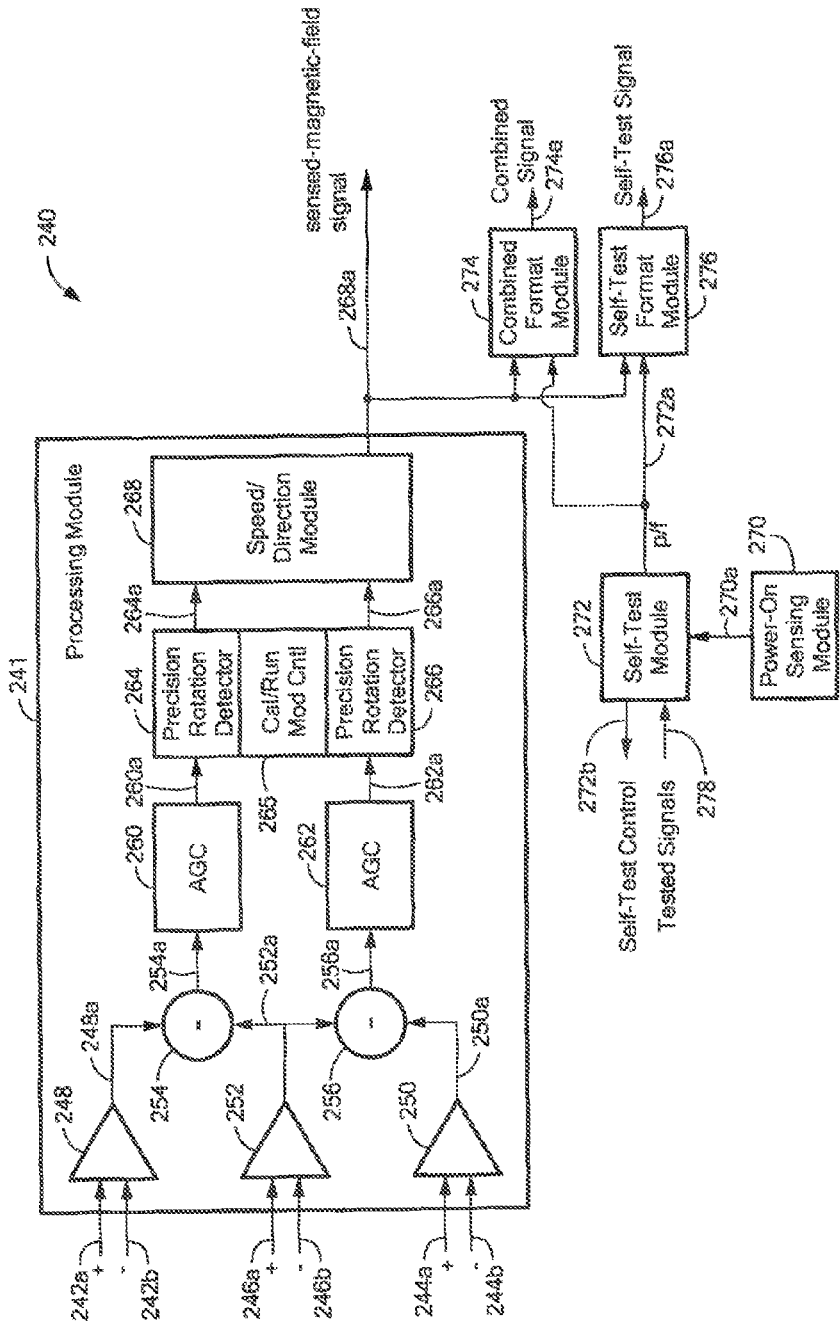

Referring now to FIG. 3E, an exemplary electronic circuit 240 can be the same as or similar to the electronic circuit 230 of FIG. 3D. The electronic circuit 240 can include a processing module 241 having amplifiers 248, 250, 252 coupled to receive differential signals 242a, 242b, and 244a, 244b, and 246a, 246b, respectively. The differential signal 242a, 242b can be the same as or similar to the differential signal 222a, 222b, the differential signal 244a, 244b can be the same as or similar to the differential signals 224a, 224b, and the differential signal 246a, 246b can be the same as or similar to the differential signal 226a, 226b generated, respectively, by the magnetic field sensing elements 222, 224, 226 of FIG. 3D. The amplifiers 248, 250, 252 are configured to generate amplified signals 248a, 250a, 252a, respectively.

The amplified signals 248a, 252a are received by a first differencing module 254, which is configured to generate a first difference signal 254a (a proximity signal). The amplified signals 250a, 252a are received by a second differencing module 256, which is configured to generate a second difference signal 256a (a proximity signal). Characteristics and behaviors of the difference signals 254a, 256a will be understood from the discussion above.

The electronic circuit 240 includes only precision rotation detector channels described above in conjunction with FIG. 3A. Only one of the two precision rotation detector channels is described herein as being representative of the other precision rotation detector channel. An AGC 260 can be the same as or similar to the AGC 128 of FIG. 3A, a precision rotation detector 264 can be the same as or similar to the precision rotation detector 130 of FIG. 3A, and a calibration/running mode control module 265 can be the same as or similar to the calibration/running mode control module 131 of FIG. 3A.

The precision rotation detector 264 can generate a precision rotation detector output signal 264a.

A speed/direction module 268 can be coupled to receive the precision rotation detector output signal 264a and also another precision rotation detector output signal 266a. The speed/direction module 268 is configured to generate an output signal 268a representative of a speed of rotation and a direction of rotation of the gear 234. It will be understood that the direction information can be determined by way of a phase difference of the two precision rotation detector output signals 264a, 266a, and the speed information can be determined by way of a frequency of either one of the two precision rotation detector output signals 264a, 266a.

The electronic circuit 240 can also include a self-test module 272, a power-on sensing module 270, a self-test format module 276, and a combined format module 274, which can be the same as or similar to the self-test module 136, the power-on sensing module 138, the self-test format module 142, and the combined format module 140 of FIG. 3A.

While magnetic field sensors described above in conjunction with FIGS. 3-3E are shown to include respective automatic gain control circuits (AGCs) configured to generate respective gain-controlled signals, in other embodiments, the AGCs can be replaced by fixed gain amplifiers or buffers. For embodiments in which the gain of the amplifiers are fixed, it should be understood that the gain of the amplifiers can be greater that one, less than one, or one.

Figure 4:
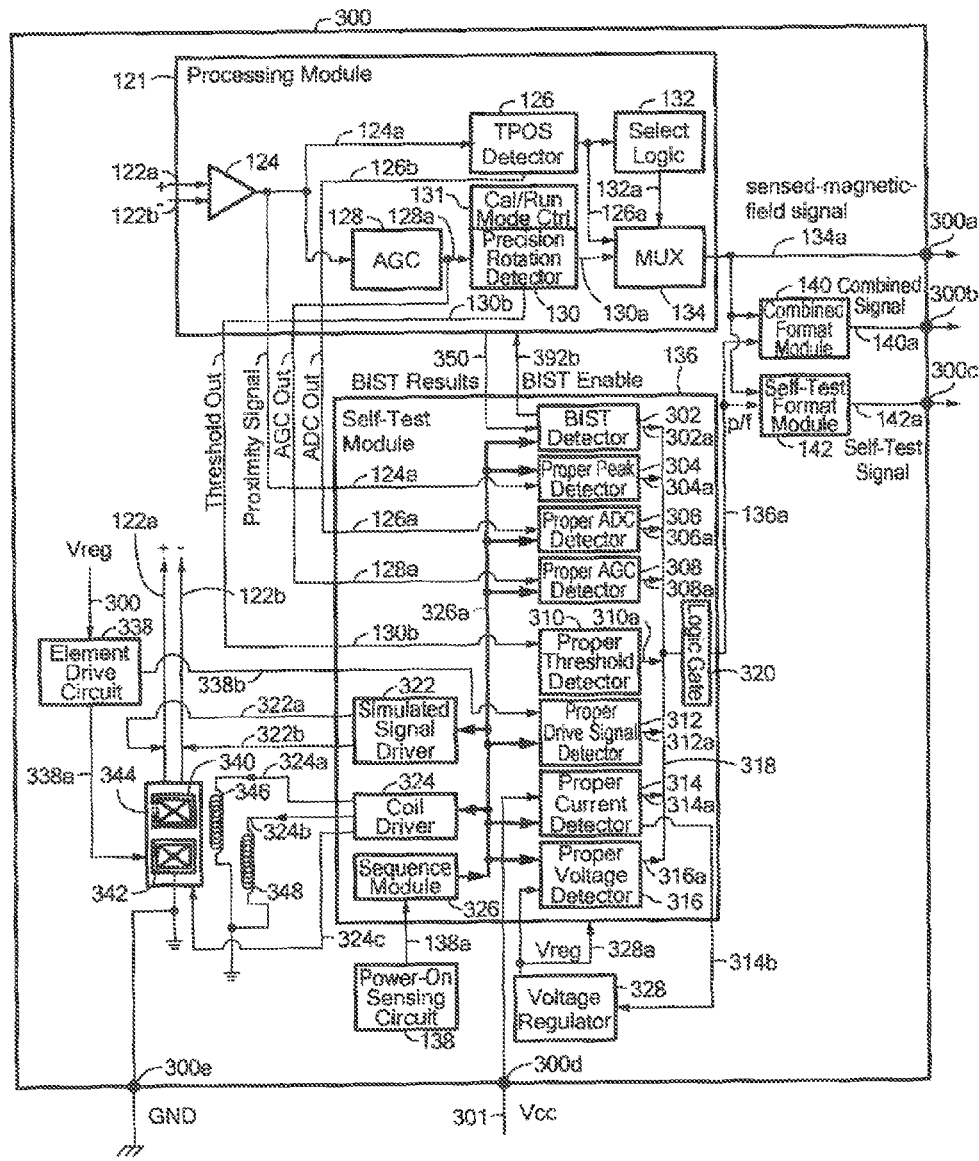
FIG. 4 is a block diagram of an exemplary magnetic field sensor having a self-test module, which can be used as the self-test module in the magnetic field sensors of FIGS. 3-3E.
Figure 4A:
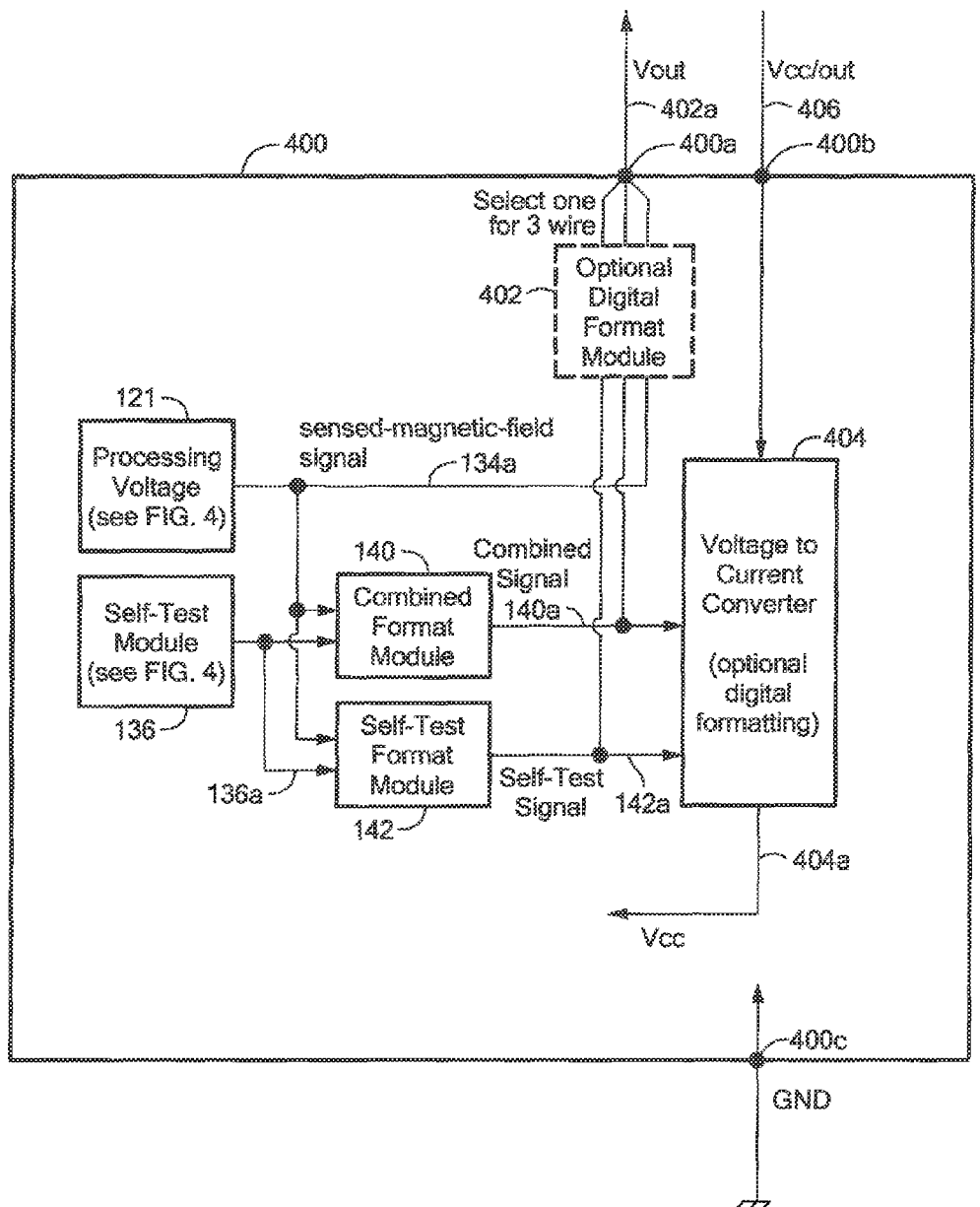
FIG. 4A is a block diagram showing nodes or pins of the magnetic field sensor of FIG. 4.
Figure 4B:
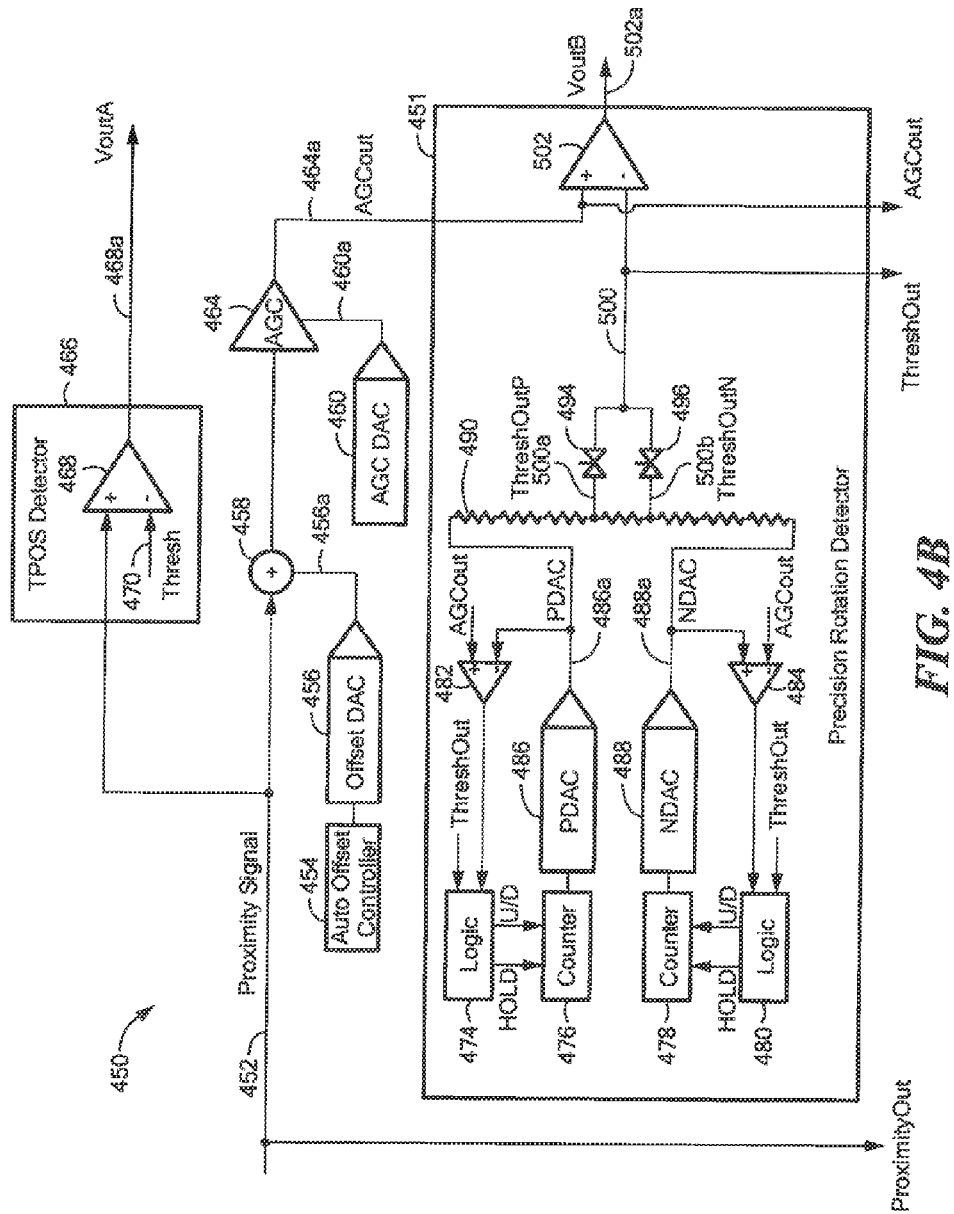
FIG. 4B is a block diagram showing further details of an exemplary TPOS detector and an exemplary precision rotation detector that can be used within the magnetic field sensors of FIGS. 3-3E, 4, and 4A.
Figure 4C:
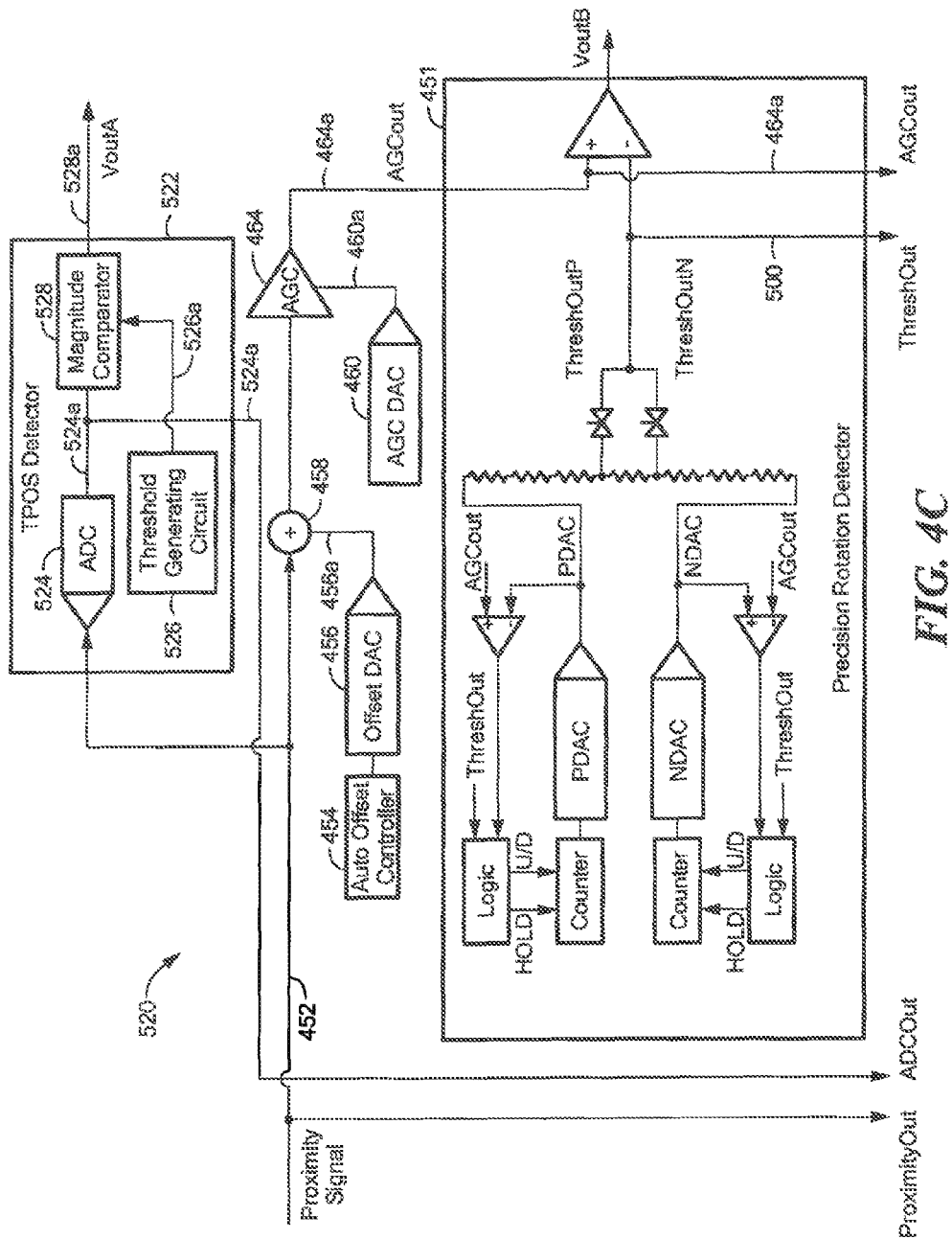
FIG. 4C is a block diagram showing further details of an honor TPOS detector and the precision rotation detector that can be used within the magnetic field sensors of FIGS. 3-3E, 4, and 4A.
Figure 4D:
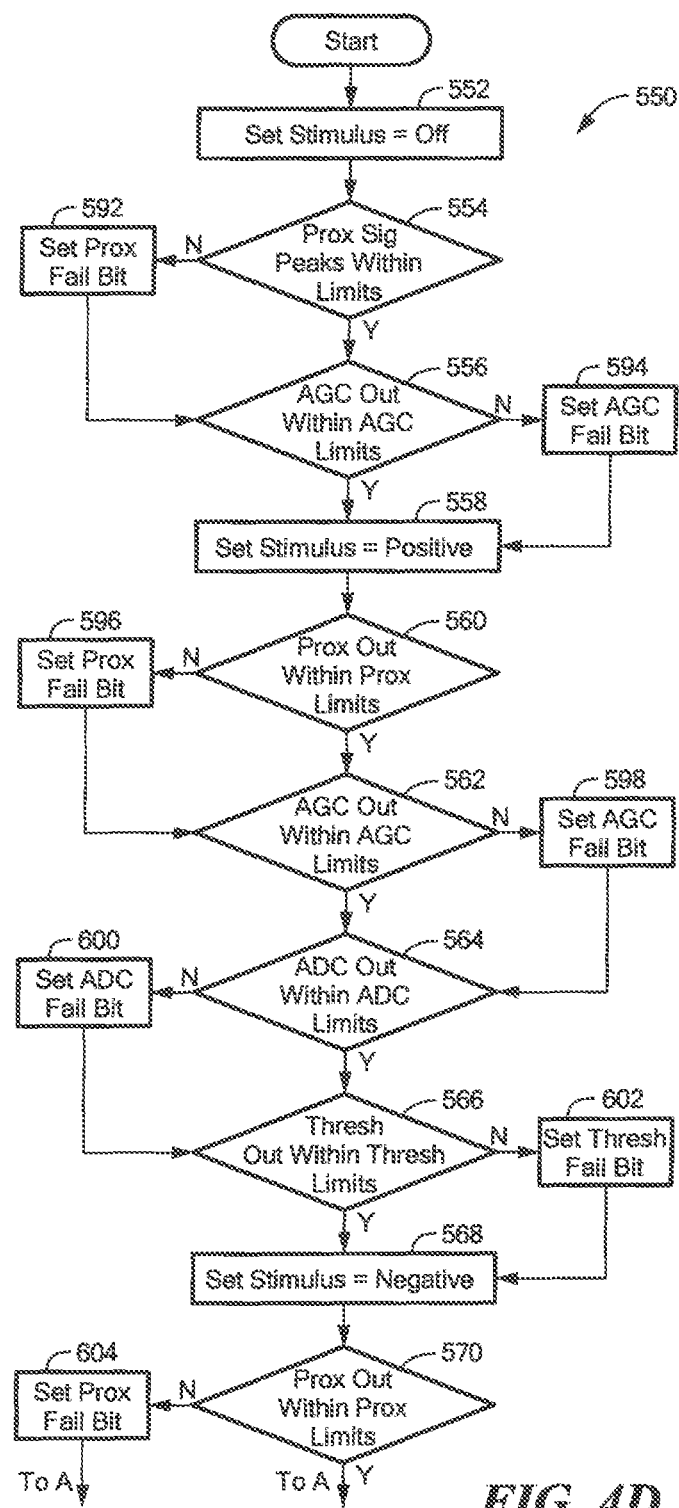
FIG. 4D is a flow chart showing a sequence of self-tests that can be used in the self-test modules of FIGS. 3-3E, 4, and 4A.
Figure 4D:
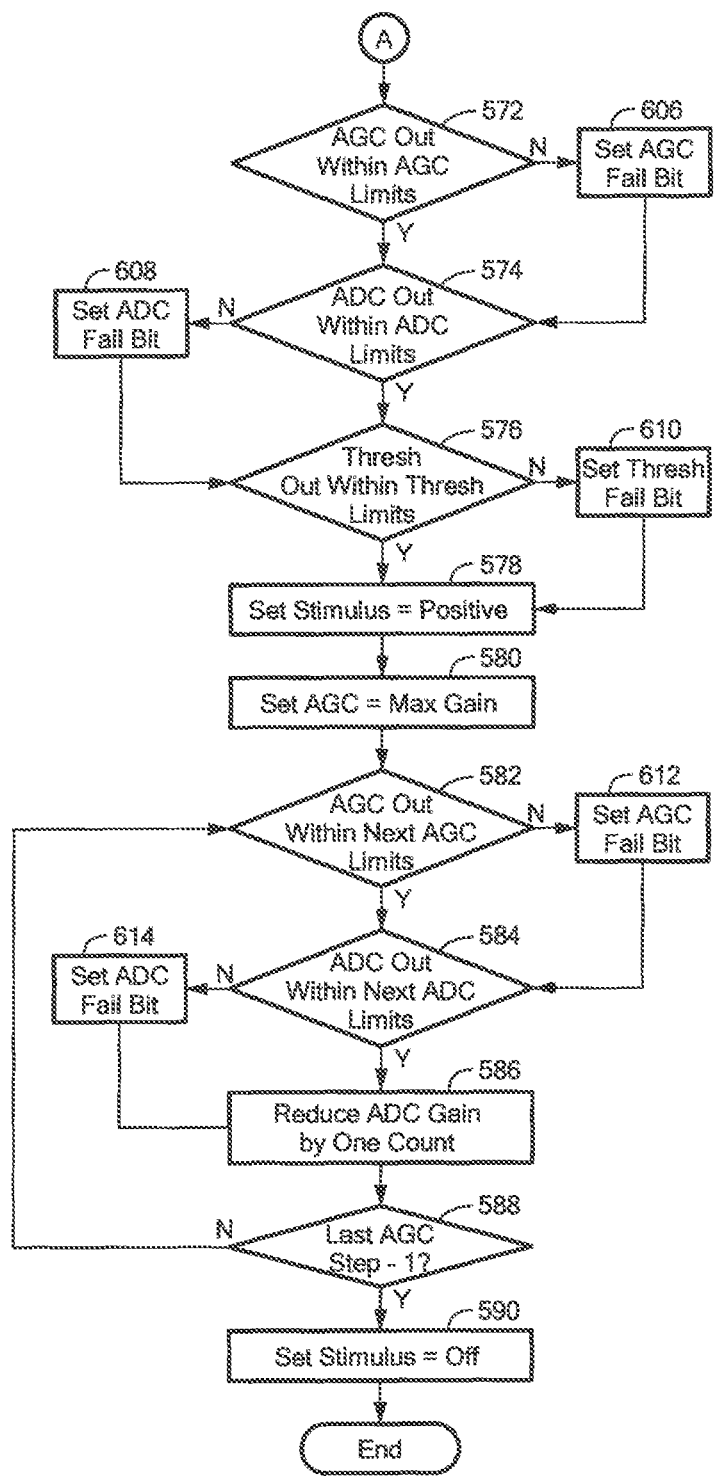

FIGS. 4-4D show particular examples of self-test modules and self-test methods that can be used in conjunction with the magnetic field sensor shown above in conjunction with FIG. 3. It should be recognized that other self-test modules and other self-test methods can be used and the other self-test modules and other self-test methods can be used in conjunction with other magnetic field sensors.

Referring now to FIG. 4, in which like elements of FIG. 3A are shown having like reference designations, an exemplary magnetic field sensor 300 can include the processing module 121 and the self-test module 136 of FIG. 3A. Here, the self-test module 136 is shown in greater detail.

The magnetic field sensor 300 can include a plurality of nodes or pins, here shown as five nodes or pins 300a-300e. However, it will be understood from the discussion below in conjunction with FIG. 4A, that fewer nodes or pins can be used, i.e., two or three nodes or pins.

The processing module 121 is coupled to receive the differential signal 122a, 122b generated by one or more magnetic field sensing elements, shown here as two Hall effect elements 340, 342. The two Hall Effect elements 340, 342 are coupled to receive a drive signal 338a generated by an element drive circuits 338. In some embodiments, the drive signal 338a is a DC current signal.

The two Hall effect elements 340, 342 can be coupled to a switching network 344, which can couple the two Hall effect elements 340, 342 into two different configurations referred to herein as a diagnostic mode configuration and a normal mode configuration. These two configurations are the same as or similar to configurations discussed in U.S. patent application Ser. No. 12/840,324, entitled "Circuits and Methods for Generating a Diagnostic Mode of Operation in a Magnetic Field Sensor," filed Jul. 21, 2010, assigned to the assignee of the present application, and incorporated by reference herein in its entirety. Let it suffice here to say that, when coupled in the diagnostic mode configuration, the two Hall Effect elements 340, 342 are coupled in opposition, and when coupled in the normal mode configuration, the two Hall Effect elements 340, 342 are coupled in reinforcement. Thus, when coupled in the diagnostic mode configuration, the two Hall Effect elements 340, 342 taken together are not responsive to an external magnetic field.

When the two Hall Effect elements 340, 342 are coupled in the diagnostic mode configuration, two drive coils (or conductors) can be driven with currents in opposite directions to generate a differential output signal 122a, 122b from the two Hall Effect elements. Alternatively, when the two Hall Effect elements 340, 342 are coupled in the diagnostic mode configuration or the normal mode configuration, a differential drive signal 322a, 322b can be directly applied to the two Hall elements 340, 342 to generate the differential signal 122a, 122b.

The two methods described above will be understood to generate the differential signal 122a, 122b as a synthetic signal used for self-test purposes. The two methods described above are referred to herein as a "stimulus."

The processing module 121 is configured to generate, and the self-test module 136 is configured to receive, a plurality of signals, one or more of which can be tested by the self-test module 136. In the exemplary magnetic field sensor 300, the processing module 121 is configured to generate the proximity signal 124a, the gain controlled signal 128a, a threshold signal 130b, and an analog-to-digital converter (ADC) signal 126b, one or more of which can be received by the self-test module 136. Each of these signals is described more fully below in conjunction with FIGS. 4B and 4C.

The self-test module 136 can include one or more of a built-in self-test (BIST) detector 302, a proper peak detector 304, a proper ADC detector 306, a proper AGC detector 308, a proper threshold detector 310, a proper drive signals detector 312, a proper current detector 314, or a proper voltage detector 316.

The BIST detector 302 can be configured to generate a BIST enable signal 392b, which can initiate a self-test of a variety of circuits within the magnetic field sensor 300, including, but not limited to, memory devices. The BIST detector 302 can be coupled to receive a BIST signal 350 indicative of the ongoing BIST test. The BIST detector can be configured to generate a BIST signal 302a indicative of a passing condition or a failing condition of the BIST test.

The proper peak detector 304 can be coupled to receive the proximity signal 124a, which is an analog signal. The proper peak detector 304 can be configured to convert the proximity signal 124a to a digital signal and to process the digitized proximity signal to identify peak values of the digitized proximity signal. The proper peak detector 304 can be configured to compare the peak values of the digitized proximity signal with one or more threshold values to identify if the peak values are in a proper range of magnitudes. The proper peak detector 304 can be configured to generate a signal 304a indicative of a passing condition or a failing condition of the test for proper peak magnitudes of the proximity signal 124a.

The proper ADC detector 306 can be coupled to receive the ADC signal 126b, which is a digital signal. The proper ADC detector 306 can be configured to compare the ADC signal 126b with one or more threshold values to identify if the ADC signal 126b is within a proper range of magnitudes. The proper ADC detector 306 can be configured to generate a signal 306a indicative of a passing condition or a failing condition of the tests for proper magnitudes of the ADC signal 126b.

The proper AGC detector 308 can be coupled to receive the gain controlled signal 128a, which is an analog signal. The proper AGC detector 308 can be configured to convert the gain controlled signal 128a to a digital signal and to process the digitized gain controlled signal to identify peak values of the digitized gain control signal. The proper AGC detector 308 can be configured to compare the peak values of the digitized gain controlled signal with one or more threshold values to identify if the peak values are in a proper range of magnitudes. The proper AGC detector 308 can be configured to generate a signal 308a indicative of a passing condition or a failing condition of the test for proper peak magnitudes of the gain controlled signal 128a.

The proper threshold detector 310 can be coupled to receive the threshold signal 130b, which is an analog signal. The proper threshold detector 310 can be configured to convert the threshold signal 130b to a digital signal and to process the digitized threshold signal. The proper threshold detector 310 can be configured to compare the digitized threshold signal with one or more threshold values to identify if the digitized threshold signal is within a proper range of values. The proper threshold detector 310 can be configured to generate a signal 310a indicative of a passing condition or a failing condition of the test for proper values of the threshold signal 130b.

The proper drive signals detector 312 can be coupled to receive a signal 338b, which can be an analog signal applied to the two Hall Effect elements 344, 346, and which can be representative of the drive signals 338a provided to the two Hall Effect elements 340, 342. The proper drive signals detector 312 can be configured to convert the signal 338b to a digital signal and to process the digitized signal. The proper drive signals detector 312 can be configured to compare the digitized signal 338b with one or more threshold values to identify if the signal 338b is within a proper range of values. The proper drive signals detector 312 can be configured to generate a signal 312a indicative of a passing condition or a failing condition of the test for proper values of the signal 338a.

The proper current detector 314 can be coupled to receive a power supply voltage 301, which is an analog voltage, and which is used to power the magnetic field sensor 300. The proper current detector 314 can be configured to generate an output signal 314b, which ultimately powers the magnetic field sensor 300. The proper current detector 314 can be configured to identify a magnitude of the current passing through the proper current detector 314. The proper current detector 314 can be configured to generate a signal 314a indicative of a passing condition or a failing condition of the test for proper values of the current that powers the magnetic field sensor 300.

The proper voltage detector 316 can be coupled to receive a regulated power supply voltage 328a, which is an analog voltage, and which is generated by a voltage regulator 328, which is coupled to receive the signal 314b from the proper current detector 314. The proper voltage detector 316 can be configured to convert the voltage signals 328a to a digital signal and to process the digitized signal. The proper voltage detector 316 can be configured to compare the digitized signal with one or more threshold values to identify if the digitized signal is within a proper range of values. The proper voltage detector 316 can configured to generate a signal 316a indicative of a passing condition or a failing condition of the test for proper values of the digitized voltage signal 328a.

The self-test module 136 can also include a sequence module 326. The sequence module 326 can be configured to generate a sequence signal 326a, which can control a sequence of the various self-tests represented by the various detector modules.

The self-test module 136 can also include one or more logic gates 320 coupled to receive one or more of the signals 302a, 304a, 306a, 308a, 310a, 312a, 314a, 316a. The one or more logic gates 320 can be configured to generate the signal 136a representative of a passing condition or a failing condition of the magnetic field sensor 300. As described above, in some embodiments the signal 136a is a two state binary signal, and, in other embodiments, the signal 136a is a multi-bit digital signal representative of passing conditions and failing conditions of specific ones of the self-test embodied by the various detectors within the self-test module 136.

The magnetic field sensor 300 can also include a power on sensing circuit 138 configured to generate a power on signal 138a indicative of a time period beginning at a power on of the magnetic field sensor 300. Using the power on signal 138a, the sequence module 326 can begin the sequence of self-tests upon power up of the magnetic field sensor 300 or at any predetermined time thereafter.

The self-test module 136 can include a coil driver circuit 324 coupled to receive the sequence signal 326a and configured to generate drive current signals 324a, 324b to the coils 346, 348 (or conductors).

The self-test module 136 can also include a simulated signal driver 322 coupled to receive the sequence signal 326a and configured to generate the drive signals 322a, 322b.

As described above, either the current signal 324a, 324b or the simulated signal 322a, 322b can be used as the stimulus required for some or all of the self-tests embodied in the various detectors of the self-test module 136. It will be particularly appreciated that the current signal stimulus 324a, 324b can test the entire magnetic field sensor 300 including the Hall Effect elements 340, 342.

Referring now to FIG. 4A, in which like elements of FIGS. 3A and 4 are shown having like reference designations, in some embodiments, a magnetic fields sensor 400 can include a digital format module 402 coupled to receive one or more of the sensed magnetic field signal 134a, the combined signal 140a, or the self-test signal 142a. The digital format module 402 can be configured to generate an output signal 402a representative of at least the passing condition or the failing condition represented by the self-test signal 142a, but which, in some embodiments, can also be representative of the sensed-magnetic-field signal 134a. The signal 402a can be provided in one of a variety of formats described more fully below.

The magnetic field sensor 400 can also include a voltage to current converter coupled to receive one or more of the combined signal 140a or the self-test signal 142a. The voltage to current converter 404 can be configured to impress a varying current upon a received power supply voltage signal 406, wherein the varying current is representative of at least the passing condition or the failing condition represented by the self-test signal 142, but which can also be representative of the sensed-magnetic-field signal 134a. The current portion of the signal 406 can be provided in one of a variety of formats described more fully below.

Referring now to FIG. 4B, a processing module 450 can be the same as or similar to the processing module 121 of FIG. 3A, but not including the amplifier 124 of FIG. 3A. The processing module 450 can include a TPOS detector 466 and a precision rotation detector 451, which can be the same as or similar to the TPOS detector 128 and the precision rotation detector 130 of FIG. 3A.

The electronic circuit 450 can include an automatic gain control 464, which can be the same as or similar to the automatic gain control 128 of FIG. 3A. The electronic circuit 450 can be coupled to receive a proximity signal 452, which can be the same as or similar to the proximity signal 124a of FIG. 3A. It should be understood that the proximity signal 452 is representative of the magnetic field experienced by one or more magnetic field sensors, for example, the magnetic field sensors 340, 342 of FIG. 4.

The TPOS detector 466 can be comprised of a comparator 468 coupled to receive the proximity signal 452 at a first input node and coupled to receive a predetermined threshold signal (i.e., voltage) 470 at a second input node. The TPOS detector 466 is configured to generate a TPOS output signal 468a, which can be the same as or similar to the TPOS output signal 126a of FIGS. 3A and 4.

The automatic gain control 464 is coupled to receive the proximity signal 452. In some embodiments, the proximity signal 452 has a DC offset correction applied by an automatic offset controller 454 and an offset digital-to-analog converter (DAC) 456 via a summing node 458. The AGC 464 is configured to generate a gain controlled signal 464aa, which can be the same as or similar to the gain controlled signal 128a of FIGS. 3A and 4.

The AGC 464 can be controlled by an AGC DAC 460.

The gain controlled signal 464a is provided as an input to a comparator 502. The comparator 502 is also coupled to receive a threshold signal 500. Generation of the threshold signal 500 is further described below.

The threshold signal 500 switches between two signals 500a, 500b, a first one 500a of which is a first predetermined percentage (e.g., sixty percent) of a peak-to-peak value of the gain controlled signal 464a and a second one 500b of which is a second predetermined percentage (e.g., forty percent) of the peak-to-peak value of the gain controlled signal 464a. The first and second threshold voltages 500a, 500b are, therefore, centered about a fifty percent point of the gain controlled signal 464a. The comparator 502 generates an output signal 502a having edges closely associated with the times when the gain controlled signal 464a crosses the two thresholds 500a, 500b, which times are near to times when the gain controlled signal 464a is near its fifty percent point. The output signal 502a can be the same as or similar to the high precision rotation detector output signal 130a of FIGS. 3A and 4.

The threshold voltages 500a, 500b within the threshold signal 500 are generated by counters 476, 478, logic circuits 474, 480, a PDAC 486, an NDAC 488, comparators 482, 484, a resistor ladder 490, and transmission gates 494, 496. The comparator 482 is coupled to receive the gain controlled signal 464a and an output signal 486a generated by the PDAC 486, and, by way of feedback provided by the logic circuit 474 and the counter 476, causes the output of the PDAC 486 (i.e., the PDAC voltage 486a) to track and hold positive peaks of the gain controlled signal 464a. Similarly, the comparator 484 is coupled to receive the gain controlled signal 464a and an output signal 488a generated by the NDAC 488, and, by way of feedback provided by the logic circuit 480 and the counter 478, causes the output of the NDAC 488 (i.e., the NDAC voltage 488a) to track and hold negative peaks of the gain controlled signal 464a. Therefore, the differential voltage between the output 486a of the PDAC 486 and the output 488a of the NDAC 488 is representative of a peak-to-peak amplitude of the gain controlled signal 464a.

Operation of the PDAC and NDAC is further described in U.S. Pat. No. 7,365,530, issued Apr. 29, 2008, which is assigned to the assignee of the present application, and which is incorporated by reference herein in its entirety.

The PDAC and NDAC voltages 486a, 488a, respectively, are provided to opposite ends of the resistor ladder 490. Transmission gates 494, 496 provide the threshold voltage 500 as one of two voltage values as described above, depending upon control voltages (not shown) applied to the transmission gates 494, 496. The control voltages can be related to the output signal 502a.

The electronic circuit 450 provides the proximity signal 452, the threshold signal 500, and the gain controlled signal 464a, which can be the same as or similar to the proximity signal 124a, the threshold signal 130b, and the gain controlled signal 128a of FIGS. 3A and 4. The ADC signal 126b is not generated by the electronic circuit 450. The ADC signal 126b is described below in conjunction with FIG. 4C.

Referring now to FIG. 4C, in which like elements of FIGS. 3A, 4 and 4B are shown having like reference designations an electronic circuit 520 can include a different TPOS detector 522. The TPOS detector 522 can include an analog-to-digital converter 524 coupled to receive the proximity signal 452 and configured to generate a digitized proximity signal 524a. A threshold generating circuit 526 can be configured to generate a digital threshold value 526a. A magnitude comparator 528 (i.e., a digital comparator) can be coupled to receive the digitized proximity signal 524a, coupled to receive the threshold value 526a, and configured to generate a TPOS detector output signal 528a.

The digitized proximity signal 524a can be provided to the self-test module 136 of FIG. 4 as the ADC signal 126b.

It should be appreciated that FIG. 4D show a flowchart corresponding to the below contemplated technique which would be implemented in magnetic field sensor (e.g., 300, FIG. 4). Rectangular elements (typified by element 552 in FIG. 4D), herein denoted "processing blocks," represent computer software instructions or groups of instructions. Diamond shaped elements (typified by element 554 in FIG. 4D), herein denoted "decision blocks," represent computer software instructions, or groups of instructions, which affect the execution of the computer software instructions represented by the processing blocks.

Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

Referring now to FIG. 4D, an exemplary process 550 is representative of a set of tests as may be generated by the self-test module 136 of FIG. 4, in a sequence as may be determined by the sequence module 326 of FIG. 4. The exemplary process 550 is merely an example. Any number of other modules can perform self-tests in any number of different sequences.

The process 550 begins at block 552 where a stimulus is set to off. As described above, referring briefly to FIG. 4, the stimulus can be one of two different types of stimuli. The stimulus can be generated by the coils 346, 348 of FIG. 4, or the stimulus can be provided by the differential drive signal 322a, 322b.

Returning to FIG. 4D, at block 554, it is determined whether peaks of the proximity signal, for example the proximity signal 124a of FIG. 4, are within predetermined limits. This determination can be made, for example, by the proper peak detector 304 of FIG. 4. If the peaks are within the predetermined limits, the process continues to block 556.

It will be understood that with the stimulus set to be off, in the presence of fluctuations of the magnetic field generated by movement of the gear 112 of FIG. 3, the proximity signal 124a should have peaks within the certain limits, and the magnitude of the peaks is representative of the air gap between the magnetic field sensing elements, e.g., 340, 342 of FIG. 4, and the teeth of the gear 112. However, it is also possible to use the test of block 554 when there are no fluctuations of the magnetic field, in which case, the peaks of the proximity signal 124a should be zero.

At block 556, it is determined whether peaks of the gain controlled signal, for example, the gain controlled signal 128a of FIG. 4, are within predetermined limits. This determination can be made, for example, by the proper AGC detector 308 of FIG. 4. If the peaks are within the predetermined limits, then the process continues to block 558.

At block 558, the stimulus is set to be on and to a positive DC value, which guarantees that the differential signal 122a, 122b of FIG. 4 has a positive DC component of a predetermined magnitude.

It will be understood that with the stimulus set to be on and a positive value, fluctuations of the magnetic field generated by movement of the gear 112 of FIG. 3 are not detected by the magnetic field sensor 300 of FIG. 3, and instead, the magnitude of the proximity signal 124a is positive and is related to either a magnitude of the differential drive signal 324a, 324b of FIG. 4 or to a magnitude of the differential drive signal 322a, 322b, depending upon which type of stimulus is selected.

At block 560, it is determined whether a DC magnitude of the proximity signal, for example the proximity signal 124a of FIG. 4, is within predetermined limits. This determination can be made, for example, by the proper peak detector 304 of FIG. 4. If the DC magnitude is within the predetermined limits, the process continues to block 564.

At block 562, it is determined whether a DC magnitude of the gain controlled signal, for example, the gain controlled signal 128a of FIG. 4, is within predetermined limits. This determination can be made, for example, by the proper AGC detector 308 of FIG. 4. If the DC magnitude is within the predetermined limits, then the process continues to block 564.

At block 564, it is determined whether a DC magnitude of the ADC signal, for example, the ADC signal 126b of FIG. 4, is within predetermined limits. This determination can be made, for example, by the proper ADC detector 306 of FIG. 4. If the DC magnitude is within the predetermined limits, then the process continues to block 566.

At block 566, it is determined whether a DC magnitude of the threshold signal, for example, the threshold signal 130b of FIG. 4, is within predetermined limits. This determination can be made, for example, by the proper threshold detector 310 of FIG. 4. If the DC magnitude is within the predetermined limits, then the process continues to block 568.

At block 568, the stimulus is turned on and to a negative value, which guarantees that the differential signal 122a, 122b of FIG. 4 has a negative DC component of a predetermined magnitude.

At block 570, it is determined whether a DC magnitude of the proximity signal, for example the proximity signal 124a of FIG. 4, is within predetermined limits. This determination can be made, for example, by the proper peak detector 304 of FIG. 4. If the DC magnitude is within the predetermined limits, the process continues to block 570.

At block 572, it is determined whether a DC magnitude of the gain controlled signal, for example, the gain controlled signal 128a of FIG. 4, is within predetermined limits. This determination can be made, for example, by the proper AGC detector 308 of FIG. 4. If the DC magnitude is within the predetermined limits, then the process continues to block 572.

At block 574, it is determined whether a DC magnitude of the ADC signal, for example, the ADC signal 126b of FIG. 4, is within predetermined limits. This determination can be made, for example, by the proper ADC detector 306 of FIG. 4. If the DC magnitude is within the predetermined limits, then the process continues to block 566.

At block 576, it is determined whether a DC magnitude of the threshold signal, for example, the threshold signal 130b of FIG. 4, is within predetermined limits. This determination can be made, for example, by the proper threshold detector 310 of FIG. 4. If the DC magnitude is within the predetermined limits, then the process continues to block 578.

At block 578, the stimulus is turned on and to a positive value, which guarantees that the differential signal 122a, 122b of FIG. 4 has a positive DC component of a predetermined magnitude.

At block 580, the AGC, for example, the AGC 128 of FIG. 4, is set to have a maximum gain, for example, by way of the AGC DAC 460 of FIG. 4B.

At block 582, it is determined whether a DC magnitude of the gain controlled signal, for example, the gain controlled signal 128a of FIG. 4, is within predetermined limits. This determination can be made, for example, by the proper AGC detector 308 of FIG. 4. If the DC magnitude is within the predetermined limits, then the process continues to block 584.

At block 584, it is determined whether a DC magnitude of the ADC signal, for example, the ADC signal 126b of FIG. 4, is within predetermined limits. This determination can be made, for example, by the proper ADC detector 306 of FIG. 4. If the DC magnitude is within the predetermined limits, then the process continues to block 586.

At block 586, the gain of the AGC can be reduced by one digital count.

At block 588, if the AGC gain is at the last step minus one step, the process continues to block 590, where the stimulus is set to off and the process ends.

At block 588, if the AGC gain is not set to the last step minus one step, the process returns to block 582. In this way the process loops and tests all of the AGC gain steps.

If at blocks 554, 556, 560, 562, 564, 566, 570, 572, 574, 576, 582, 584, the tests of magnitudes do not pass then fail bits are set at blocks 592, 594, 596, 598, 600, 602, 604, 606, 608, 610, 612, 614, respectively. The fail bits can be within the signals 302a-316a of FIG. 4.

While magnetic field sensors described above in conjunction with FIGS. 4, 4B, 4C and the method described above in conjunction with FIG. 4D are shown to include respective automatic gain control circuits (AGCs) or steps, in other embodiments, the AGCs can be replaced by a fixed gain amplifiers or buffers. In such embodiments that have only the fixed gain amplifier or the buffer, the proper AGC detector 308 of FIG. 4. can either be omitted, or it can be replaced by a proper amplifier detector configured to test the gain through the fixed gain amplifier or the buffer.

A variety of signal formats representative of passing and failing conditions are shown below. While certain signals are described to be representative of the passing condition and other signals are described to be representative of the failing condition, in other embodiments, the signal representations can be reversed.

Figure 5:
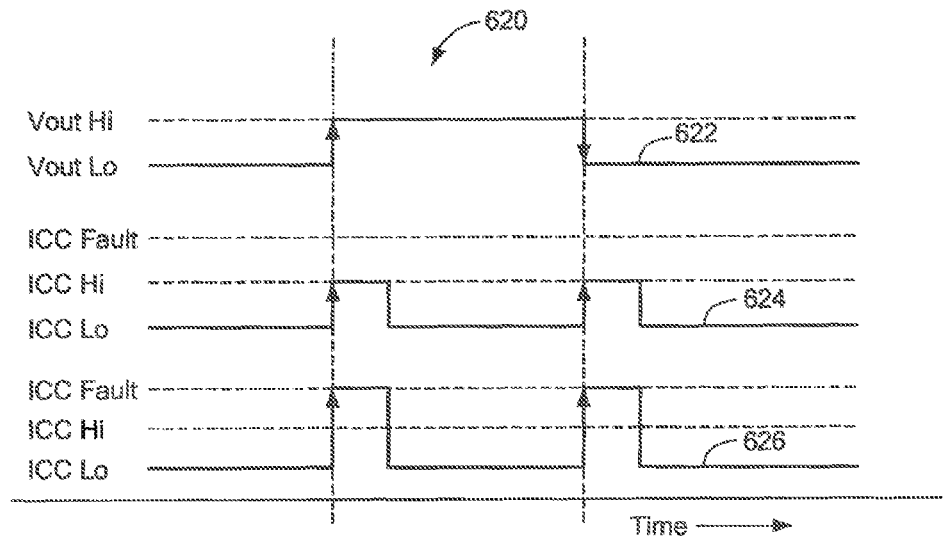
FIGS. 5-5B are graphs showing output signals having exemplary formats that can be used by the magnetic field sensors of FIGS. 3-3E, 4, and 4A to indicate passing conditions and failing conditions of the magnetic field sensors.

Referring now to FIG. 5, a graph 620 has a horizontal axis with a scale in units of time in arbitrary units and vertical axes with scales in units of electrical current in arbitrary units and electrical voltage in arbitrary units. A signal 622 is representative of the sensed magnetic field signal 134a of FIG. 4, i.e., a voltage signal. As will be understood, the sensed magnetic field signal 622 has transitions, here represented by dark arrows, each transition representative of an edge of a passing gear tooth, for example, a passing gear tooth of the gear 112 of FIG. 3. Only one pulse is shown, however, there can be a plurality of pulses corresponding to a plurality of passing gear teeth.

A signal 624 is representative of a current signal indicative of a passing condition of the magnetic field sensor, for example, the magnetic field sensor 300 of FIG. 4. The current signal 624 achieves a maximum current, ICC Hi. It will be apparent that the edges of the signal 622 can be identified in the signal 624, where dark arrows are also shown.

A signal 626 is representative of the current signal indicative of a failing condition of the magnetic field sensor, for example, the magnetic field sensor 300 of FIG. 4. The current signal 626 achieves a maximum current, ICC Fault, which is higher than the current ICC Hi. It will be apparent that the edges of the signal 622 can be identified in the signal 626, where dark arrows are also shown.

It should be understood that the signals 624, 626 are the same signal but when representative of different self-test conditions.

It should be appreciated that the signal 624, 626 can convey both positions of the edges in the signal 622 and also convey passing or failing self-test information. Thus, referring briefly to FIG. 4A, where the signal 624, 626 provides the current portion of the signal 406, the magnetic field sensor 400 of FIG. 4A can have as few as two nodes or pins.

Figure 5A:
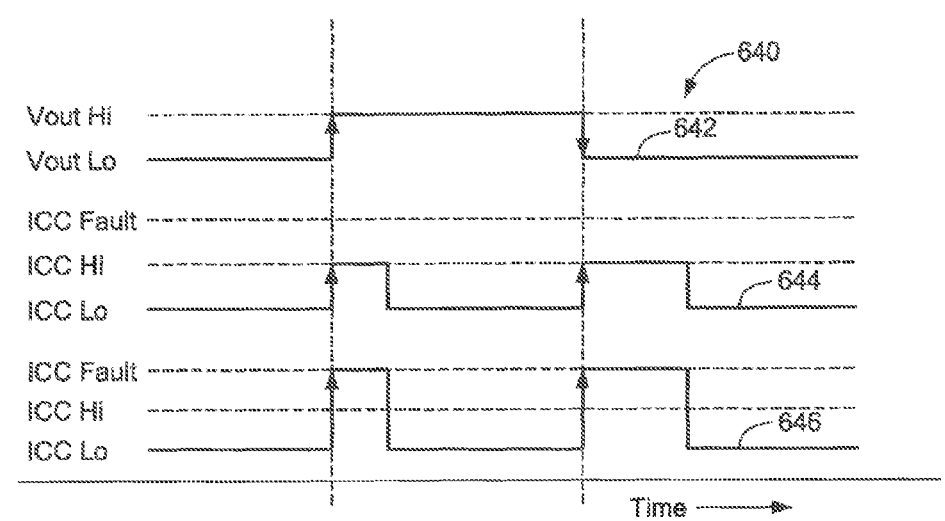

Referring now to FIG. 5A, a graph 640 has a horizontal axis with a scale in units of time in arbitrary units and a vertical axes with scales in units of electrical current in arbitrary units and electrical voltage in arbitrary units. A signal 642 is the same as or similar to the signal 622 of FIG. 5, and is a voltage signal representative of the sensed magnetic field signal 134a of FIG. 4. As will be understood, the sensed magnetic field signal 642 has transitions, here represented by dark arrows, each transition representative of an edge of a passing gear tooth, for example, a passing gear tooth of the gear 112 of FIG. 3. Only one pulse is shown, however, there can be a plurality of pulses corresponding to a plurality of passing gear teeth.

A signal 644 is a current signal representative of a passing condition of the magnetic field sensor, for example, the magnetic field sensor 300 of FIG. 4. The current signal 624 achieves a maximum current, ICC Hi, and also has pulses with first and second different time periods with edges indicative of positions of rising or falling edges of the signal 642, respectively. It will be apparent that the edges of the signal 642 can be identified in the signal 644, where dark arrows are also shown.

A signal 646 is a current signal representative of a failing condition of the magnetic field sensor, for example, the magnetic field sensor 300 of FIG. 4. The current signal 646 achieves a maximum current, ICC Fault, which is higher than the current ICC Hi and also has pulses with the first and second different time periods with edges indicative of positions of rising or falling edges of the signal 642, respectively.

It will be apparent that the edges of the signal 642 can be identified in the signal 646, where dark arrows are also shown.

It should be understood that the signals 644, 646 are the same signal but when representative of different self-test conditions.

It should be appreciated that the signal 644, 646 can convey both positions of the edges in the signal 642 and also convey passing or failing self-test information. The positions of rising and falling edges of the signal 642 can be more easily identified in the signal 644, 646 (by way of the different pulse widths) then they can be identified in the signal 624, 626 of FIG. 5. Referring briefly to FIG. 4A, where the signal 624, 626 provide the current portion of the signal 406, the magnetic field sensor 400 of FIG. 4A can have as few as two nodes or pins.

Figure 5B:
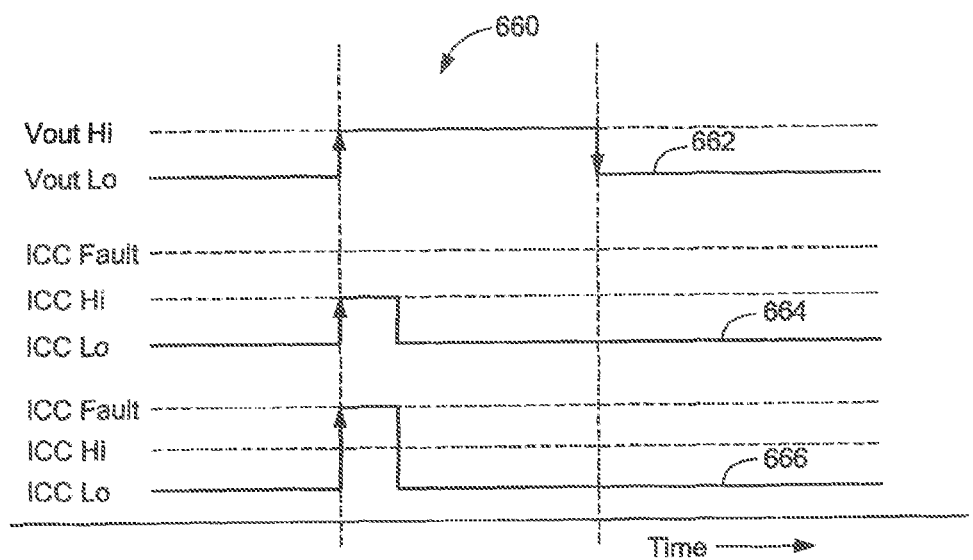

Referring now to FIG. 5B, a graph 660 has a horizontal axis with a scale in units of time in arbitrary units and a vertical axes with scales in units of electrical current in arbitrary units and electrical voltage in arbitrary units. A signal 662 is the same as or similar to the signals 622, 642 of FIGS. 5 and 5A, and is a voltage signal representative of the sensed magnetic field signal 134a of FIG. 4. As will be understood, the sensed magnetic field signal 662 has transitions, here represented by dark arrows, each transition representative of an edge of a passing gear tooth, for example, a passing gear tooth of the gear 112 of FIG. 3. Only one pulse is shown, however, there can be a plurality of pulses corresponding to a plurality of passing gear teeth.

A signal 664 is a current signal representative of a passing condition of the magnetic field sensor, for example, the magnetic field sensor 300 of FIG. 4. The current signal 664 achieves a maximum current, ICC Hi. It will be apparent that only one of the edges of the signal 662 can be identified in the signal 664, were a dark arrow is also shown.

A signal 666 is a current signal representative of a failing condition of the magnetic field sensor, for example, the magnetic field sensor 300 of FIG. 4. The current signal 666 achieves a maximum current, ICC Fault, which is higher than the current ICC Hi. It will be apparent that only one of the edges of the signal 662 can be identified in the signal 666, were a dark arrow is also shown.

It should be understood that the signals 664, 666 are the same signal but when representative of different self-test conditions.

It should be appreciated that the signal 664, 666 can convey only passing or failing self-test information. Thus, referring briefly to FIG. 4A, where the signals 664, 666 provide the current portion of the signal 406, the magnetic field sensor 400 of FIG. 4A can also provide the sensed magnetic field signal 134a (or the combined signal 140a) as the signal 402a. Where the signals 664, 666 are provided as a part of the signal 406 and the combined signal 140a is provided as a signal 402a, it will be recognized that redundant information is provided about edges of the sensed magnetic field signal 134a. Though redundant, the redundancy may be advantageous to provide a more robust magnetic field sensor 400.

Current signals described below can provide similar redundancy, even where not stated.

Figure 6:
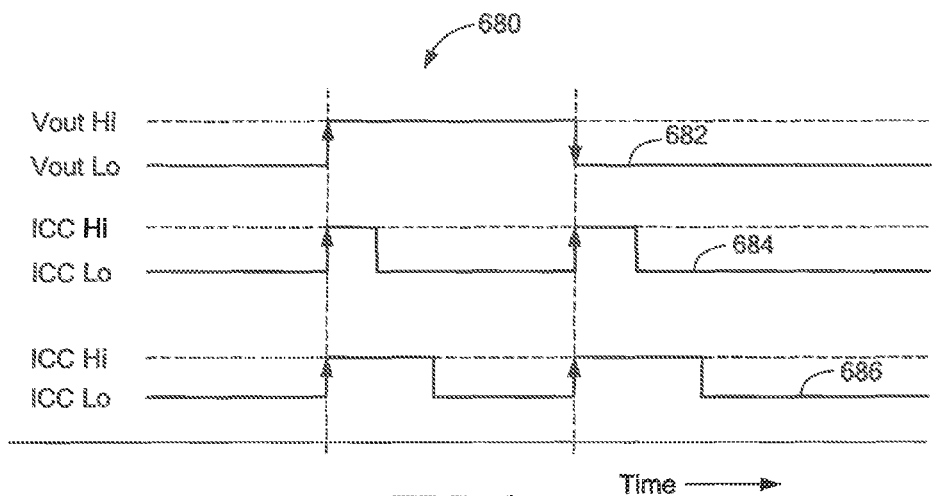
FIGS. 6-6B are graphs showing output signals having other exemplary formats that can be used by the magnetic field sensors of FIGS. 3-3E, 4, and 4A to indicate passing conditions and failing conditions of the magnetic field sensors.

Referring now to FIG. 6, a graph 680 has a horizontal axis with a scale in units of time in arbitrary units and vertical axes with scales in units of electrical current in arbitrary units and electrical voltage in arbitrary units. A signal 682 is the same as or similar to the signals 622, 642, 662 of FIGS. 5, 5A, and 5B, and is a voltage signal representative of the sensed magnetic field signal 134a of FIG. 4. As will be understood, the sensed magnetic field signal 682 has transitions, here represented by dark arrows, each transition representative of an edge of a passing gear tooth, for example, a passing gear tooth of the gear 112 of FIG. 3. Only one pulse is shown, however, there can be a plurality of pulses corresponding to a plurality of passing gear teeth.

A signal 684 is a current signal representative of a passing condition of the magnetic field sensor, for example, the magnetic field sensor 300 of FIG. 4. The current signal 624 achieves a maximum current, ICC Hi, and first pulse durations. It will be apparent that the edges of the signal 682 can be identified in the signal 684, where dark arrows are also shown.

A signal 686 is a current signal representative of a failing condition of the magnetic field sensor, for example, the magnetic field sensor 300 of FIG. 4. The current signal 686 achieves the maximum current, ICC Hi, and second different pulse durations. In some embodiments, the first and second different pulse durations can be related by a factor of two in duration. It will be apparent that the edges of the signal 682 can be identified in the signal 686, where dark arrows are also shown.

It should be understood that the signals 684, 686 are the same signal but when representative of different self-test conditions.

It should be appreciated that the signal 684, 686 can convey both positions of the edges in the signal 682 and also convey passing or failing self-test information. Thus, referring briefly to FIG. 4A, where the signals 684, 686 provide the current portion of the signal 406, the magnetic field sensor 400 of FIG. 4A can have as few as two nodes or pins.

Figure 6A:
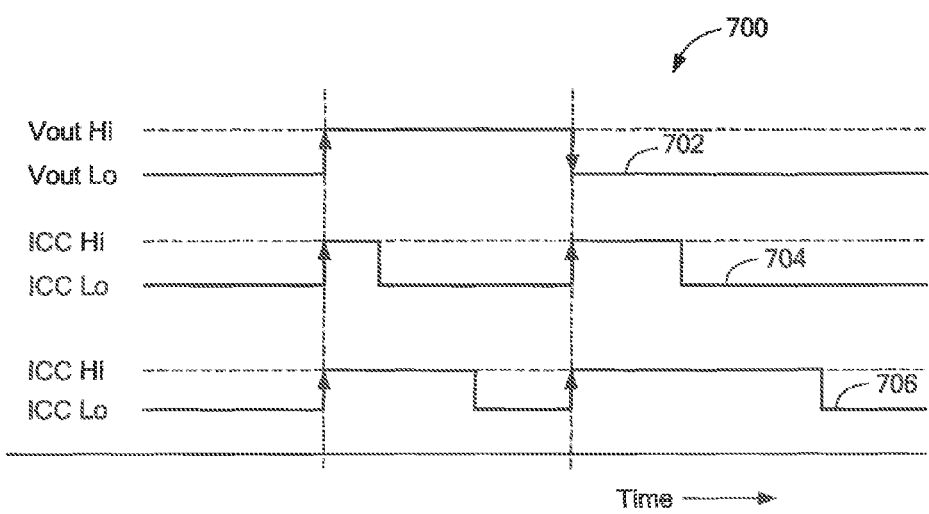

Referring now to FIG. 6A, a graph 700 has a horizontal axis with a scale in units of time in arbitrary units and a vertical axes with scales in units of electrical current in arbitrary units and electrical voltage in arbitrary units. A signal 702 is the same as or similar to the signals 622, 642, 662, 682 of FIGS. 5, 5A, 5B, and 6, and is a voltage signal representative of the sensed magnetic field signal 134a of FIG. 4. As will be understood, the sensed magnetic field signal 702 has transitions, here represented by dark arrows, each transition representative of an edge of a passing gear tooth, for example, a passing gear tooth of the gear 112 of FIG. 3. Only one pulse is shown, however, there can be a plurality of pulses corresponding to a plurality of passing gear teeth.

A signal 704 is a current signal representative of a passing condition of the magnetic field sensor, for example, the magnetic field sensor 300 of FIG. 4. The current signal 704 achieves a maximum current, ICC Hi, and also has pulses with first and second different time periods with edges indicative of positions of rising or falling edges of the signal 702, respectively. It will be apparent that the edges of the signal 702 can be identified in the signal 704, where dark arrows are also shown.

A signal 706 is a current signal representative of a failing condition of the magnetic field sensor, for example, the magnetic field sensor 300 of FIG. 4. The current signal 706 achieves the maximum current, ICC Hi, and also has pulses with the third different and fourth different time periods with edges indicative of positions of rising or falling edges of the signal 702, respectively. In some embodiments, the first, second, third, and fourth different pulse widths can be related by respective factors of two in duration. It will be apparent that the edges of the signal 702 can be identified in the signal 706, where dark arrows are also shown.

It should be understood that the signals 704, 706 are the same signal but when representative of different self-test conditions.

It should be appreciated that the signal 704, 706 can convey both positions of the edges in the signal 702 and also convey passing or failing self-test information. The positions of rising and falling edges of the signal 702 can be more easily identified in the signals 704, 706 (by way of the different pulse widths) then they can be identified in the signals 684, 686 of FIG. 6. Referring briefly to FIG. 4A, where the signals 704, 706 provide the current portion of the signal 406, the magnetic field sensor 400 of FIG. 4A can have as few as two nodes or pins.

Figure 6B:
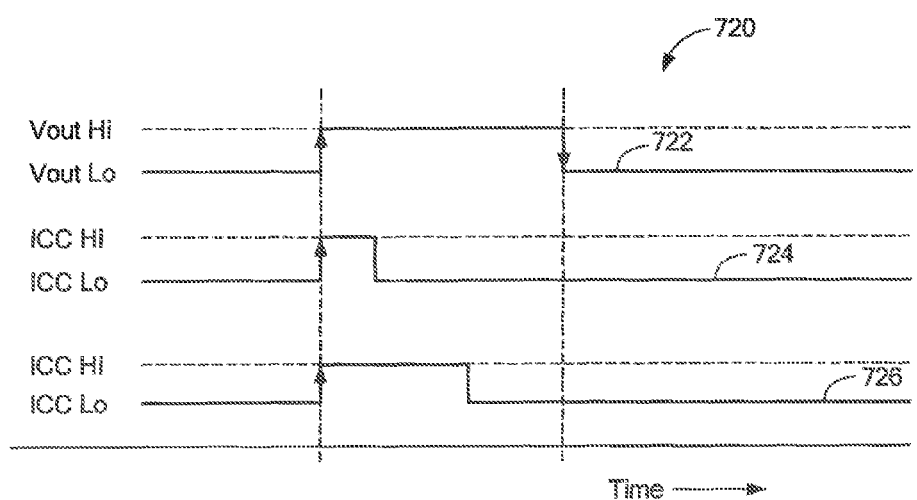

Referring now to FIG. 6B, a graph 720 has a horizontal axis with a scale in units of time in arbitrary units and a vertical axes with scales in units of electrical current in arbitrary units and electrical voltage in arbitrary units. A signal 722 is the same as or similar to the signals 622, 642, 662, 682, 702 of FIGS. 5, 5A, 5B, 6, and 6A, and is a voltage signal representative of the sensed magnetic field signal 134a of FIG. 4. As will be understood, the sensed magnetic field signal 722 has transitions, here represented by dark arrows, each transition representative of an edge of a passing gear tooth, for example, a passing gear tooth of the gear 112 of FIG. 3. Only one pulse is shown, however, there can be a plurality of pulses corresponding to a plurality of passing gear teeth.

A signal 724 is a current signal representative of a passing condition of the magnetic field sensor, for example, the magnetic field sensor 300 of FIG. 4. The current signal 724 achieves a maximum current, ICC Hi, and has a first pulse width. It will be apparent that only one of the edges of the signal 722 can be identified in the signal 724, where dark arrows are also shown.

A signal 726 is a current signal representative a failing condition of the magnetic field sensor, for example, the magnetic field sensor 300 of FIG. 4. The current signal 726 achieves a maximum current, ICC Hi, and a second different pulse width, e.g., two times the pulse width of the signal 724. It will be apparent that only one of the edges of the signal 722 can be identified in the signal 726, where dark arrows are also shown.

It should be understood that the signals 724, 726 are the same signal but when representative of different self-test conditions.

It should be appreciated that the signal 724, 726 can convey only passing or failing self-test information. Thus, referring briefly to FIG. 4A, where the signals 724, 726 provide the current portion of the signal 406, the magnetic field sensor 400 of FIG. 4A can also provide the sensed magnetic field signal 134a (or the combined signal 140a) as the signal 402a.

Figure 7:
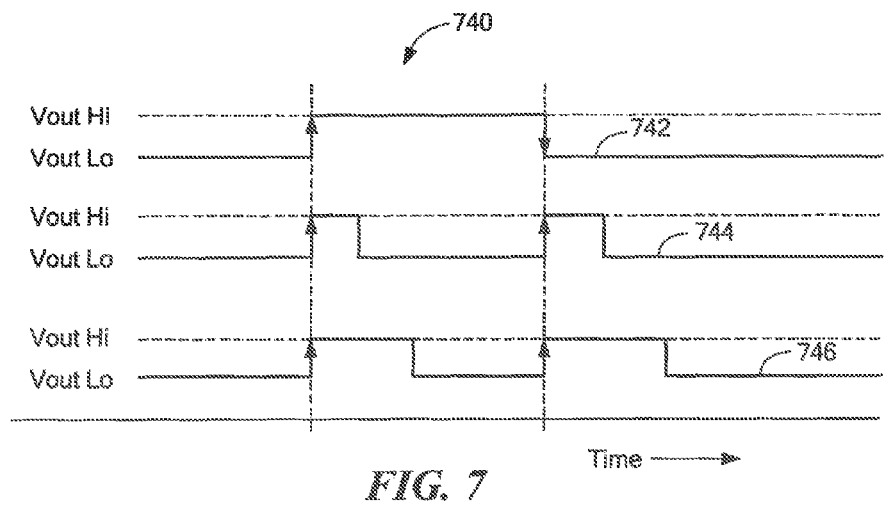
FIGS. 7-7A are graphs showing output signals having other exemplary formats that can be used by the magnetic field sensors of FIGS. 3-3E, 4, and 4A to indicate passing conditions and failing conditions of the magnetic field sensors.

Referring now to FIG. 7, a graph 740 has a horizontal axis with a scale in units of time in arbitrary units and vertical axes with scales in units of electrical voltage in arbitrary units. A signal 742 is the same as or similar to the signals 622, 642, 662, 682, 702, 722 of FIGS. 5, 5A, 5B, 6, 6A, and 6B, and is a voltage signal representative of the sensed magnetic field signal 134a of FIG. 4. As will be understood, the sensed magnetic field signal 742 has transitions, here represented by dark arrows, each transition representative of an edge of a passing gear tooth, for example, a passing gear tooth of the gear 112 of FIG. 3. Only one pulse is shown, however, there can be a plurality of pulses corresponding to a plurality of passing gear teeth.

A signal 744 is a voltage signal representative of a passing condition of the magnetic field sensor, for example, the magnetic field sensor 300 of FIG. 4. The voltage signal 744 achieves a maximum voltage, Vout Hi, and first pulse durations. It will be apparent that the edges of the signal 742 can be identified in the signal 744, where dark arrows are also shown.

A signal 746 is a voltage signal representative of a failing condition of the magnetic field sensor, for example, the magnetic field sensor 300 of FIG. 4. The voltage signal 746 achieves the maximum voltage, Vout Hi, and second different pulse durations. In some embodiments, the first and second different pulse durations can be related by a factor of two in duration. It will be apparent that the edges of the signal 742 can be identified in the signal 746, where dark arrows are also shown.

It should be understood that the signals 744, 746 are the same signal but when representative of different self-test conditions.

It should be appreciated that the signal 744, 746 can convey both positions of the edges in the signal 742 and also convey passing or failing self-test information. Thus, referring briefly to FIG. 4A, the signal 744, 746 can provide the voltage output signal 402a as the combined signal 140a, in which case, at least three nodes or pins are required in the magnetic field sensor 400.

Figure 7A:
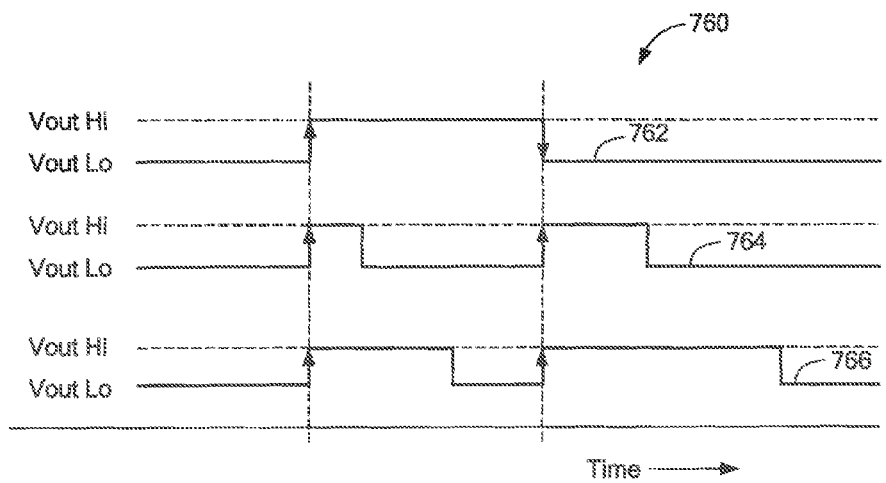

Referring now to FIG. 7A, a graph 760 has a horizontal axis with a scale in units of time in arbitrary units and a vertical axes with scales in units of electrical current in arbitrary units and electrical voltage in arbitrary units. A signal 762 is the same as or similar to the signals 622, 642, 662, 682, 702, 722, 742 of FIGS. 5, 5A, 5B, 6, 6A, 6B, and 7, and is a voltage signal representative of the sensed magnetic field signal 134a of FIG. 4. As will be understood, the sensed magnetic field signal 762 has transitions, here represented by dark arrows, each transition representative of an edge of a passing gear tooth, for example, a passing gear tooth of the gear 112 of FIG. 3. Only one pulse is shown, however, there can be a plurality of pulses corresponding to a plurality of passing gear teeth.

A signal 764 is a voltage signal representative of voltage signal indicative of a passing condition of the magnetic field sensor, for example, the magnetic field sensor 300 of FIG. 4. The voltage signal 764 achieves a maximum voltage, Vout Hi, and also has pulses with first and second different time periods with edges indicative of positions of rising or falling edges of the signal 762, respectively. It will be apparent that the edges of the signal 762 can be identified in the signal 764, where dark arrows are also shown.

A signal 766 is a voltage signal representative of a failing condition of the magnetic field sensor, for example, the magnetic field sensor 300 of FIG. 4. The voltage signal 766 achieves the maximum voltage, Vout Hi, and also has pulses with the third different and fourth different time periods with edges indicative of positions of rising or falling edges of the signal 762, respectively. In some embodiments, the first, second, third, and fourth different pulse widths can be related by respective factors of two in duration. It will be apparent that the edges of the signal 762 can be identified in the signal 766, where dark arrows are also shown.

It should be understood that the signals 764, 766 are the same signal but when representative of different self-test conditions.

It should be appreciated that the signal 764, 766 can convey both positions of the edges in the signal 762 and also convey passing or failing self-test information. The positions of rising and falling edges of the signal 762 can be more easily identified in the signal 764, 766 (by way of the different pulse widths) then they can be identified in the signal 744, 746 of FIG. 7. Thus, referring briefly to FIG. 4A, the signal 764, 766 can provide the voltage output signal 402a as the combined signal 140a, in which case, at least three nodes or pins are required in the magnetic field sensor 400.

Figure 8:
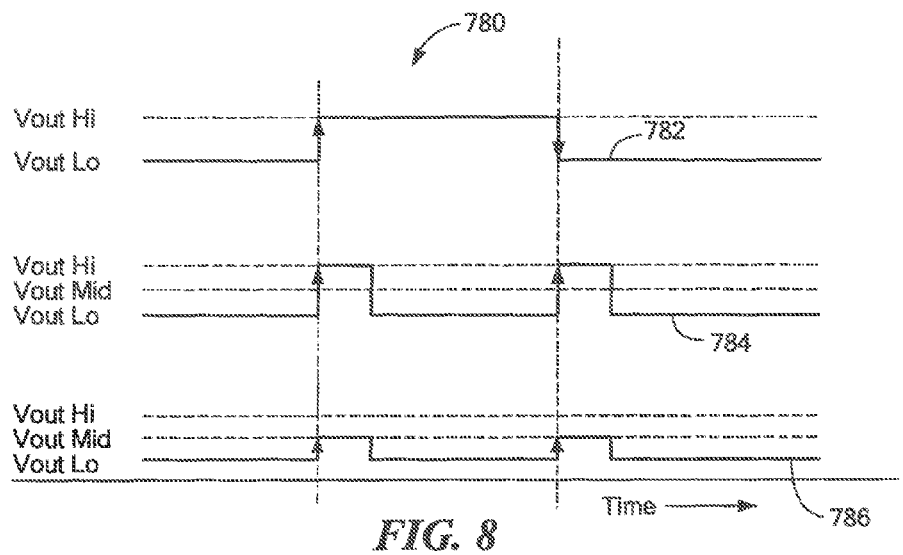
FIGS. 8-8A are graphs showing output signals having other exemplary formats that can be used by the magnetic field sensors of FIGS. 3-3E, 4, and 4A to indicate passing conditions and failing conditions of the magnetic field sensors.

Referring now to FIG. 8, a graph 780 has a horizontal axis with a scale in units of time in arbitrary units and vertical axes with scales in units of electrical voltage in arbitrary units. A signal 782 is the same as or similar to the signals 622, 642, 662, 682, 702, 722, 742, 762 of FIGS. 5, 5A, 5B, 6, 6A, 6B, 7, and 7A, and is a voltage signal representative of the sensed magnetic field signal 134a of FIG. 4. As will be understood, the sensed magnetic field signal 782 has transitions, here represented by dark arrows, each transition representative of an edge of a passing gear tooth, for example, a passing gear tooth of the gear 112 of FIG. 3. Only one pulse is shown, however, there can be a plurality of pulses corresponding to a plurality of passing gear teeth.

A signal 784 is a voltage signal representative of a passing condition of the magnetic field sensor, for example, the magnetic field sensor 300 of FIG. 4. The voltage signal 784 achieves a maximum voltage, Vout Hi, and has first pulse durations. It will be apparent that the edges of the signal 782 can be identified in the signal 784, where dark arrows are also shown.

A signal 786 is a voltage signal representative of a failing condition of the magnetic field sensor, for example, the magnetic field sensor 300 of FIG. 4. The voltage signal 786 achieves the maximum voltage, Vout Mid, and the same first pulse durations. In some embodiments, the voltages, Vout Hi and Vout Mid, can be related by a factor of two in value. It will be apparent that the edges of the signal 782 can be identified in the signal 786, where dark arrows are also shown.

It should be understood that the signals 784, 786 are the same signal but when representative of different self-test conditions.

It should be appreciated that the signal 784, 786 can convey both positions of the edges in the signal 742 and also convey passing or failing self-test information. Thus, referring briefly to FIG. 4A, the signals 784, 786 can provide the voltage output signal 402a as the combined signal 140a, in which case, at least three nodes or pins are required in the magnetic field sensor 400.

Figure 8A:
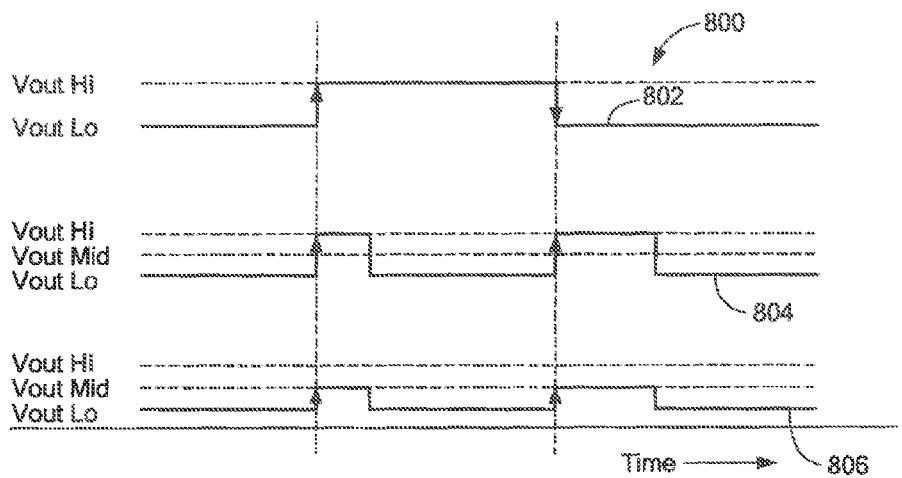

Referring now to FIG. 8A, a graph 800 has a horizontal axis with a scale in units of time in arbitrary units and a vertical axes with scales in units of electrical current in arbitrary units and electrical voltage in arbitrary units. A signal 802 is the same as or similar to the signals 622, 642, 662, 682, 702, 722, 742, 762, 782 of FIGS. 5, 5A, 5B, 6, 6A, 6B, 7, 7A, and 8, and is a voltage signal representative of the sensed magnetic field signal 134a of FIG. 4. As will be understood, the sensed magnetic field signal 802 has transitions, here represented by dark arrows, each transition representative of an edge of a passing gear tooth, for example, a passing gear tooth of the gear 112 of FIG. 3. Only one pulse is shown, however, there can be a plurality of pulses corresponding to a plurality of passing gear teeth.

A signal 804 is a voltage signal representative of a passing condition of the magnetic field sensor, for example, the magnetic field sensor 300 of FIG. 4. The voltage signal 804 achieves a maximum voltage, Vout Hi, and also has pulses with first and second different time periods with edges indicative of positions of rising or falling edges of the signal 802, respectively. It will be apparent that the edges of the signal 802 can be identified in the signal 804, where dark arrows are also shown.

A signal 806 is a voltage signal representative of a failing condition of the magnetic field sensor, for example, the magnetic field sensor 300 of FIG. 4. The voltage signal 806 achieves a maximum voltage, Vout Mid, and also has pulses with the first and second different time periods with edges indicative of positions of rising or falling edges of the signal 802, respectively. In some embodiments, the first and second different pulse widths can be related by a factor of two in duration. It will be apparent that the edges of the signal 802 can be identified in the signal 806, where dark arrows are also shown.

It should be understood that the signals 804, 806 are the same signal but when representative of different self-test conditions.

It should be appreciated that the signal 804, 806 can convey both positions of the edges in the signal 802 and also convey passing or failing self-test information. The positions of rising and falling edges of the signal 802 can be more easily identified in the signal 804, 806 (by way of the different pulse widths) then they can be identified in the signals 784, 786 of FIG. 8. Thus, referring briefly to FIG. 4A, the signal 804, 806 can provide the voltage output signal 402*a* as the combined signal 140*a*, in which case, at least three nodes or pins are required in the magnetic field sensor 400.

Figure 9:
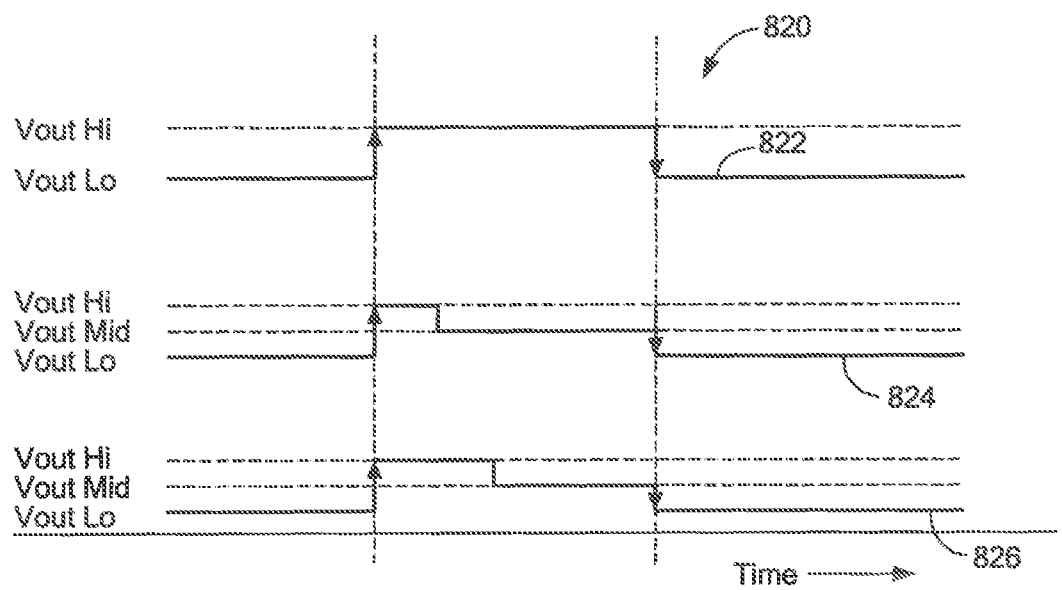
FIG. 9 is a graph showing output signals having other exemplary formats that can be used by the magnetic field sensors of FIGS. 3-3E, 4, and 4A to indicate passing conditions and failing conditions of the magnetic field sensors.

Referring now to FIG. 9, a graph 820 has a horizontal axis with a scale in units of time in arbitrary units and vertical axes with scales in units of electrical voltage in arbitrary units. A signal 822 is the same as or similar to the signals 622, 642, 662, 682, 702, 722, 742, 762, 782, 802 of FIGS. 5, 5A, 5B, 6, 6A, 6B, 7, 7A, 8, and 8A, and is a voltage signal representative of the sensed magnetic field signal 134*a* of FIG. 4. As will be understood, the sensed magnetic field signal 822 has transitions, here represented by dark arrows, each transition representative of an edge of a passing gear tooth, for example, a passing gear tooth of the gear 112 of FIG. 3. Only one pulse is shown, however, there can be a plurality of pulses corresponding to a plurality of passing gear teeth.

A signal 824 is a voltage signal representative of a passing condition of the magnetic field sensor, for example, the magnetic field sensor 300 of FIG. 4. The voltage signal 824 achieves a maximum voltage, Vout Hi, for a first time period and a voltage, Vout Mid, for another period of time. It will be apparent that the edges of the signal 822 can be identified in the signal 824, where dark arrows are also shown.

A signal 826 is a voltage signal representative of a failing condition of the magnetic field sensor, for example, the magnetic field sensor 300 of FIG. 4. The voltage signal 826 achieves the maximum voltage, Vout Hi, for a second different time period and the voltage, Vout Mid, for another period of time. In some embodiments, the voltages, Vout Hi and Vout Mid, can be related by a factor of two in value. It will be apparent that the edges of the signal 822 can be identified in the signal 826, where dark arrows are also shown.

It should be understood that the signals 824, 826 are the same signal but when representative of different self-test conditions.

It should be appreciated that the signal 824, 826 can convey both positions of the edges in the signal 822 and also convey passing or failing self-test information (by way of the two different time durations at the voltage, Vout Hi). Thus, referring briefly to FIG. 4A, the signal 824, 826 can provide the voltage output signal 402*a* as the combined signal 140*a*, in which case, at least three nodes or pins are required in the magnetic field sensor 400.

Figure 10:
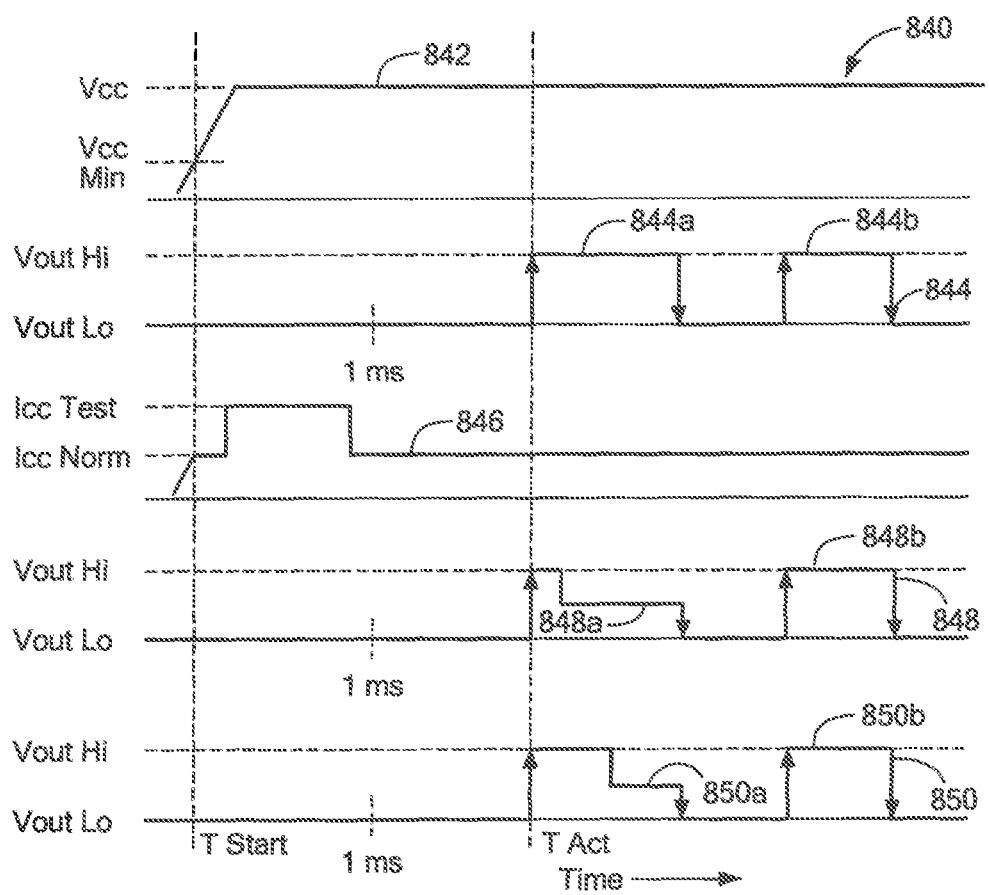
FIG. 10 is a graph showing output signals having other exemplary formats that can be used by the magnetic field sensors of FIGS. 3-3E, 4, and 4A to indicate passing conditions and failing conditions of the magnetic field sensors.

Referring now to FIG. 10, a graph 840 has a horizontal axis with a scale in units of time in arbitrary units and vertical axes with scales in units of electrical current in arbitrary units and electrical voltage in arbitrary units. A signal 842 is a voltage signal representative of a power supply voltage applied to a magnetic field sensor, e.g., the magnetic field sensor 300 of FIG. 4, beginning at time when the magnetic field sensor is first powered up. It can be seen that the voltage applied to the magnetic field sensor ramps up for a period of time, achieving a voltage, Vcc Min, at a time, T Start. The voltage, Vcc Min, is a lowest voltage received by the magnetic field sensor for which the magnetic field sensor can operate. The voltage achieves the value, Vcc, before a time of approximately 1 ms.

A signal 844 is a voltage signal representative of the sensed magnetic field signal 134*a* of FIG. 4. As will be understood, the sensed magnetic field signal 844 has transitions, here represented by dark arrows, each transition representative of an edge of a passing gear tooth, for example, a passing gear tooth of the gear 112 of FIG. 3. Activity of the sensed magnetic field signal 844 begins at a time, T Act, after the minimum power supply voltage, Vcc Min, is achieved, for example, the activity begins at about 2 ms after the minimum power supply voltage, Vcc Min, is achieved, and after a self-test is completed.

The signal 844 shows two high state regions 844*a*, 844*b*, while previous similar signals 642, 662, 682, 702, 722, 742, 762, 782, 802 of FIGS. 5, 5A, 5B, 6, 6A, 6B, 7, 7A, 8, and 9 show only one high state region. All of the figures shown above that are representative of the sensed magnetic field signal can have a continuous high and low state transitions indicative of passing edges of gear teeth. Here however, it will become apparent that self-test information is provided at times proximate only to the first high state 844*a*.

A signal 846 is a current signal representative of an amount of electrical current used by the magnetic field sensor. For some of a time period between the time, T Start, and a later time, for example a time of 1 ms, the magnetic field sensor may use a relatively high current Icc Test. The relatively high current can result from a variety of activities, for example, current used to drive the coils 346, 348 of FIG. 4 during a self-test that occurs at power up. After the self-test is completed, the magnetic field sensor achieves a lower current, Icc Norm. In some other embodiments, the extra current is not used to perform the self-test.

A signal 848 is a voltage signal representative of a passing condition of the magnetic field sensor, for example, the magnetic field sensor 300 of FIG. 4. A first pulse 848*a* of the voltage signal 848 achieves a maximum voltage, Vout Hi, for a first time period and a voltage, Vout Mid, for another period of time. Only the first pulse 848*a* is shown to convey self-test results and a second pulse 848*b* does not, however, in other embodiments, any number of the pulses shown and other pulses can similarly convey the self-test results. It will be apparent that the edges of the signal 844 can be identified in the signal 848, where dark arrows are also shown.

A signal 850 is a voltage signal representative of a failing condition of the magnetic field sensor, for example, the magnetic field sensor 300 of FIG. 4. A first pulse 850*a* of the voltage signal 850 achieves a maximum voltage, Vout Hi, for a second different time period and a voltage, Vout Mid, for another period of time. Only the first pulse 850*a* is shown to convey self-test results and a second pulse 850*b* does not, however, in other embodiments, any number of the pulses shown and other pulses can similarly convey the self-test results. It will be apparent that the edges of the signal 844 can be identified in the signal 850, where dark arrows are also shown.

It should be understood that the signals 848, 850 are the same signal but when representative of different self-test conditions.

It should be appreciated that the signal 848, 852 can convey both positions of the edges in the signal 844 and also convey passing or failing self-test information (by way of the two different time durations at the voltage, Vout Hi). Thus, referring briefly to FIG. 4A, the signal 848, 852 can provide the voltage output signal 402*a* as the combined signal 140*a*, in which case, at least three nodes or pins are required in the magnetic field sensor 400.

Figure 11:
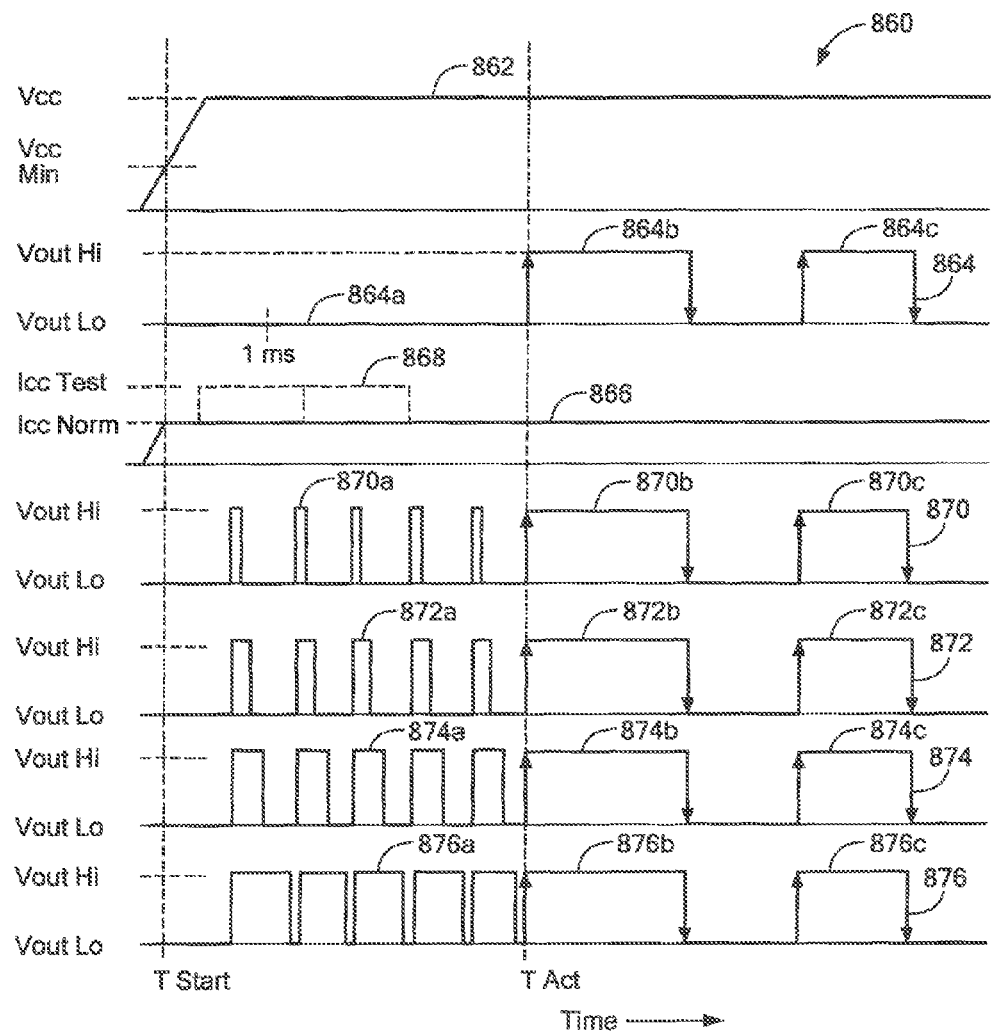
FIG. 11 is a graph showing output signals having other exemplary formats that can be used by the magnetic field sensors of FIGS. 3-3E, 4, and 4A to indicate passing conditions and failing conditions of the magnetic field sensors.

Referring now to FIG. 11, a graph 860 has a horizontal axis with a scale in units of time in arbitrary units and vertical axes with scales in units of electrical current in arbitrary units and electrical voltage in arbitrary units. A signal 862 is the same as or similar to the signal 842 of FIG. 10, and is representative of a power supply voltage applied to a magnetic field sensor, e.g., the magnetic field sensor 300 of FIG. 4, beginning at time when the magnetic field sensor is first powered up.

A signal 864 is the same as or similar to the signal 844 of FIG. 10, and is a voltage signal representative of the sensed magnetic field signal 134a of FIG. 4. Activity of the sensed magnetic field signal 864 begins at a time, T Act, after the minimum power supply voltage, Vcc Min, is achieved, for example, the activity begins at about 2 ms after the minimum power supply voltage, Vcc Min, is achieved, and after a self-test is completed.

A signal 866 is the same as or similar to the signal 846 of FIG. 10, and is a current signal representative of an amount of electrical current used by the magnetic field sensor.

A signal 870 is a voltage signal that is similar to the signal 864 and has high states 870b, 870c the same as or similar to the high states 864b, 864c after a certain time, and that includes other pulses, e.g., 870a, during an earlier time period. The other pulses, e.g., 870a have a duty cycle (i.e., they are a pulse width modulation (PWM) signal) indicative of a self-test condition of the magnetic field sensor, for example, the magnetic field sensor 300 of FIG. 4.

Referring also to signals 872, 874, 876, other duty cycles of pulses 872a, 874a, 876a can be indicative of other self-test conditions of the magnetic field sensor 300. It should be understood that the signals 870, 872, 874, 876 are the same signal but when representative of different self-test conditions.

In some embodiments, one of the duty cycles is representative of a passing condition of the magnetic fields sensor with respect to gear teeth, another duty cycle is representative of a failing condition with respect to the gear teeth, another duty cycle is representative of a passing condition with respect to valleys in the gear, and another duty cycle is representative of a failing condition with respect to the valleys of the gear. With this arrangement, it should be appreciated that the various duty cycles can convey both the self-test results, and also whether the magnetic field sensor is proximate to a gear tooth or proximate to a valley upon power up of the magnetic field sensor.

In other embodiments, the four duty cycles can be used to indicate other self-test conditions, for example, passing and failing aspects of any two characteristics of the magnetic field sensor 300 of FIG. 4.

In still other embodiments, the four duty cycles can be used to indicate four conditions of the magnetic field sensor, e.g., a passing condition, a failing condition, and two intermediate conditions. For example, in one particular embodiment, by way of the proper peak detector 304 of FIG. 4, a duty cycle of about twenty percent can be used to indicate an air gap having a passing dimension, a duty cycle of about eighty percent can be used to indicate an air gap with a failing dimension, and percentages of about forty percent and about sixty percent can be used to indicate air gaps with two intermediate dimensions.

While four duty cycles are shown, in other embodiments, there can be more than four or fewer than four duty cycles.

It should be appreciated that the signal 870, 872, 874, 876 can convey both positions of the edges in the signal 864 and also convey passing or failing self-test information (by way of the four different pulse duty cycles). Thus, referring briefly to FIG. 4A, the signals 870, 872, 874, 876 can provide the voltage output signal 402a as the combined signal 140a, in which case, at least three nodes or pins are required in the magnetic field sensor 400.

Figure 12:
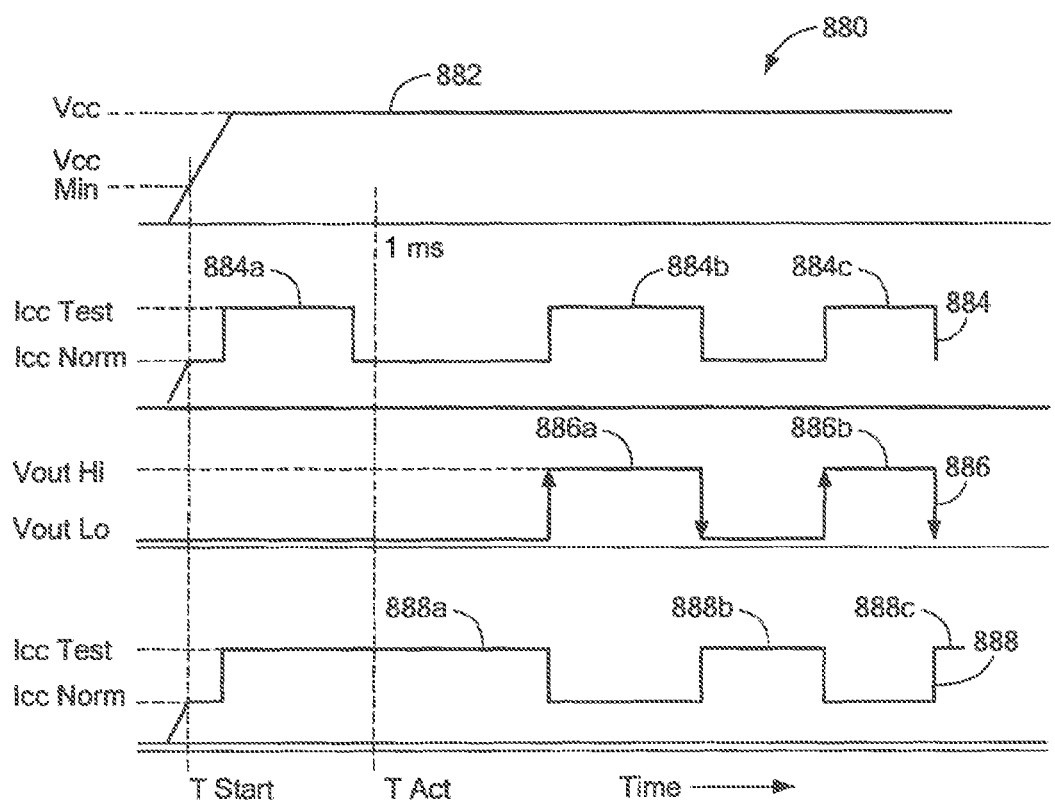
FIG. 12 is a graph showing output signals having other exemplary formats that can be used by the magnetic field sensors of FIGS. 3-3E, 4, and 4A to indicate passing conditions and failing conditions of the magnetic field sensors.

Referring now to FIG. 12, a graph 880 has a horizontal axis with a scale in units of time in arbitrary units and vertical axes with scales in units of electrical current in arbitrary units and electrical voltage in arbitrary units. A signal 882 is the same as or similar to the signals 842, 862 of FIGS. 10 and 11, and is representative of a power supply voltage applied to a magnetic field sensor, e.g., the magnetic field sensor 300 of FIG. 4, beginning at time when the magnetic field sensor is first powered up.

A signal 884 is a current signal representative of an amount of electrical current used by the magnetic field sensor, however, the signal 884 shows repetitive high current time periods 884a, 884b, 884c, each of which can achieve a current, Icc Test, and between which the magnetic field sensor achieves a lower current, Icc Norm.

In some embodiments the high current time period 884a is a time during which the magnetic field sensor performs a self-test, in which case the current can be high due to self-test functions, for example, driving of the coils 346, 348 of FIG. 4. In contrast, the high current time periods 884b, 884c can be used to communicate a passing self-test condition in ways described more fully below.

A signal 886 is a voltage signal representative of the sensed magnetic field signal 134a of FIG. 4. As will be understood, the sensed magnetic field signal 886 has transitions, here represented by dark arrows, each transition representative of an edge of a passing gear tooth, for example, a passing gear tooth of the gear 112 of FIG. 3. Activity of the sensed magnetic field signal 886 begins at a time, T Act, after the minimum power supply voltage, Vcc Min, is achieved, for example, the activity begins at about 2 ms after the minimum power supply voltage, Vcc Min, is achieved, and after a self-test is completed.

The signal 886 shows two high state regions 886a, 886b, while previous similar signals 642, 662, 682, 702, 722, 742, 762, 782, 802 of FIGS. 5, 5A, 5B, 6, 6A, 6B, 7, 7A, 8, and 9 show only one high state region. All of the figures shown above that are representative of the sensed magnetic field signal can have a continuous high and low state transitions indicative of passing edges of gear teeth.

A signal 888 is a current signal representative of an amount of electrical current used by the magnetic field sensor. In some embodiments a high current time period 888a is a time during which the magnetic field sensor performs a self-test, in which case the current can be high due to self-test functions, for example, driving of the coils 346, 348 of FIG. 4. In contrast, the high current time periods 888b, 888c can be used to communicate a failing self-test condition. Comparing the high time periods 884b, 884c with the high time periods 888b, 888c, a phase difference is evident with respect to high periods 886a, 886b of the signal 886. Thus, the phasing of the signals 884, 888 can be used to communicate the passing self-test condition and the failing self-test conditions, respectively.

It should be understood that the signals 884, 888 are the same signal but when representative of different self-test conditions.

It should be appreciated that the signal 884, 888 cannot readily convey positions of the edges in the signal 886, however, the signal 884, 886 can convey passing or failing self-test information (by way of the above-described relative phases). Thus, referring briefly to FIG. 4A, the signal 884, 886 can provide the current portion of the signal 406 as the self-test signal 142a 140a and the signal representative of the sensed magnetic field 886 can be provided as the output signal 402a, in which case, at least three nodes or pins are required in the magnetic field sensor 400.

Figure 13:
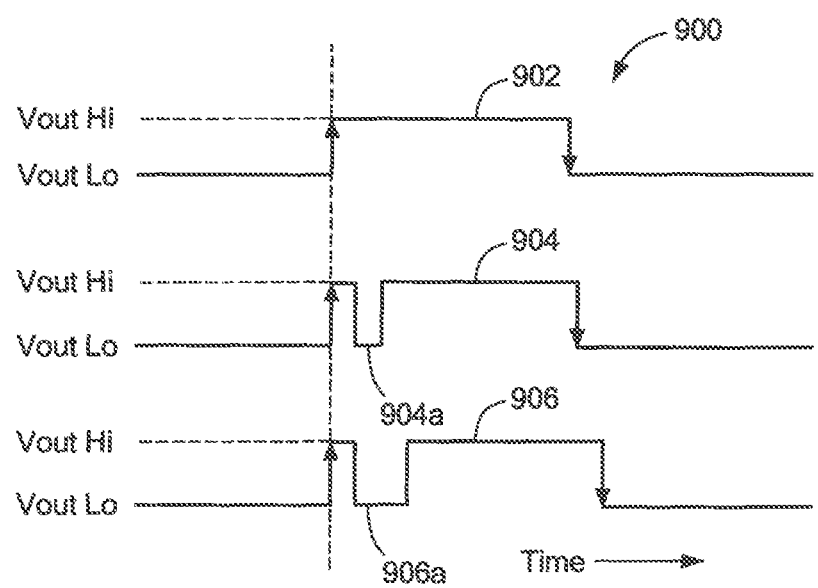
FIG. 13 is a graph showing output signals having other exemplary formats that can be used by the magnetic field sensors of FIGS. 3-3E, 4, and 4A to indicate passing conditions and failing conditions of the magnetic field sensors.

Referring now to FIG. 13, a graph 900 has a horizontal axis with a scale in units of time in arbitrary units and vertical axes with scales in units of electrical voltage in arbitrary units. A signal 902 is the same as or similar to the signals 622, 642, 662, 682, 702, 722, 742, 762, 782, 802 of FIGS. 5, 5A, 5B, 6, 6A, 6B, 7, 7A, 8, and 8A, and is a voltage signal representative of the sensed magnetic field signal 134a of FIG. 4. As will be understood, the sensed magnetic field signal 902 has transitions, here represented by dark arrows, each transition representative of an edge of a passing gear tooth, for example, a passing gear tooth of the gear 112 of FIG. 3. Only one pulse is shown, however, there can be a plurality of pulses corresponding to a plurality of passing gear teeth.

A signal 904 is a voltage signal representative of a passing condition of the magnetic field sensor, for example, the magnetic field sensor 300 of FIG. 4. The voltage signal 904 achieves a maximum voltage, Vout Hi, for a first time period, a voltage, Vout Lo, for a second time period, and a voltage, Vout Hi, for another period of time. It will be apparent that the edges of the signal 902 can be identified in the signal 904, where dark arrows are also shown.

A signal 906 is a voltage signal representative of a failing condition of the magnetic field sensor, for example, the magnetic field sensor 300 of FIG. 4. The voltage signal 906 achieves the maximum voltage, Vout Hi, for the first time period, a voltage of Vout Lo for a third different time period, and the voltage, Vout Hi, for another period of time. In some embodiments, the first and third different time periods can be related by a factor of two in value. It will be apparent that the edges of the signal 822 can be identified in the signal 906, where dark arrows are also shown.

It should be understood that the signals 904, 906 are the same signal but when representative of different self-test conditions.

It should be appreciated that the signal 904, 906 can convey both positions of the edges in the signal 902 and also convey passing or failing self-test information (by way of the two different time durations at the voltage Vout Lo). Thus, referring briefly to FIG. 4A, the signal 904, 906 can provide the voltage output signal 402a as the combined signal 140a, in which case, at least three nodes or pins are required in the magnetic field sensor 400.

Figure 14:
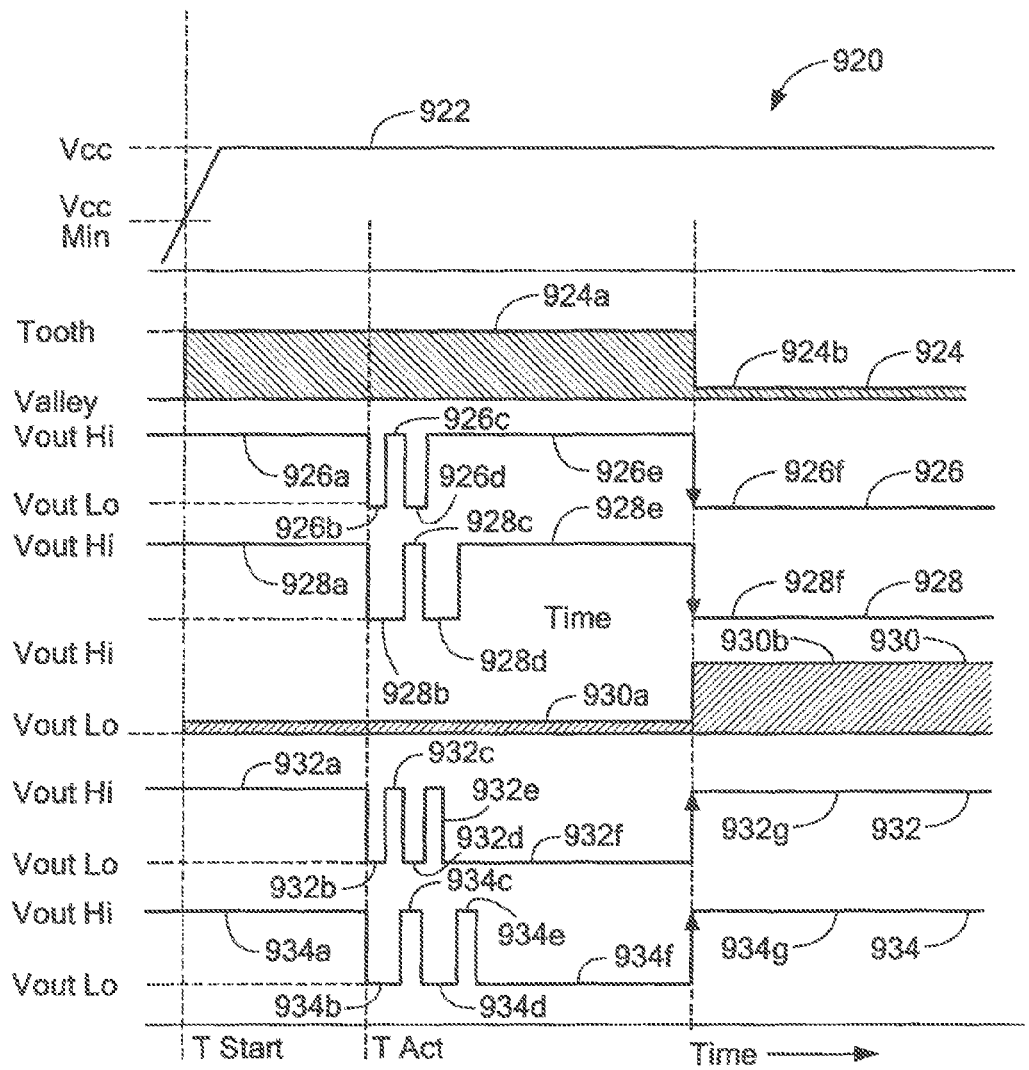
FIG. 14 is a graph showing output signals having other exemplary formats that can be used by the magnetic field sensors of FIGS. 3-3E, 4, and 4A to indicate passing conditions and failing conditions of the magnetic field sensors.

Referring now to FIG. 14, a graph 920 has a horizontal axis with a scale in units of time in arbitrary units and vertical axes with scales in units of electrical voltage in arbitrary units. A signal 922 is the same as or similar to the signals 842, 862, 882 of FIGS. 10, 11, and 12 and is representative of a power supply voltage applied to a magnetic field sensor, e.g., the magnetic field sensor 300 of FIG. 4, beginning at time when the magnetic field sensor is first powered up.

A pictorial 924 is not a signal, but is instead representative of gear teeth, e.g., 924a, and valleys, e.g., 924b.

Activity of the signals described below begins at a time, T Act, after the minimum power supply voltage, Vcc Min, is achieved, for example, the activity begins at about 2 ms after the minimum power supply voltage, Vcc MM, is achieved, and after a self-test is completed.

A signal 926 is a voltage signal representative of a passing condition of the of the magnetic field sensor, for example, the magnetic field sensor 300 of FIG. 4, when the magnetic field sensor powers up when proximate to the gear tooth 924. The voltage signal 926 achieves, when proximate to the gear tooth 924a, and at or near the time, T Act, a high state pulse 926c having two low state time periods 926b, 926d, with first time durations, on either side of the high state pulse 926c, and a high state 926e for another period of time after the second low state time period 926d, which high state is representative of proximity of the gear tooth 924. It will be apparent that the edges of the passing gear tooth 924a can be identified in the signal 926, where a dark arrow is shown.

A signal 928 is a voltage signal representative of a failing condition of the of the magnetic field sensor, for example, the magnetic field sensor 300 of FIG. 4, when the magnetic field sensor powers up when proximate to the gear tooth 924. The voltage signal 928 achieves, when proximate to the gear tooth 924a, and at or near the time, T Act, a high state pulse 928c having two low state time periods 928b, 928d, with second different time durations, on either side of the high state pulse 928c, and a high state 928e after the second low state time period 928d, which is state is representative of proximity of the gear tooth 924. It will be apparent that the edges of the passing gear tooth 924a can be identified in the signal 928, where a dark arrow is shown.

A pictorial 930 is not a signal, but is instead representative of gear teeth, e.g., 930b, and valleys, e.g., 930a.

A signal 932 is a voltage signal representative of a passing condition of the of the magnetic field sensor, for example, the magnetic field sensor 300 of FIG. 4 when the magnetic field sensor powers up when proximate to the gear valley 930a. The voltage signal 932 achieves, when proximate to the gear valley 930a, and at or near the time, T Act, two high state pulses 928c, 928d, the first high state pulse 932c surrounded by two low state time periods, with first time durations, and a low state 932e for another period of time after the second low state time period 932d, which low state is representative of proximity of the gear valley 930a. It will be apparent that the edges of the passing gear valley 930a can be identified in the signal 932, where a dark arrow is shown.

A signal 934 is a voltage signal representative of a failing condition of the of the magnetic field sensor, for example, the magnetic field sensor 300 of FIG. 4 when the magnetic field sensor powers up when proximate to the gear valley 930a. The voltage signal 934 achieves, when proximate to the gear valley 930a, and at or near the time, T Act, two high state pulses 934c, 934d, the first high state pulse 934c surrounded by two low state time periods, with second different time durations, and a low state 934e after the second low state time period 934d, which state is representative of proximity of the gear valley 930a. It will be apparent that the edges of the passing gear valley 930a can be identified in the signal 934, where a dark arrow is shown.

It should be understood that the signals 926, 928, 932, 934 are the same signal but when representative of different self-test conditions.

It should be appreciated that the signal 926, 928, 932, 934 can convey both positions of the edges of the gear and also convey passing or failing self-test information (by way of the four different sets of signal characteristics). Thus, referring briefly to FIG. 4A, the signal 926, 928, 932, 934 can provide the voltage output signal 402a as the combined signal 140a, in which case, at least three nodes or pins are required in the magnetic field sensor 400.

It should also be appreciated that the signal 926, 928, 932, 934 can convey whether the magnetic field sensor is proximate to a gear tooth or proximate to a valley upon power up of the magnetic field sensor.

Another way to view the signal 926, 928, is that, when at power up of the magnetic field sensor the magnetic field sensor is proximate to a gear tooth, the passing condition is represented by a first voltage pulse with a first duty cycle and the failing condition is represented by a second voltage pulse with a second different duty cycle. However, when at power up of the magnetic field sensor the magnetic field sensor is proximate to a gear valley, the passing conditions is represented by a first plurality of voltage pulses having the first duty cycle, and the failing condition is represented by a second plurality of plurality voltage pulses having the second duty cycle.

Figure 15:
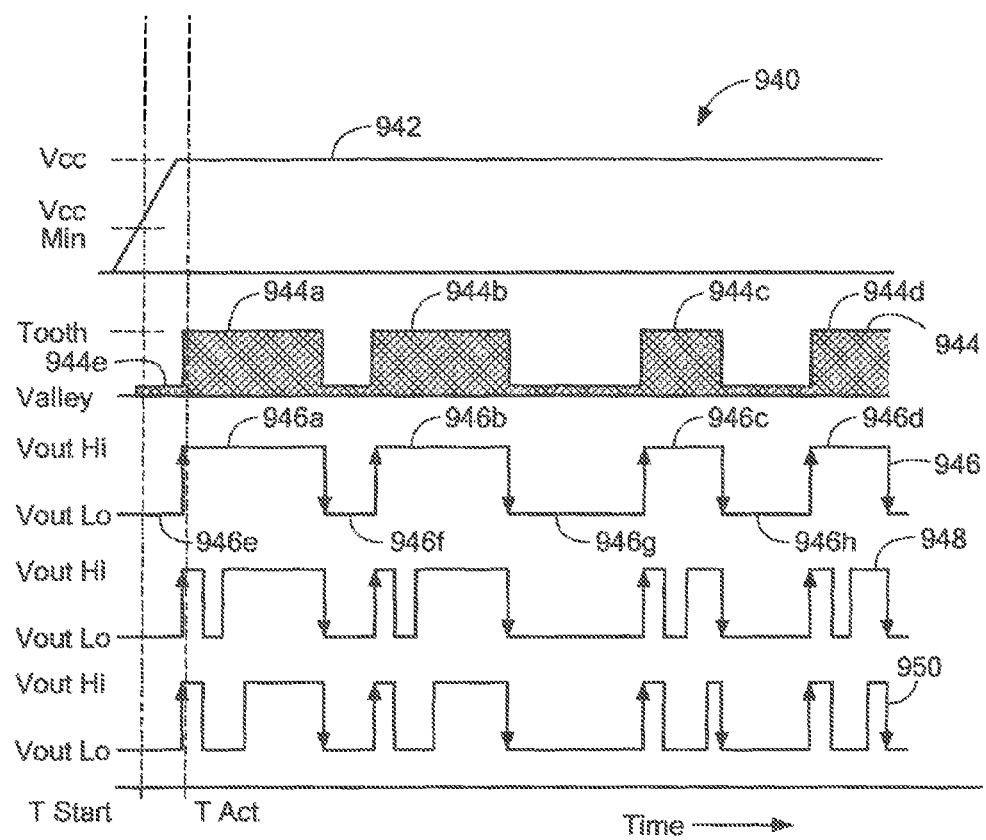
FIG. 15 is a graph showing output signals having other exemplary formats that can be used by the magnetic field sensors of FIGS. 3-3E, 4, and 4A to indicate passing conditions and failing conditions of the magnetic field sensors.

Referring now to FIG. 15, a graph 940 has a horizontal axis with a scale in units of time in arbitrary units and vertical axes with scales in units of electrical voltage in arbitrary units. A signal 942 is the same as or similar to the signals 842, 862, 882 of FIGS. 10, 11, and 12 and is representative of a power supply voltage applied to a magnetic field sensor, e.g., the magnetic field sensor 300 of FIG. 4, beginning at time when the magnetic field sensor is first powered up.

A pictorial 944 is not a signal, but is instead representative of gear teeth, e.g., 924a, and valleys, e.g., 924b.

A signal 946 is a voltage signal representative of the sensed magnetic field signal 134a of FIG. 4. As will be understood, the sensed magnetic field signal 946 has transitions, here represented by dark arrows, each transition representative of an edge of a passing gear tooth, for example, a passing gear tooth of the gear 112 of FIG. 3. Activity of the sensed magnetic field signal 844 begins at a time, T Act, after the minimum power supply voltage, Vcc Min, is achieved, for example, the activity begins at about 2 ms after the minimum power supply voltage, Vcc Min, is achieved, and after a self-test is completed.

A signal 948 is a voltage signal representative of a passing condition of the of the magnetic field sensor, for example, the magnetic field sensor 300 of FIG. 4. Characteristics of the signal 948 will be understood from the discussion above in conjunction with FIG. 13. The signal 948 has indications of the passing condition associated with more than one of the gear teeth 944a, 944b, 944c, 944d. In some embodiments, the indication occurs upon the passing of each gear tooth.

A signal 950 is a voltage signal representative of a failing condition of the of the magnetic field sensor, for example, the magnetic field sensor 300 of FIG. 4. Characteristics of the signal 948 will be understood from the discussion above in conjunction with FIG. 13. The signal 950 has indications of the failing condition associated with more than one of the gear teeth 944a, 944b, 944c, 944d. In some embodiments, the indication occurs upon the passing of each gear tooth.

It will be recognized that the signals 948, 950 are the same signal but when representative of different self-test conditions.

It should be appreciated that the signal 948, 950 can convey both positions of the edges in the signal 946 and also convey passing or failing self-test information (by way of the two different time durations at the voltage Vout Lo). Thus, referring briefly to FIG. 4A, the signal 948, 950 can provide the voltage output signal 402a as the combined signal 140a, in which case, at least three nodes or pins are required in the magnetic field sensor 400.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
   a substrate;
   one or more magnetic field sensing elements disposed on the substrate and configured to generate a proximity signal responsive to a proximity of a ferromagnetic object;
   a processing module disposed on the substrate, coupled to receive the proximity signal, and configured to convert the proximity signal to a two-state sensed-proximity signal representative of the proximity of the ferromagnetic object;
   a self-test module disposed on the substrate and coupled to at least one of the processing module or the magnetic field sensing element, wherein the self-test module is configured to determine a passing condition or a failing condition of the magnetic field sensor, wherein the self-test module is configured to automatically make the determination without external command from outside the magnetic field sensor, and wherein the self-test module is configured to generate a self-test result signal representative of the passing condition and of the failing condition; and
   a format module disposed on the substrate and configured to generate a formatted signal in response to the self-test result signal, wherein the formatted signal has first signal characteristics when representative of the passing condition and has second different signal characteristics when representative of the failing condition, and wherein the first and second signal characteristics comprise at least one of different respective time durations, different respective current values, or different respective voltage values.

2. The magnetic field sensor of claim 1, wherein the magnetic field sensor is an engine camshaft sensor, wherein the ferromagnetic object comprises one or more of a plurality of a gear teeth disposed upon a gear coupled to the engine camshaft, and wherein the one or more magnetic field sensing elements are coupled to provide the proximity signal responsive to gear teeth differently than to valleys in the gear.

3. The magnetic field sensor of claim 2, wherein the gear is a TPOS (true power on state) cam having irregularly spaced gear teeth.

4. The magnetic field sensor of claim 2, wherein the format module comprises a self-test format module configured to format the self-test result signal into a self-test signal separate from the two-state sensed-proximity signal, and wherein the self-test signal has the first signal characteristics when representative of the passing condition and has the second different signal characteristics when representative of the failing condition.

5. The magnetic field sensor of claim 2, wherein the format module comprises a combined format module configured to combine the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object.

6. The magnetic field sensor of claim 1, wherein the format module comprises a self-test format module configured to format the self-test result signal into a self-test signal separate from the two-state sensed-proximity signal, and wherein the self-test signal has the first signal characteristics when representative of the passing condition and has the second different signal characteristics when representative of the failing condition.

7. The magnetic field sensor of claim 1, wherein the format module comprises a combined format module configured to combine the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object.

8. The magnetic field sensor of claim 1, further comprising:
a power-on sensing module configured to generate a power-on signal representative of a predetermined time period following a power-on of the magnetic field sensor, wherein the first and second signal characteristics are generated only during the predetermined time period.

9. The magnetic field sensor of claim 1, further comprising:
a power-on sensing module configured to generate an signal representative of a predetermined time period following a power-on of the magnetic field sensor, wherein the first and second signal characteristics are generated only at a time proximate to a first transition of the two-state sensed-proximity signal after the predetermined time period.

10. The magnetic field sensor of claim 1, wherein the first signal characteristics comprise a first current pulse with a first high-state current value and the second signal characteristics comprise a second current pulse with a second different high-state current value.

11. The magnetic field sensor of claim 1, wherein the first signal characteristics comprise a first plurality of current pulses with a first high-state current value and the second signal characteristics comprise a second plurality of current pulses with a second different high-state current value.

12. The magnetic field sensor of claim 1, wherein the first signal characteristics comprise a first current pulse with a first high-state current value and with a first time duration and a second current pulse with the first high-state current value and with a second different time duration, and wherein the second signal characteristics comprise a third current pulse with a second different high-state current value and with the first time duration and a fourth current pulse with the second high-state current value and with the second time duration.

13. The magnetic field sensor of claim 1, wherein the first signal characteristics comprise a first plurality of current pulses with a first high-state current value and with a first time duration and also a second plurality of current pulses with the first high-state current value and with a second different time duration, and wherein the second signal characteristics comprise a third plurality of current pulses with a second different high-state current value and with the first time duration and also a fourth plurality of current pulses with the second high-state current value and with the second time duration.

14. The magnetic field sensor of claim 1, wherein the first signal characteristics comprise a first current pulse with a first duration and the second signal characteristics comprise a second current pulse with a second different duration.

15. The magnetic field sensor of claim 1, wherein the first signal characteristics comprise a first plurality of current pulses with a first duration and the second signal characteristics comprise a second plurality of current pulse with a second different duration.

16. The magnetic field sensor of claim 1, wherein the first signal characteristics comprise a first current pulse with a first time duration and a second current pulse with a second different time duration, and wherein the second signal characteristics comprise a third current pulse with a third different time duration and a fourth current pulse with a fourth different time duration.

17. The magnetic field sensor of claim 1, wherein the first signal characteristics comprise a first plurality of current pulses with a first time duration and a second plurality of current pulses with a second different time duration, and wherein the second signal characteristics comprise a third plurality of current pulses with a third different time duration and a fourth plurality of current pulses a fourth different time duration.

18. The magnetic field sensor of claim 1, wherein the format module comprises a combined format module configured to combine the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, and wherein the first signal characteristics comprise a first plurality of voltage pulses with first time durations, and wherein the second signal characteristics comprise a second plurality of voltage pulses with second different time durations.

19. The magnetic field sensor of claim 1, wherein the format module comprises a combined format module configured to combine the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein the first signal characteristics comprise a first plurality of voltage pulses with first time durations and also a second plurality of voltage pulses with second different time durations, and wherein the second signal characteristics comprise a third plurality of voltage pulses with third different time durations and also a fourth plurality of voltage pulses with fourth different time durations.

20. The magnetic field sensor of claim 1, wherein the format module comprises a combined format module configured to combine the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein the first signal characteristics comprise a first plurality of voltage pulses with first high-state voltage values, and wherein the second signal characteristics comprise a second plurality of voltage pulses with second different high-state voltage values.

21. The magnetic field sensor of claim 1, wherein the format module comprises a combined format module configured to combine the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein the first signal characteristics comprise a first plurality of voltage pulses with first high-state voltage values and first time durations and also a second plurality of voltage pulses with the first high-state voltage values and with second different time durations, and wherein the second signal characteristics comprise a third plurality of voltage pulses with second different high-state voltage values and with the first time durations and also a fourth plurality of voltage pulses with the second high-state voltage values and with the second time durations.

22. The magnetic field sensor of claim 1, wherein the format module comprises a combined format module configured to combine the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein the first signal characteristics comprise a first voltage pulse with first and second three-state voltage values with first and second time durations, respectively, and wherein the second signal characteristics comprise a second voltage pulse with the first and second three-state voltage values with third different and fourth different time durations, respectively.

23. The magnetic field sensor of claim 1, wherein the format module comprises a combined format module configured to combine the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein the first signal characteristics comprise a first plurality of voltage pulses with first and second three-state voltage values with first and second time durations, respectively, and wherein the second signal characteristics comprise a second plurality of voltage pulses with the first and second three-state voltage values with third different and fourth different time durations, respectively.

24. The magnetic field sensor of claim 1, wherein the format module comprises a combined format module configured to combine the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein the first and the second signal characteristics comprise a plurality of voltage pulses occurring during a time period between a power-up of the magnetic field sensor and a first transition of the two-state sensed-proximity signal, wherein the plurality of voltage pulses has a first duty cycle representative of the passing condition and representative of a gear tooth being proximate to the magnetic field sensor, wherein the plurality of voltage pulses has a second different duty cycle representative of the failing condition and representative of the gear tooth being proximate to the magnetic field sensor, wherein the plurality of voltage pulses has a third different duty cycle representative of the passing condition and representative of a gear tooth valley being proximate to the magnetic field sensor, and wherein the plurality of voltage pulses has a fourth different duty cycle representative of the failing condition and representative of a gear tooth valley being proximate to the magnetic field sensor.

25. The magnetic field sensor of claim 1, wherein the format module comprises a self-test format module configured to format the self-test result signal into a self-test signal separate from the two-state sensed-proximity signal, wherein the self-test signal has the first signal characteristics when representative of the passing condition and has the second different signal characteristics when representative of the failing condition, wherein the self-test signal comprises a plurality of current pulses and the two-state sensed-proximity signal comprised a plurality of voltage pulses, wherein the first signal conditions comprise positive states of the current pulses coincident with positive states of the voltage pulses, and wherein the second signal conditions comprised negative states of the current pulses coincident with the positive states of the voltage pulses.

26. The magnetic field sensor of claim 1, wherein the format module comprises a combined format module configured to combine the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein the first signal conditions comprise a first two-state voltage signal having a first state for a first period of time, a second state for a second period of time, and the first state for a third period of time, and wherein the second signal conditions comprise a second two-state voltage signal having the first state for the first period of time, the second state for a fourth period of time different than the second period of time, and the first state for a fifth period of time.

27. The magnetic field sensor of claim 1, wherein the format module comprises a combined format module configured to combine the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein, when at power up of the magnetic field sensor the magnetic field sensor is proximate to a gear tooth, the first signal characteristics comprise a first voltage pulse with a first duty cycle and the second signal characteristics comprise a second voltage pulse with a second different duty cycle, and wherein, when at power up of the magnetic field sensor the magnetic field sensor is proximate to a gear valley, the first signal characteristics comprise a first plurality of voltage pulses having the first duty cycle, and the second signal characteristics comprise a second plurality of plurality voltage pulses having the second duty cycle.

28. The magnetic field sensor of claim 1, wherein the ferromagnetic object is comprised of a soft magnetic material, and wherein the magnetic field sensor further comprises a magnet dispose proximate to the substrate.

29. The magnetic field sensor of claim 1, wherein the ferromagnetic object is comprised of a hard magnetic material having a permanent magnetism.

30. The magnetic field sensor of claim 1, wherein the format module comprises a combined format module configured to combine the self-test result signal and the two-state sensed-proximity signal to generate the formatted signal as a combined signal, wherein the combined signal has the first signal characteristics when representative of the passing condition and has the second different signal characteristics when representative of the failing condition, wherein the first and the second signal characteristics comprise a plurality of voltage pulses occurring during a time period between a power-up of the magnetic field sensor and a first transition of the two-state sensed-proximity signal, wherein the plurality of voltage pulses has a first duty cycle representative of the passing condition, wherein the plurality of voltage pulses has a second different duty cycle representative of the failing condition, wherein the plurality of voltage pulses has a third different duty cycle representative of a first intermediate condition between the passing and failing conditions, and wherein the plurality of voltage pulses has a fourth different duty cycle representative of a second different intermediate condition between the passing and failing conditions.

31. A method of identifying a fault in a magnetic field sensor, comprising:
generating a proximity signal responsive to a proximity of a ferromagnetic object with a magnetic field sensing element;
converting the proximity signal to a two-state sensed-proximity signal representative of the magnetic field;
automatically determining a passing condition or a failing condition of the magnetic field sensor, wherein the determination is made without external command from outside the magnetic field sensor,
generating a self-test result signal representative of the passing condition and of the failing condition; and
generating a formatted signal in response to the self-test result signal, wherein the formatted signal has first signal characteristics when representative of the passing condition and has second different signal characteristics when representative of the failing condition.

32. The method of claim 31, wherein the magnetic field sensor is an engine camshaft sensor, wherein the ferromagnetic object comprises one or more of a plurality of a gear teeth disposed upon a gear coupled to the engine camshaft, and wherein the one or more magnetic field sensing elements are coupled to provide the proximity signal responsive to gear teeth differently than to valleys in the gear.

33. The method of claim 32, wherein the gear is a TPOS (true power on state) cam having irregularly spaced gear teeth.

34. The method of claim 32, wherein the generating the formatted signal comprises:
formatting the self-test result signal into a self-test signal separate from the two-state sensed-proximity signal, and wherein the self-test signal has the first signal characteristics when representative of the passing condition and has the second different signal characteristics when representative of the failing condition.

35. The method of claim 32, wherein the generating the formatted signal comprises:
combining the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object.

36. The method of claim 31, wherein the generating the formatted signal comprises:
formatting the self-test result signal into a self-test signal separate from the two-state sensed-proximity signal, and wherein the self-test signal has the first signal characteristics when representative of the passing condition and has the second different signal characteristics when representative of the failing condition.

37. The method of claim 31, wherein the generating the formatted signal comprises:
combining the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object.

38. The method of claim 31, further comprising:
generating a power-on signal representative of a predetermined time period following a power-on of the method, wherein the first and second signal characteristics are generated only during the predetermined time period.

39. The method of claim 31, further comprising:
generating an signal representative of a predetermined time period following a power-on of the magnetic field sensor, wherein the first and second signal characteristics are generated only at a time proximate to a first transition of the two-state sensed-proximity signal after the predetermined time period.

40. The method of claim 31, wherein the first signal characteristics comprise a first current pulse with a first high-state current value and the second signal characteristics comprise a second current pulse with a second different high-state current value.

41. The method of claim 31, wherein the first signal characteristics comprise a first plurality of current pulses with a first high-state current value and the second signal characteristics comprise a second plurality of current pulses with a second different high-state current value.

42. The method of claim 31, wherein the first signal characteristics comprise a first current pulse with a first high-state current value and with a first time duration and a second current pulse with the first high-state current value and with a second different time duration, and wherein the second signal characteristics comprise a third current pulse with a second different high-state current value and with the first time duration and a fourth current pulse with the second high-state current value and with the second time duration.

43. The method of claim 31, wherein the first signal characteristics comprise a first plurality of current pulses with a first high-state current value and with a first time duration and also a second plurality of current pulses with the first high-state current value and with a second different time duration, and wherein the second signal characteristics comprise a third plurality of current pulses with a second different high-state current value and with the first time duration and also a fourth plurality of current pulses with the second high-state current value and with the second time duration.

44. The method of claim 31, wherein the first signal characteristics comprise a first current pulse with a first duration and the second signal characteristics comprise a second current pulse with a second different duration.

45. The method of claim 31, wherein the first signal characteristics comprise a first plurality of current pulses with a first duration and the second signal characteristics comprise a second plurality of current pulse with a second different duration.

46. The method of claim 31, wherein the first signal characteristics comprise a first current pulse with a first time duration and a second current pulse with a second different time duration, and wherein the second signal characteristics comprise a third current pulse with a third different time duration and a fourth current pulse with a fourth different time duration.

47. The method of claim 31, wherein the first signal characteristics comprise a first plurality of current pulses with a first time duration and a second plurality of current pulses with a second different time duration, and wherein the second signal characteristics comprise a third plurality of current pulses with a third different time duration and a fourth plurality of current pulses a fourth different time duration.

48. The method of claim 31, wherein the generating the formatted signal comprises:
combining the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, and wherein the first signal characteristics comprise a first plurality of voltage pulses with first time durations, and wherein the second signal characteristics comprise a second plurality of voltage pulses with second different time durations.

49. The method of claim 31, wherein the generating the formatted signal comprises:
combining the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein the first signal characteristics comprise a first plurality of voltage pulses with first time durations and also a second plurality of voltage pulses with second different time durations, and wherein the second signal characteristics comprise a third plurality of voltage pulses with third different time durations and also a fourth plurality of voltage pulses with fourth different time durations.

50. The method of claim 31, wherein the generating the formatted signal comprises:
combining the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein the first signal characteristics comprise a first plurality of voltage pulses with first high-state voltage values, and wherein the second signal characteristics comprise a second plurality of voltage pulses with second different high-state voltage values.

51. The method of claim 31, wherein the generating the formatted signal comprises:
combining the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein the first signal characteristics comprise a first plurality of voltage pulses with first high-state voltage values and first time durations and also a second plurality of voltage pulses with the first high-state voltage values and with second different time durations, and wherein the second signal characteristics comprise a third plurality of voltage pulses with second different high-state voltage values and with the first time durations and also a fourth plurality of voltage pulses with the second high-state voltage values and with the second time durations.

52. The method of claim 31, wherein the generating the formatted signal comprises:
combining the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein the first signal characteristics comprise a first voltage pulse with first and second three-state voltage values with first and second time durations, respectively, and wherein the second signal characteristics comprise a second voltage pulse with the first and second three-state voltage values with third different and fourth different time durations, respectively.

53. The method of claim 31, wherein the generating the formatted signal comprises:
combining the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein the first signal characteristics comprise a first plurality of voltage pulses with first and second three-state voltage values with first and second time durations, respectively, and wherein the second signal characteristics comprise a second plurality of voltage pulses with the first and second three-state voltage values with third different and fourth different time durations, respectively.

54. The method of claim 31, wherein the generating the formatted signal comprises:
combining the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein the first and the second signal characteristics comprise a plurality of voltage pulses occurring during a time period between a power-up of the magnetic field sensor and a first transition of the two-state sensed-proximity signal, wherein the plurality of voltage pulses has a first duty cycle representative of the passing condition and representative of a gear tooth being proximate to the magnetic field sensor, wherein the plurality of voltage pulses has a second different duty cycle representative of the failing condition and representative of the gear tooth being proximate to the magnetic field sensor, wherein the plurality of voltage pulses has a third different duty cycle representative of the passing condition and representative of a gear tooth valley being proximate to the magnetic field sensor, and wherein the plurality of voltage pulses has a fourth different duty cycle representative of the failing condition and representative of a gear tooth valley being proximate to the magnetic field sensor.

55. The method of claim 31, wherein the generating the formatted signal comprises:

formatting the self-test result signal into a self-test signal separate from the two-state sensed-proximity signal, wherein the self-test signal has the first signal characteristics when representative of the passing condition and has the second different signal characteristics when representative of the failing condition, wherein the self-test signal comprises a plurality of current pulses and the two-state sensed-proximity signal comprised a plurality of voltage pulses, wherein the first signal conditions comprise positive states of the current pulses coincident with positive states of the voltage pulses, and wherein the second signal conditions comprised negative states of the current pulses coincident with the positive states of the voltage pulses.

56. The method of claim 31, wherein the generating the formatted signal comprises:

combining the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein the first signal conditions comprise a first two-state voltage signal having a first state for a first period of time, a second state for a second period of time, and the first state for a third period of time, and wherein the second signal conditions comprise a second two-state voltage signal having the first state for the first period of time, the second state for a fourth period of time different than the second period of time, and the first state for a fifth period of time.

57. The method of claim 31, wherein the generating the formatted signal comprises:

combining the self-test result signal and the two-state sensed-proximity signal to generate the formatted signal as a combined signal, wherein the combined signal has the first signal characteristics when representative of the passing condition and has the second different signal characteristics when representative of the failing condition, and wherein the combined signal is also representative of the proximity of the ferromagnetic object, wherein, when at power up of the magnetic field sensor the magnetic field sensor is proximate to a gear tooth, the first signal characteristics comprise a first voltage pulse with a first duty cycle and the second signal characteristics comprise a second voltage pulse with a second different duty cycle, and wherein, when at power up of the magnetic field sensor the magnetic field sensor is proximate to a gear valley, the first signal characteristics comprise a first plurality of voltage pulses having the first duty cycle, and the second signal characteristics comprise a second plurality of plurality voltage pulses having the second duty cycle.

58. The method of claim 31, wherein the generating the formatted signal comprises:

combining the self-test result signal and the two-state sensed-proximity signal to generate the formatted signal as a combined signal, wherein the combined signal has the first signal characteristics when representative of the passing condition and has the second different signal characteristics when representative of the failing condition, wherein the first and the second signal characteristics comprise a plurality of voltage pulses occurring during a time period between a power-up of the magnetic field sensor and a first transition of the two-state sensed-proximity signal, wherein the plurality of voltage pulses has a first duty cycle representative of the passing condition, wherein the plurality of voltage pulses has a second different duty cycle representative of the failing condition, wherein the plurality of voltage pulses has a third different duty cycle representative of a first intermediate condition between the passing and failing conditions, and wherein the plurality of voltage pulses has a fourth different duty cycle representative of a second different intermediate condition between the passing and failing conditions.

* * * * *

UNITED STATES PATENT AND TRADEMARK OFFICE
CERTIFICATE OF CORRECTION

PATENT NO.        : 8,754,640 B2                                    Page 1 of 3
APPLICATION NO.   : 13/526106
DATED             : June 17, 2014
INVENTOR(S)       : Ravi Vig et al.

It is certified that error appears in the above-identified patent and that said Letters Patent is hereby corrected as shown below:

In the Specification

Column 1, line 20 delete "con" and replace with --can--.

Column 2, line 4 delete ": and" and replace with --: an--.

Column 4, line 67 delete "4A." and replace with --4A;--.

Column 7, line 28 delete ", there is con" and replace with --, there can--.

Column 10, line 30 delete "valley thing proximate" and replace with --valley being proximate--.

Column 12, lines 34-35 delete ", is indicative speed ..." and replace with --, is indicative of speed ...--.

Column 12, line 40 delete "valley)" and replace with --valley).--.

Column 14, lines 15-16 delete "indicative speed ..." and replace with --, is indicative of speed ...--.

Column 14, line 44 delete "signals" and replace with --signal--.

Column 15, line 51 delete "circuits" and replace with --circuit--.

Column 17, line 57 delete "can configured" and replace with --can be configured--.

Column 18, line 32 delete "fields" and replace with --field--.

Column 20, line 24 delete "in magnetic" and replace with --in a magnetic--.

Column 22, line 59 delete "by a fixed" and replace with --by fixed--.

Column 24, line 34 delete ", were" and replace with --, where--.

Column 24, line 41 delete ", were" and replace with --, where--.

Column 26, line 29 delete "respective a" and replace with --representative of a--.

Column 26, line 40 delete "signal" and replace with --signals--.

Column 27, line 11 delete "signal" and replace with --signals--.

Column 27, line 14 delete "signal" and replace with --signals--.

Column 27, line 55 delete "signal" and replace with --signals--.

Column 27, line 59 delete "signal" and replace with --signals--.

Signed and Sealed this
Fifth Day of April, 2016

Michelle K. Lee
*Director of the United States Patent and Trademark Office*

CERTIFICATE OF CORRECTION (continued)
U.S. Pat. No. 8,754,640 B2

In the Specification

Column 27, line 60 delete "signal" and replace with --signals--.
Column 27, line 61 delete "signal" and replace with --signals--.
Column 28, line 30 delete "signal" and replace with --signals--.
Column 29, line 7 delete "signal" and replace with --signals--.
Column 29, line 11 delete "signal" and replace with --signals--.
Column 29, line 13 delete "signal" and replace with --signals--.
Column 29, line 49 delete "signal" and replace with --signals--.
Column 29, line 53 delete "signal" and replace with --signals--.
Column 29, line 63 delete "at time" and replace with --at a time--.
Column 30, line 19 delete "have a continuous" and replace with --have continuous--.
Column 30, line 40 delete "not, however, ..." and replace with --not. However, ...--.
Column 30, line 60 delete "signal" and replace with --signals--.
Column 30, line 64 delete "signal" and replace with --signals--.
Column 31, line 63 delete "signal" and replace with --signals--.
Column 32, line 42 delete "have a continuous" and replace with --have continuous--.
Column 32, line 56 delete "conditions" and replace with --condition--.
Column 32, line 61 delete "signal" and replace with --signals--.
Column 32, line 63 delete "signal" and replace with --signals--.
Column 32, line 65 delete "signal" and replace with --signals--.
Column 32, line 67 delete "signal" and replace with --signals--.
Column 33, line 38 delete "signal" and replace with --signals--.
Column 33, line 42 delete "signal" and replace with --signals--.
Column 33, line 62 delete "of the of the" and replace with --of the--.
Column 34, line 16 delete ", which is state" and replace with --, which state--.
Column 34, line 23 delete "of the of the" and replace with --of the--.
Column 34, line 36 delete "of the of the" and replace with --of the--.
Column 34, line 51 delete "signal" and replace with --signals--.
Column 34, line 55 delete "signal" and replace with --signals--.
Column 34, line 59 delete "signal" and replace with --signals--.
Column 34, line 63 delete "signal" and replace with --signals--.
Column 35, line 6 delete "plurality of plurality voltage" and replace with --plurality of voltage--.
Column 35 line 39 delete "of the of the" and replace with --of the--.
Column 35, line 49 delete "signal" and replace with --signals--.

CERTIFICATE OF CORRECTION (continued)
U.S. Pat. No. 8,754,640 B2

In the Specification

Column 35, line 53 delete "signal" and replace with --signals--.

Column 35, line 64 delete "that that" and replace with --that the--.

In the Claims

Column 37, line 66 delete "pulse" and replace with --pulses--.

Column 38, line 14 delete "pulses a" and replace with --pulses with a--.

Column 40, line 12 delete "comprised" and replace with --comprises--.

Column 40, line 15 delete "comprised" and replace with --comprise--.

Column 40, lines 54-55 delete "plurality of plurality voltage" and replace with --plurality of voltage--.

Column 40, line 59 delete "dispose" and replace with --disposed--.

Column 42, line 20 delete "an signal" and replace with --a signal--.

Column 42, line 62 delete "pulse" and replace with --pulses--.

Column 43, line 10 delete "pulses a" and replace with --pulses with a--.

Column 45, line 23 delete "comprised" and replace with --comprise--.

Column 46, line 20 delete "plurality of plurality voltage" and replace with --plurality of voltage--.